United States Patent
Morishita

(10) Patent No.: US 10,200,023 B2
(45) Date of Patent: Feb. 5, 2019

(54) SWITCH CONTROL CIRCUIT

(71) Applicant: Panasonic Corporation, Osaka (JP)

(72) Inventor: Yohei Morishita, Kanagawa (JP)

(73) Assignee: PANASONIC CORPORATION, Osaka (JP)

(*) Notice: Subject to any disclaimer, the term of this patent is extended or adjusted under 35 U.S.C. 154(b) by 57 days.

(21) Appl. No.: 15/075,070

(22) Filed: Mar. 18, 2016

(65) Prior Publication Data
US 2016/0285443 A1 Sep. 29, 2016

(30) Foreign Application Priority Data

Mar. 26, 2015 (JP) ................................ 2015-064040
Nov. 26, 2015 (JP) ................................ 2015-230793

(51) Int. Cl.
| | |
|---|---|
| H03K 5/04 | (2006.01) |
| H03K 5/15 | (2006.01) |
| H03H 19/00 | (2006.01) |
| H03K 5/156 | (2006.01) |
| H03K 17/687 | (2006.01) |
| H03K 17/00 | (2006.01) |
| H03K 17/693 | (2006.01) |

(52) U.S. Cl.
CPC ......... *H03K 5/1506* (2013.01); *H03H 19/004* (2013.01); *H03K 5/1565* (2013.01); *H03K 17/007* (2013.01); *H03K 17/687* (2013.01); *H03K 17/693* (2013.01)

(58) Field of Classification Search
CPC .. H03K 5/1506; H03K 5/1565; H03K 17/007; H03K 17/687; H03K 17/693; H03H 19/004

USPC .......................................................... 327/175
See application file for complete search history.

(56) References Cited

U.S. PATENT DOCUMENTS 4,158,149 A * 6/1979 Otofuji ................ H03K 17/687
327/430
5,767,721 A * 6/1998 Crampton .......... H03K 17/6871
327/308
(Continued)

FOREIGN PATENT DOCUMENTS

| EP | 2849344 | 3/2015 |
|---|---|---|
| JP | 10-084267 | 3/1998 |

OTHER PUBLICATIONS

The Extended European Search Report dated Aug. 26, 2016 for the related European Patent Application No. 16159758.8.
(Continued)

*Primary Examiner* — Ryan Jager
(74) *Attorney, Agent, or Firm* — Greenblum & Bernstein, P.L.C.

(57) ABSTRACT

A switch control circuit includes: a clock generating circuit that generates one or more periodic signals having a predetermined cycle; a clock adjusting circuit that generates one or more control signals by adjusting a bias voltage of the one or more periodic signals and changing an ON period of the one or more periodic signals; and at least one switching circuit including one or more switches that are switched to ON if respective amplitudes of the generated one or more control signals is equal to or higher than a threshold value and that are switched to OFF if the respective amplitudes of the generated one or more control signals is less than the threshold value.

7 Claims, 55 Drawing Sheets

(56) References Cited

U.S. PATENT DOCUMENTS

| | | | | |
|---|---|---|---|---|
| 6,194,947 B1* | 2/2001 | Lee | ............ | H03H 11/22 |
| | | | | 327/113 |
| 7,250,804 B2* | 7/2007 | Brindle | ............ | H03K 17/687 |
| | | | | 327/365 |
| 7,826,816 B2* | 11/2010 | Zhuo | ............ | H03D 7/166 |
| | | | | 455/315 |
| 8,680,929 B2* | 3/2014 | De Jong | ............ | H03D 7/166 |
| | | | | 327/175 |
| 9,444,435 B1* | 9/2016 | Monaco | ............ | H03K 3/0322 |
| 2007/0090866 A1* | 4/2007 | Park | ............ | H03K 5/1565 |
| | | | | 327/175 |
| 2010/0039160 A1 | 2/2010 | Ilkov | | |
| 2011/0074610 A1* | 3/2011 | Garg | ............ | H03M 5/04 |
| | | | | 341/69 |
| 2012/0019299 A1* | 1/2012 | McLeod | ............ | H03K 5/1565 |
| | | | | 327/175 |
| 2012/0098585 A1* | 4/2012 | Kitsunezuka | ............ | H03D 7/1441 |
| | | | | 327/359 |
| 2013/0222164 A1* | 8/2013 | Shiozaki | ............ | H03H 15/00 |
| | | | | 341/122 |
| 2014/0125394 A1* | 5/2014 | Hood | ............ | H03K 5/13 |
| | | | | 327/237 |
| 2016/0013785 A1* | 1/2016 | Nakata | ............ | H03K 5/1565 |
| | | | | 327/175 |

OTHER PUBLICATIONS

Ahmad Mirzaei et al., "Analysis and Optimization of Direct-Conversion Receivers With 25% Duty-Cycle Current-Driven Passive Mixers", IEEE Transactions on Circuits and Systems, vol. 57, No. 9, pp. 2353-2366, Sep. 2010.

Song Hu et al., "Design of a Low-Power Low-Phase-Noise Multi-Mode Divider With 25%-Duty-Cycle Outputs in 0.13μm CMOS", IEEE, 2011.

Ahmad Mirzaei et al., "Analysis and Optimization of Current-Driven Passive Mixers in Narrowband Direct-Conversion Receivers", IEEE J. Solid-State Circuits, vol. 44, No. 10, pp. 2678-2688, Oct. 2009.

* cited by examiner

130

130

130

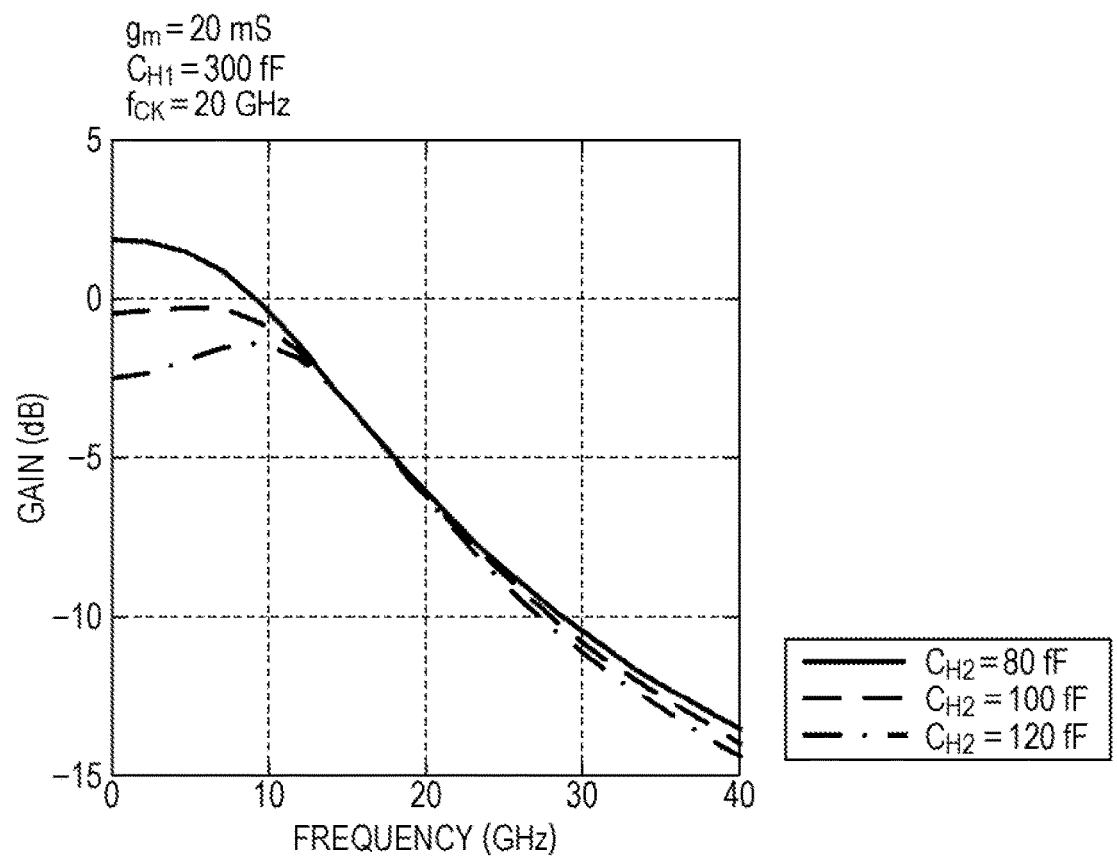

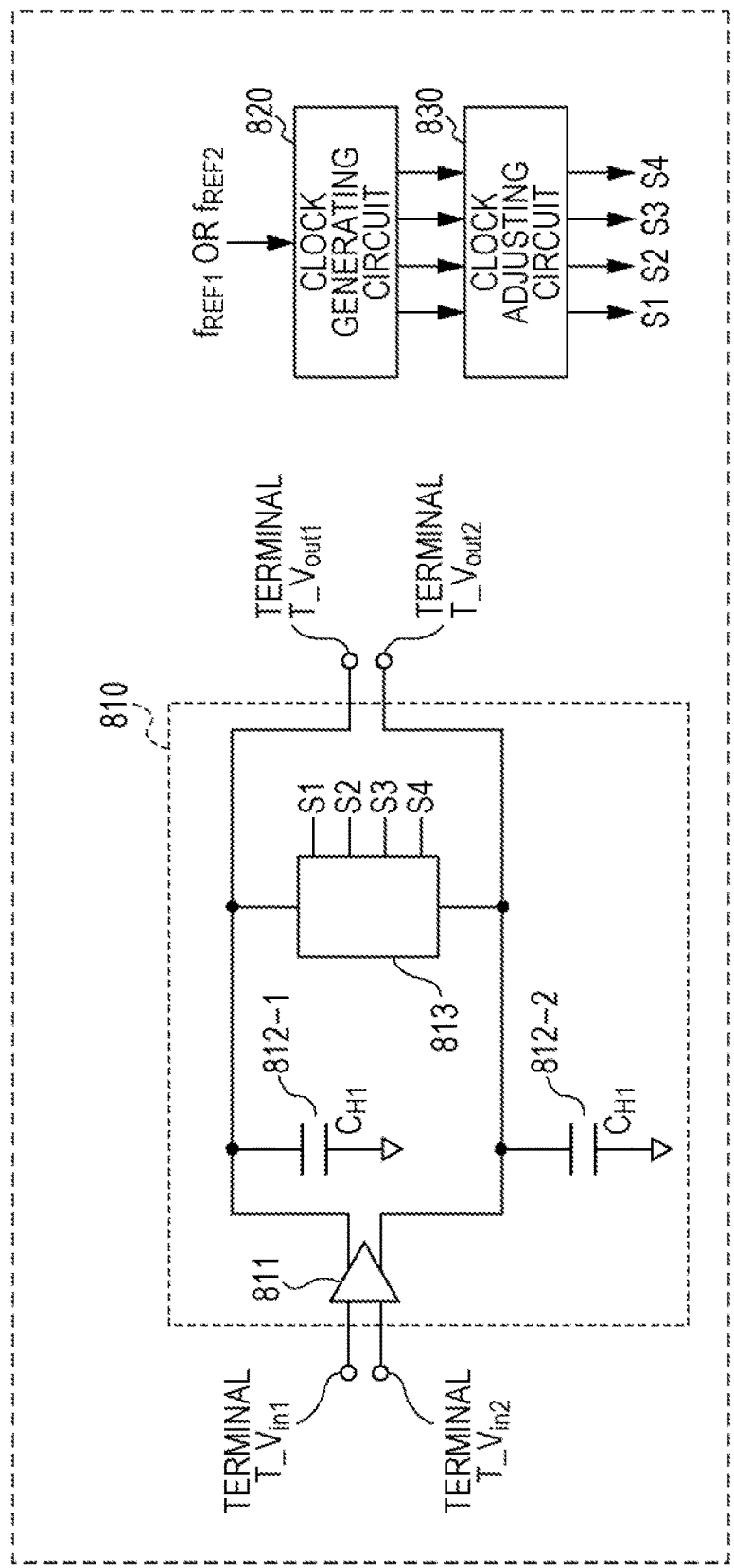

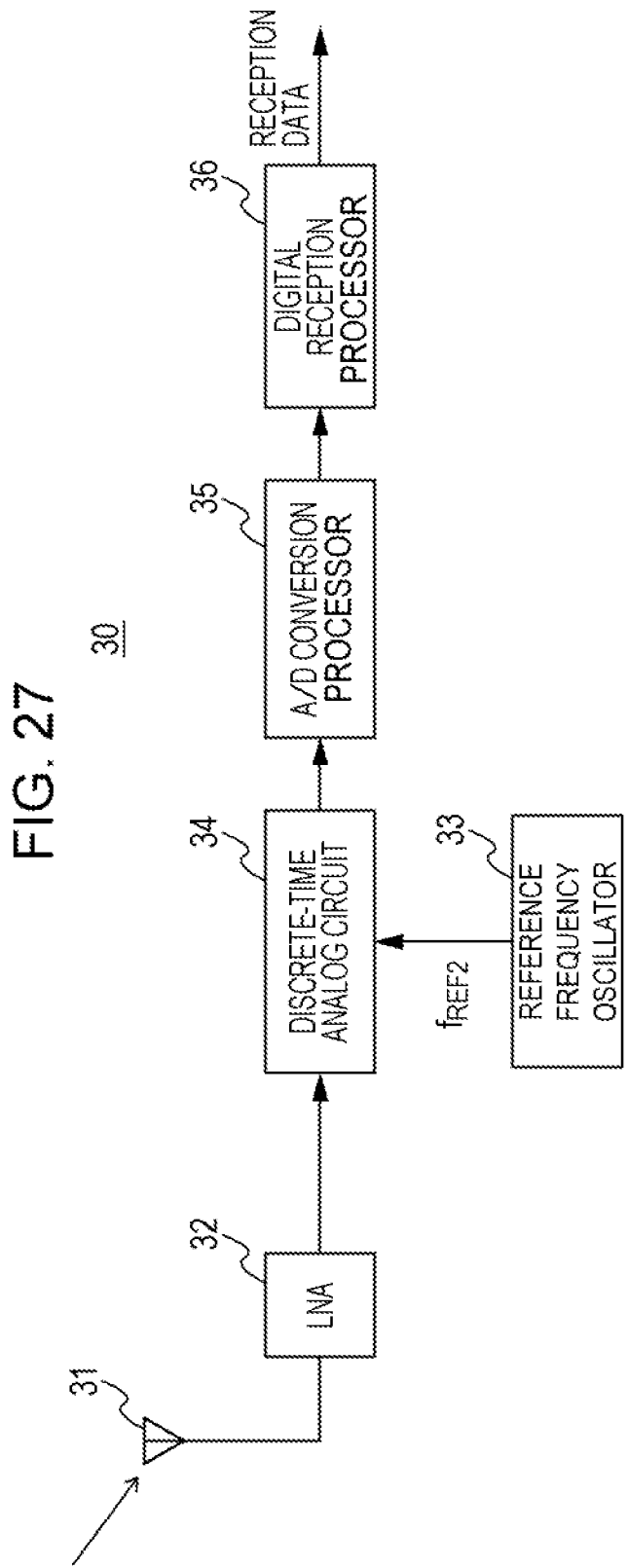

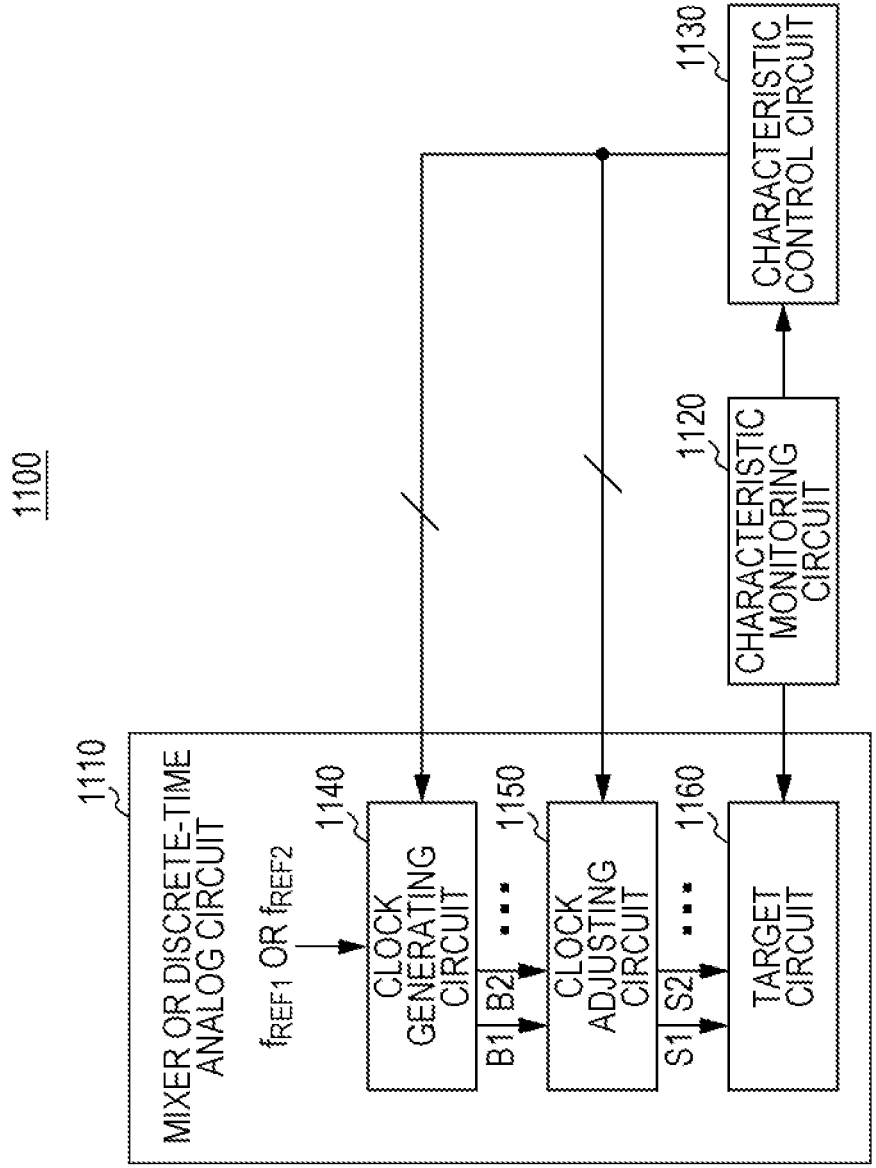

SWITCH CONTROL CIRCUIT

BACKGROUND

1. Technical Field

The present disclosure relates to a switch control circuit that adjusts a control clock for a circuit that is controlled by ON/OFF of a switch, and a circuit and a wireless device using the switch control circuit. For example, the present disclosure relates to signal processing, including frequency conversion or filtering, in which signal characteristics are changed by adjustment of a clock.

2. Description of the Related Art

A mixer comprising a switch is known as a circuit that converts a frequency in a wireless device. It is known that the characteristics of a mixer can be improved by appropriately setting a duty ratio (=pulse width Ts/clock cycle $T_{CK}$) of a local signal to be supplied to the switch.

Furthermore, a discrete-time analog circuit that comprises a switch and a capacitor is known as a highly variable circuit that is suitable for design in a fine CMOS process. The characteristics of the discrete-time analog circuit are controlled by a clock supplied to the switch.

In any of the circuits, time periods of ON and OFF of the switch need be adjusted to desired values.

For example, A. Mirzaei, H. Darabi, J. C. Leete, X. Chen, K. Juan, and A. Yazdi, "Analysis and optimization of current-driven passive mixers in narrowband direct-conversion receivers," IEEE J. Solid-State Circuits, vol. 44, no. 10, pp. 2678-2688, October 2009 (hereinafter referred to as Non-Patent Literature 1) describes a configuration of a mixer in which clocks of four phases having a duty ratio of 25% are used as local signals and a circuit that generates clocks having a duty ratio of 25%.

FIG. 1A is a diagram illustrating an outline of the mixer using clocks having a duty ratio of 25% that is disclosed in Non-Patent Literature 1, and FIG. 1B is a diagram illustrating an example of the clock generating circuit that generates clocks having a duty ratio of 25% that is disclosed in Non-Patent Literature 1.

The clock generating circuit illustrated in FIG. 1B generates clocks of four phases that has a duty ratio of 50% and whose phases are shifted by 90 degrees from a signal generated by a synthesizer and obtains clocks having a duty ratio of 25% by performing an AND operation between two of the generated clocks of four phases having a duty ratio of 50%.

It is necessary to increase the clock frequency of a clock supplied to a circuit in order that a mixer, a discrete-time analog circuit, or the like operates at a high frequency.

However, in the clock generating circuit disclosed in Non-Patent Literature 1, it is highly likely that in a case where the clock frequency is increased, the duty ratio of the clock falls below 25% because the waveform of a signal generated by a synthesizer is rounded.

For example, in the clock generating circuit illustrated in FIG. 1B, there is no output of AND (i.e., the result of AND operation is zero) unless two signals that are input to AND exceed a certain threshold value. Therefore, as the degree of rounding of the waveform of the clocks having a duty ratio of 50% which are input signals becomes higher, the duty ratio of output signals becomes smaller than 25%, and in some cases, the output signals do not reach a necessary voltage value. This results in a situation in which it is difficult for a circuit to which the clocks are supplied to operate at a high frequency.

SUMMARY

One non-limiting and exemplary embodiment provides a switch control circuit that allows even a circuit that operates at a high frequency to perform an operation equivalent to supplying an appropriate duty ratio.

In one general aspect, the techniques disclosed here feature a switch control circuit comprising: a clock generating circuit that generates one or more periodic signals having a predetermined cycle; a clock adjusting circuit that generates one or more control signals by adjusting a bias voltage of the one or more periodic signals and changing an ON period of the one or more periodic signals; and at least one switching circuit including one or more switches that are switched to ON if respective amplitudes of the generated one or more control signals is equal to or higher than a threshold value and that are switched to OFF if the respective amplitudes of the generated one or more control signals is less than the threshold value.

According to the present disclosure, even a circuit that operates at a high frequency is allowed to perform an operation equivalent to supplying an appropriate duty ratio.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 19 is a diagram illustrating a result of a circuit simulation of low-pass characteristics of the discrete-time analog circuit;

FIG. 26B is a diagram illustrating an example of an internal configuration of the multi-stage discrete-time analog circuit;

FIG. 27 is a block diagram illustrating a configuration of a receiving device according to Embodiment 4;

FIG. 30A is a diagram illustrating a configuration of a mixer or discrete-time analog circuit having a characteristic control function according to Embodiment 5;

DETAILED DESCRIPTION

Embodiments of the present disclosure are described in detail below with reference to the drawings. Note that the embodiments below are examples, and the present disclosure is not limited by these embodiments.

Embodiment 1

Configurations of Transmitting Device and Receiving Device

Figure 2A:
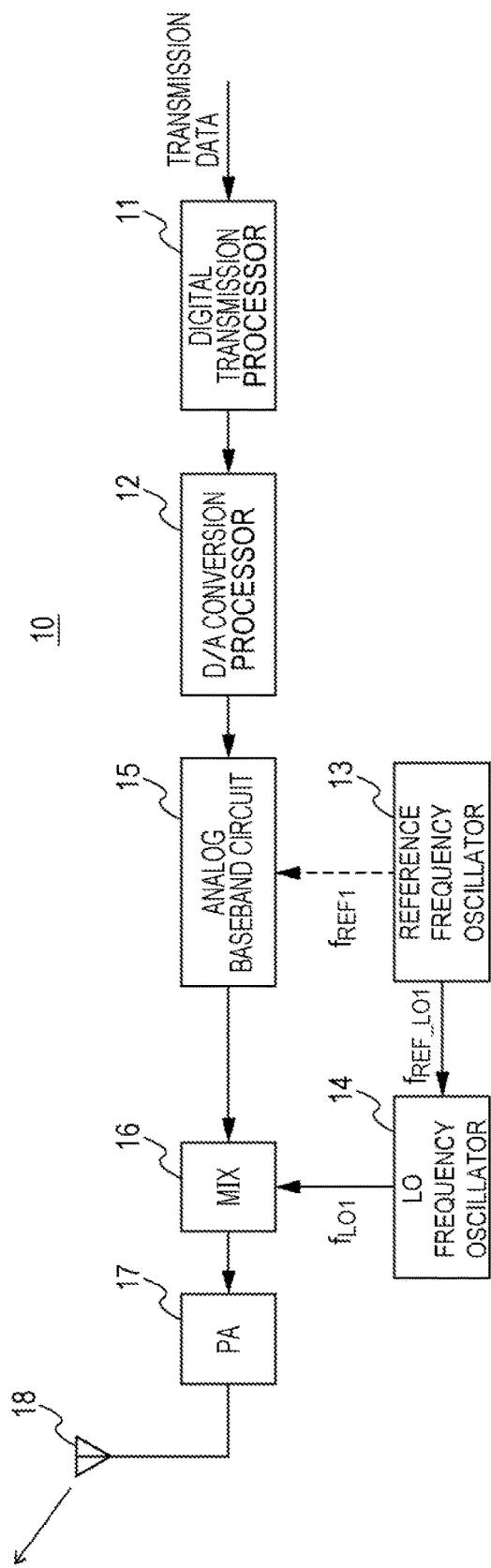
FIG. 2A is a diagram illustrating a configuration of a transmitting device according to Embodiment 1 of the present disclosure.
Figure 2B:
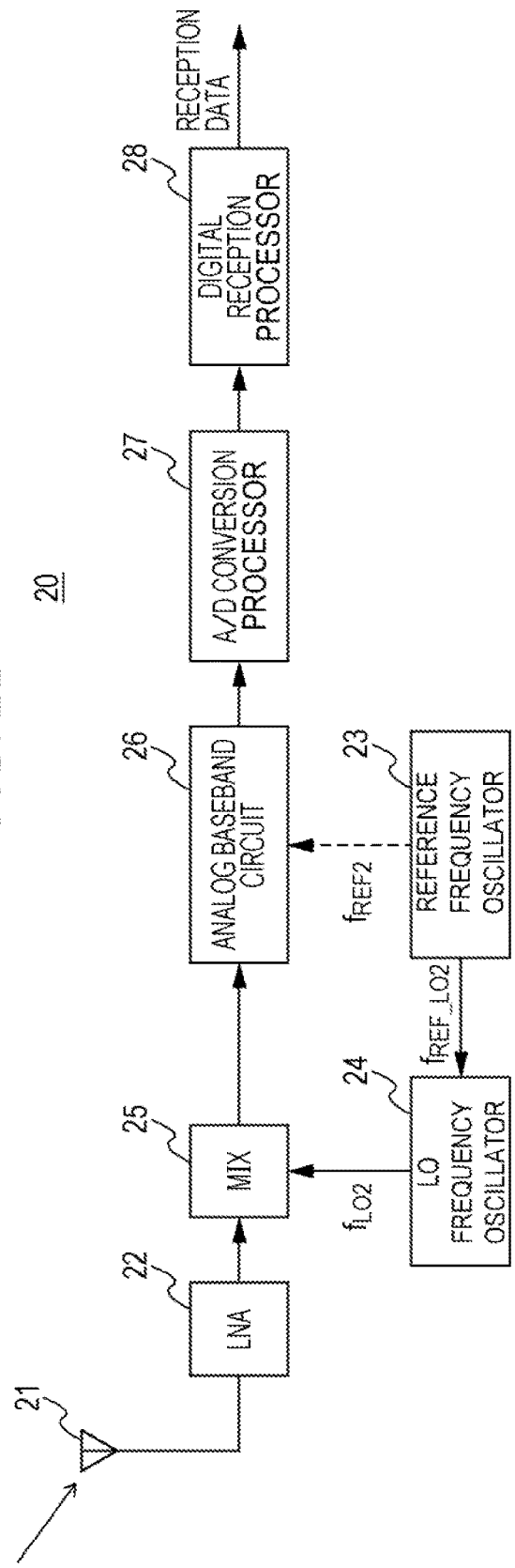
FIG. 2B is a diagram illustrating a configuration of a receiving device according to Embodiment 1 of the present disclosure.

FIG. 2A is a diagram illustrating a configuration of a transmitting device 10 according to Embodiment 1 of the present disclosure, and FIG. 2B is a diagram illustrating a configuration of a receiving device 20 according to Embodiment 1 of the present disclosure.

The transmitting device 10 illustrated in FIG. 2A includes a digital transmission processor 11, a D/A (Digital to Analog) conversion processor 12, a reference frequency oscillator 13, an LO (Local Oscillator) frequency oscillator 14, an analog baseband circuit 15, a transmission mixer 16, a power amplifier (PA) 17, and an antenna 18.

The digital transmission processor 11 performs, for example, predetermined digital transmission processing including encoding processing and modulating processing on transmission data so as to generate a baseband digital transmission signal and then supplies the baseband digital transmission signal to the D/A conversion processor 12.

The D/A conversion processor 12 converts the baseband digital transmission signal into a baseband analog transmission signal, and then supplies the baseband analog transmission signal to the analog baseband circuit 15. The baseband analog transmission signal obtained by conversion in the D/A conversion processor 12 includes an unnecessary signal (e.g., harmonic).

The reference frequency oscillator 13 generates a reference frequency signal $f_{REF\_LO1}$ used for generation of a local oscillation signal $f_{LO1}$ and then supplies the reference frequency signal $f_{REF\_LO1}$ to the LO frequency oscillator 14.

The LO frequency oscillator 14 generates the local oscillation signal $f_{LO1}$ on the basis of the reference frequency signal $f_{REF\_LO1}$ and then supplies the local oscillation signal $f_{LO1}$ to the transmission mixer 16.

The analog baseband circuit 15 removes the unnecessary signal (e.g., a harmonic component) by performing gain adjustment and filtering on the baseband analog transmission signal. The analog baseband circuit 15 supplies the baseband analog transmission signal that has been subjected to filtering to the transmission mixer 16.

The analog baseband circuit 15 can also be realized by a discrete-time circuit. In this case, the reference frequency oscillator 13 generates a reference frequency signal $f_{REF1}$ used for discrete-time analog signal processing and then supplies the reference frequency signal $f_{REF1}$ to the analog baseband circuit 15 that is realized by a discrete-time analog circuit. The reference frequency signal $f_{REF1}$ supplied to the discrete-time analog circuit and the reference frequency signal $f_{REF\_LO1}$ supplied to the LO frequency oscillator 14 may have the same frequency or may have different frequencies.

Note that a configuration and an operation of the analog baseband circuit 15 that is realized by a discrete-time analog circuit will be described later.

The transmission mixer 16 up-converts the baseband analog transmission signal that has been subjected to filtering into an RF (radio frequency) on the basis of the local oscillation signal $f_{LO1}$ and then supplies the analog transmission signal that has been up-converted into the RF to the power amplifier 17.

The power amplifier 17 amplifies the electric power of the analog transmission signal that has been up-converted into the RF and then supplies the analog transmission signal to the antenna 18.

The antenna 18 radiates the analog transmission signal whose electric power has been amplified.

The receiving device 20 illustrated in FIG. 2B includes an antenna 21, a low noise amplifier (LNA) 22, a reference frequency oscillator 23, an LO frequency oscillator 24, a reception mixer 25, an analog baseband circuit 26, an A/D (Analog to Digital) conversion processor 27, and a digital reception processor 28.

The antenna 21 receives an RF analog reception signal from a transmission station (not illustrated) and then supplies the analog reception signal to the low noise amplifier 22.

The low noise amplifier 22 amplifies the received RF analog reception signal and then supplies the analog reception signal to the reception mixer 25.

The reference frequency oscillator 23 supplies a reference frequency signal $f_{REF\_LO2}$ to the LO frequency oscillator 24.

The LO frequency oscillator 24 generates a local oscillation signal $f_{LO2}$ on the basis of the reference frequency signal $f_{REF\_LO2}$ and then supplies the local oscillation signal $f_{LO2}$ to the reception mixer 25.

The reception mixer 25 converts the RF analog reception signal into a baseband analog reception signal on the basis of the local oscillation signal $f_{LO2}$ and then supplies the baseband analog reception signal to the analog baseband circuit 26.

The analog baseband circuit 26 performs filtering on the baseband analog reception signal. The analog baseband circuit 26 supplies the baseband analog reception signal that has been subjected to filtering to the A/D conversion processor 27.

The analog baseband circuit 26 can also be realized by a discrete-time circuit. In this case, the reference frequency oscillator 23 generates a reference frequency signal $f_{REF2}$ used for discrete-time analog signal processing and then supplies the reference frequency signal $f_{REF2}$ to the analog baseband circuit 26 that is realized by a discrete-time analog circuit. The reference frequency signal $f_{REF2}$ supplies to the discrete-time analog circuit and the reference frequency signal $f_{REF\_LO2}$ supplied to the LO frequency oscillator 24 may have the same frequency or may have different frequencies.

Note that a configuration and an operation of the analog baseband circuit 26 that is realized by a discrete-time analog circuit will be described later.

The A/D conversion processor 27 converts the baseband analog reception signal that has been subjected to filtering into a baseband digital reception signal and then supplies the baseband digital reception signal to the digital reception processor 28.

The digital reception processor 28 generates and outputs reception data by performing, for example, predetermined digital reception processing including demodulating processing, decoding processing, and the like on the baseband digital signal.

In the above description, the transmitting device 10 illustrated in FIG. 2A and the receiving device 20 illustrated in FIG. 2B have a direct-conversion configuration. Note, however, that the transmitting device 10 or the receiving device 20 according to the present embodiment may additionally include one or more mixers and use an intermediate frequency (IF).

The reference frequency signals $f_{REF1}$ and $f_{REF2}$ may be the same signal, and the reference frequency oscillator 13 or 23 or the LO frequency oscillators 14 or 24 may be shared by the transmitting device 10 and the receiving device 20. Note that configurations similar to those in the present embodiment may also be employed in the other embodiments.

Configuration of Mixer

Next, configurations of the transmission mixer 16 and the reception mixer 25 according to the present embodiment are described.

Figure 3:
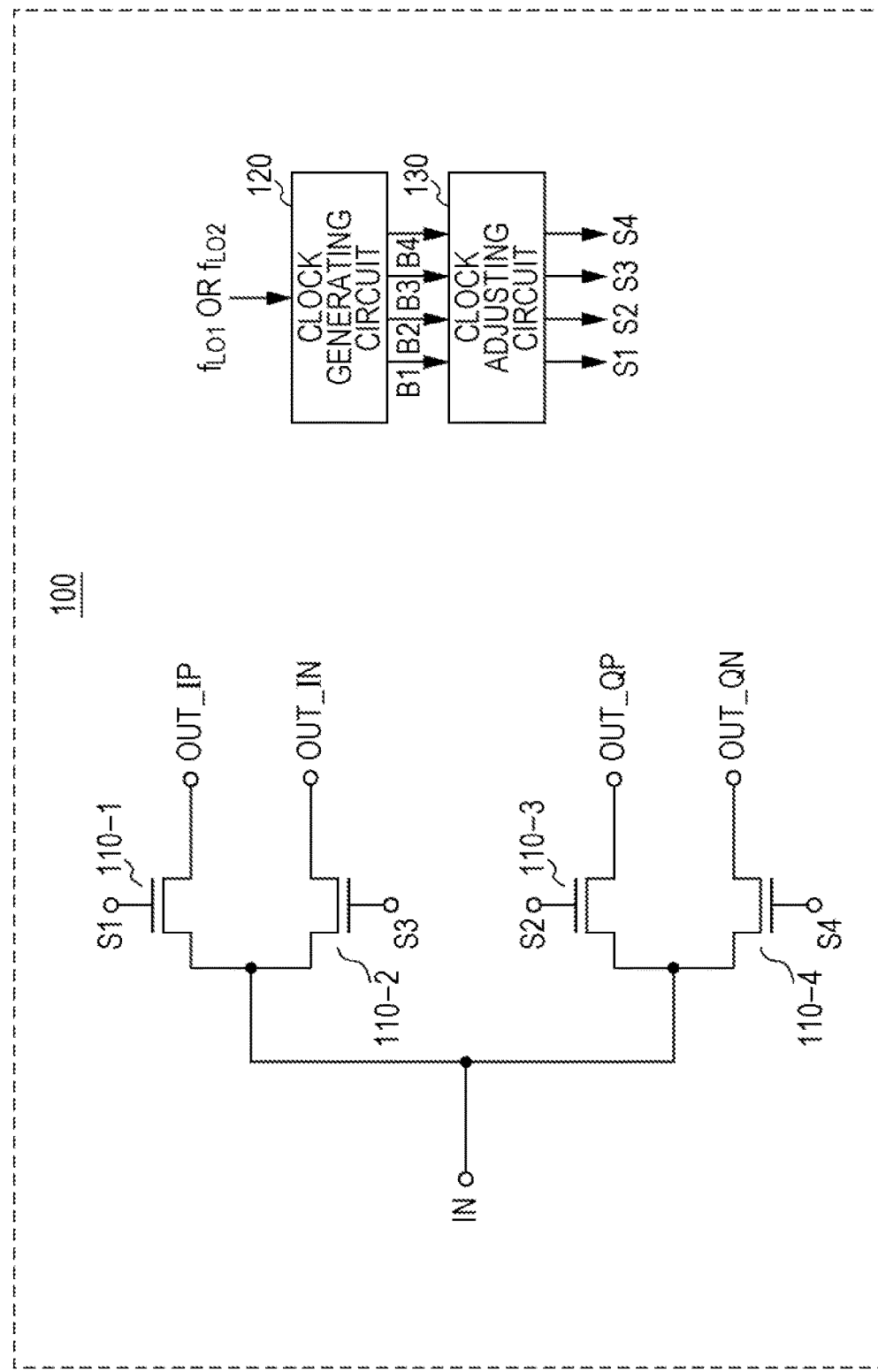
FIG. 3 is a diagram illustrating an example of a configuration of a mixer according to Embodiment 1.

FIG. 3 is a diagram illustrating an example of a configuration of a mixer 100 according to the present embodiment. The mixer 100 illustrated in FIG. 3 corresponds to the transmission mixer 16 of the transmitting device 10 illustrated in FIG. 2A and the reception mixer 25 of the receiving device 20 illustrated in FIG. 2B.

The mixer 100 is a switching circuit that includes four switches 110-1 to 110-4, a clock generating circuit 120, and a clock adjusting circuit 130 and outputs signals of four phases in response to a signal supplied from a terminal IN.

ON/OFF of the switches 110-1 to 110-4 is controlled by clocks S1 to S4 supplied from the clock adjusting circuit 130. Specifically, the switches 110-1 to 110-4 are ON during a period in which the amplitudes of the clocks S1 to S4 are equal to or higher than a threshold value and are OFF during the other period. That is, the period in which the amplitudes of the clocks S1 to S4 are equal to or higher than the threshold value can be adjusted by adjusting the duty ratios, amplitudes, and phases of the clocks S1 to S4.

Note that the threshold values in the switches 110-1 to 110-4 may be different from each other or may be the same as each other.

In the present embodiment, NMOS switches are used as the switches 110-1 to 110-4. Note, however, that other configurations such as PMOS switches or complementary switches using NMOS and PMOS may be employed.

The clock generating circuit 120 generates base clocks B1 to B4 from a local oscillation signal ($f_{LO1}$ or $f_{LO2}$) supplied from an LO frequency oscillator (see FIGS. 2A and 2B) and then supplies the base clocks B1 to B4 to the clock adjusting circuit 130. Note that clocks generated by the clock generating circuit 120 will be described later.

Note that the clock generating circuit 120 may generate the base clocks B1 to B4 from a reference signal ($f_{REF1}$, $f_{REF2}$, $f_{REF\_LO1}$, or $f_{REF\_LO2}$) supplied from a reference frequency oscillator (see FIGS. 2A and 2B).

The clock adjusting circuit 130 adjusts the duty ratios, phases, and amplitudes of the base clocks B1 to B4 and then supplies the adjusted clocks to the switches 110-1 to 110-4 as clocks S1 to S4.

Figure 4A:
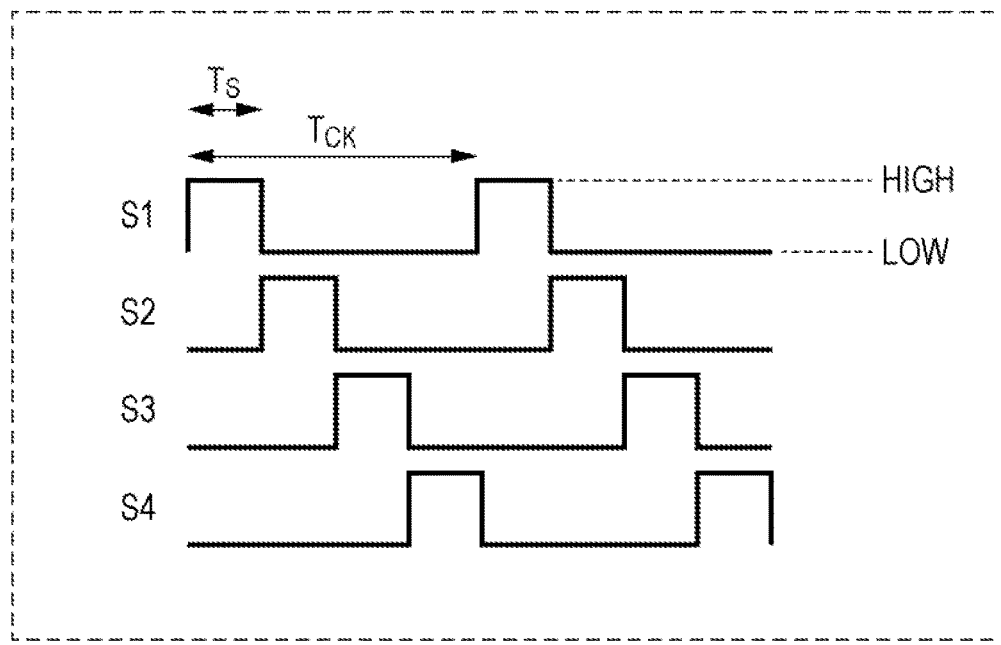
FIG. 4A is a diagram illustrating an example of clocks supplied to switches.

The clocks S1 to S4 supplied to the switches 110-1 to 110-4 are described below. FIG. 4A is a diagram illustrating an example of the clocks S1 to S4 supplied to the switches 110-1 to 110-4. The clocks S1 to S4 in FIG. 4A are rectangular signals of four phases that are shifted by 90 degrees. A period in which the clocks S1 to S4 are high is a pulse width Ts, and a cycle of the clocks S1 to S4 is $T_{CK}$. The duty ratio 25% of the clocks S1 to S4 is a desired duty ratio in the switches 110-1 to 110-4.

As illustrated in FIG. 4A, in a case where rise from low to high of the clocks S1 to S4 and fall from high to low of the clocks S1 to S4 are steep, the switches 110-1 to 110-4 are ON during the period of the pulse width Ts.

However, in a case where a clock frequency ($=1/T_{CK}$) is made high so that the mixer 100 illustrated in FIG. 3 operates at a high frequency, the waveforms of clocks generated by the clock generating circuit 120 are rounded.

For example, in a case where rectangular signals such as the clocks S1 to S4 in FIG. 4A are rounded, rise from low to high and fall from high to low become gradual, and a period (hereinafter referred to as an ON period $T_{ON}$) in which the switches 110-1 to 110-4 are ON is different from the pulse width Ts. That is, the duty ratio ($=Ts/T_{CK}$) of the clocks is different from the duty ratio in the switches (=ON period $T_{ON}$ of the switches/cycle $T_{CK}$ of the clocks).

Even in a case where the waveforms of clocks generated by the clock generating circuit 120 are rounded, the clock adjusting circuit 130 according to the present embodiment controls the duty ratio (=$T_{ON}/T_{CK}$) in the switches to a desired one by adjusting the duty ratios, amplitudes, and phases of the clocks.

Furthermore, even in a case where the clocks generated by the clock generating circuit 120 are rectangular signals, the clock adjusting circuit 130 according to the present embodiment controls the duty ratio (=$T_{ON}/T_{CK}$) in the switches to a desired one by adjusting the duty ratios, amplitudes, and phases of the clocks.

Figure 4B:
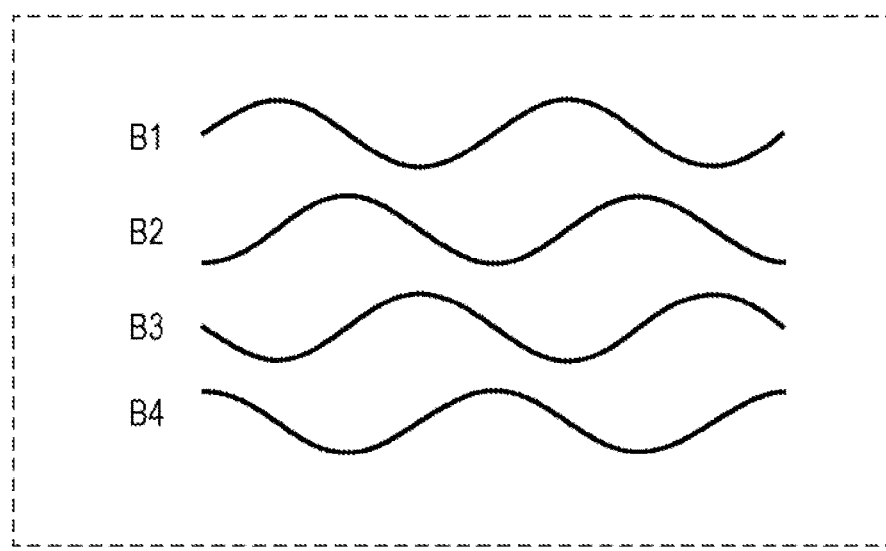
FIG. 4B is a diagram illustrating an example of base clocks generated by a clock generating circuit.

FIG. 4B is a diagram illustrating an example of the base clocks B1 to B4 generated by the clock generating circuit 120. The base clocks B1 to B4 in FIG. 4B are sine-wave signals of four phases that shifted by 90 degrees. Note that the base clocks B1 to B4 are not limited to sine-wave signals.

The clock adjusting circuit 130 adjusts the duty ratios, amplitudes, and phases of the base clocks B1 to B4 in FIG. 4B and supplies clocks equivalent to ideal clocks represented by the clocks S1 to S4 in FIG. 4A to the switches 110-1 to 110-4, and thereby controls the duty ratio in the switches 110-1 to 110-4 to a desired one. Note that the "ideal clock" refers to a rectangular signal whose clock duty ratio (Ts/$T_{CK}$) is identical to the duty ratio (=$T_{ON}/T_{CK}$) of a clock in a switch supplied from the clock adjusting circuit 130. That is, the switches 110-1 to 110-4 using clocks supplied from the clock adjusting circuit 130 operate in a manner similar to the switches 110-1 to 110-4 using ideal clocks.

Configuration of Clock Adjusting Circuit

Figure 5A:
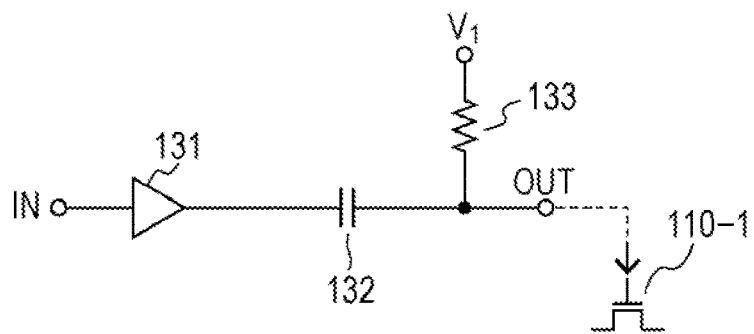
FIG. 5A is a diagram illustrating an example of a configuration of a clock adjusting circuit according to Embodiment 1.
Figure 5B:
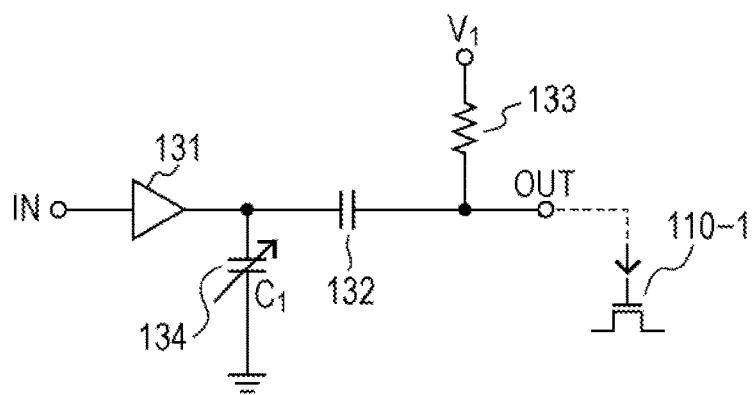
FIG. 5B is a diagram illustrating an example of a configuration of the clock adjusting circuit according to Embodiment 1.
Figure 5C:
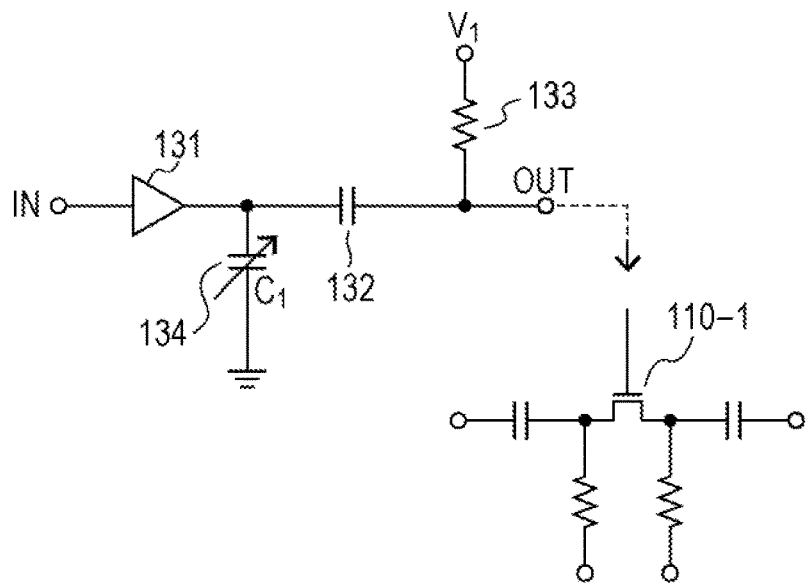
FIG. 5C is a diagram illustrating an example of a configuration of the clock adjusting circuit according to Embodiment 1.

A configuration of the clock adjusting circuit 130 is specifically described below. FIGS. 5A to 5C are diagrams each illustrating an example of a configuration of the clock adjusting circuit 130 according to the present embodiment. Note that FIGS. 5A to 5C each illustrate a configuration of the clock adjusting circuit 130 for adjusting a signal of a single phase. In a case of the clock adjusting circuit 130 for adjusting signals of four phases, four systems having the same configuration are provided, and in a case of the clock adjusting circuit 130 for adjusting signal of N phases, N systems having the same configuration are provided. The following describes a case where the clock adjusting circuit 130 in FIGS. 5A to 5C is connected to the switch 110-1.

The clock adjusting circuit 130 in FIG. 5A includes a buffer 131, a capacitor 132, and a resistor 133. The clock adjusting circuit 130 in FIG. 5A adjusts the amplitude and bias of the base clock B1 supplied from a terminal IN and supplies the clock S1 to a terminal OUT.

The buffer 131 amplifies the supplied base clock B1 or causes the supplied base clock B1 to rise in a rectangular manner. Note that the buffer 131 may be replaced with an amplifier.

The capacitor 132 removes a DC component of the base clock B1 that has been amplified or caused to rise in a rectangular manner. The resistor 133 adjusts the bias of the base clock supplied from the capacitor 132 upon application of a voltage $V_1$ from one terminal. The clock adjusting circuit 130 illustrated in FIG. 5A supplies, as the clock S1, the base clock B1 whose bias has been adjusted to the switch 110-1.

Since the switch 110-1 is ON during a period in which the amplitude of the clock S1 is equal to or higher than a threshold value as described above, the ON period $T_{ON}$ of the switch 110-1 can be controlled by adjusting the amplitude, specifically the DC component of the base clock.

A method of adjustment in the clock adjusting circuit 130 illustrated in FIG. 5A is described below. FIGS. 6A to 6D are diagrams each illustrating a method of adjustment in the clock adjusting circuit 130 illustrated in FIG. 5A. In FIGS. 6A to 6D, $T_{SIN}$ is a cycle of a sine-wave signal which is a base clock.

Figure 6A:
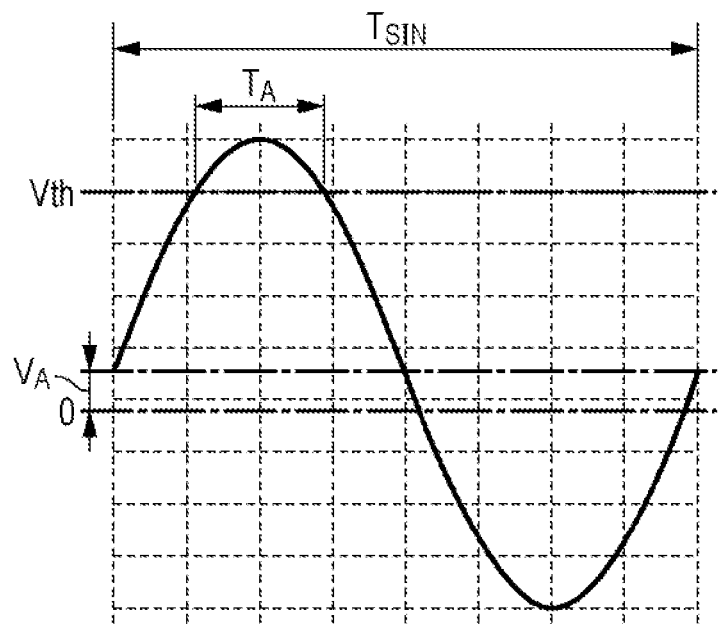
FIG. 6A is a diagram illustrating a method of adjustment in the clock adjusting circuit illustrated in FIG. 5A.
Figure 6B:
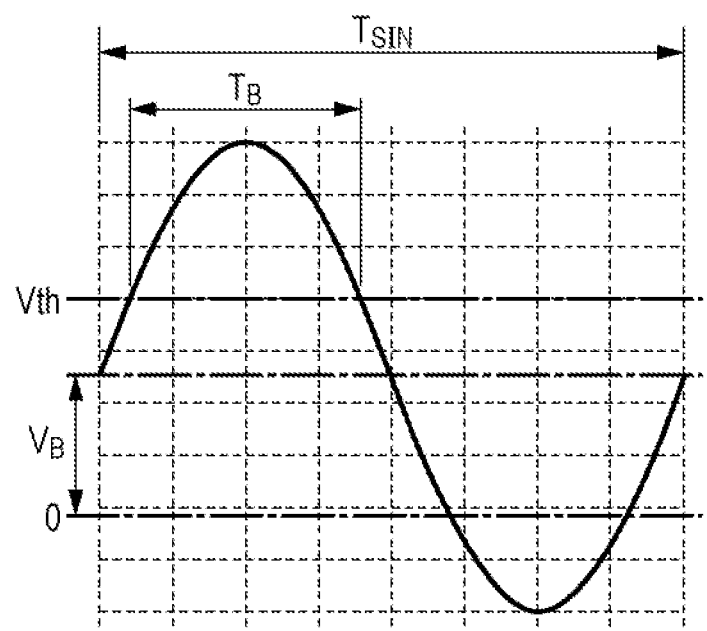
FIG. 6B is a diagram illustrating a method of adjustment in the clock adjusting circuit illustrated in FIG. 5A.
Figure 6C:
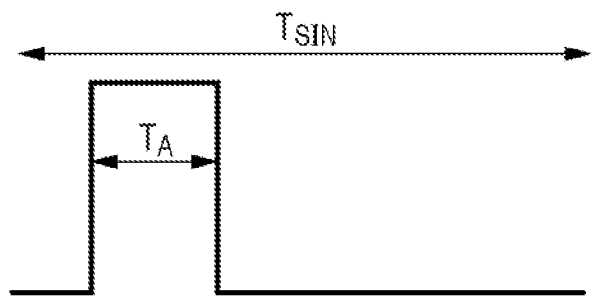
FIG. 6C is a diagram illustrating a method of adjustment in the clock adjusting circuit illustrated in FIG. 5A.
Figure 6D:
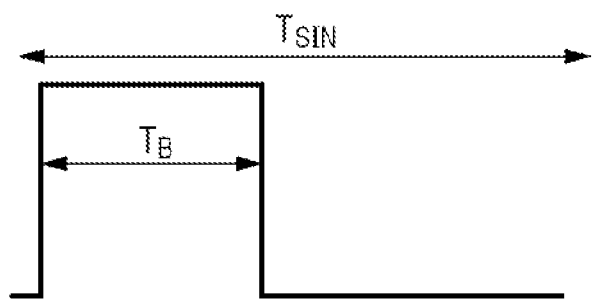
FIG. 6D is a diagram illustrating a method of adjustment in the clock adjusting circuit illustrated in FIG. 5A.

FIG. 6A illustrates the clock S1 obtained by adding bias $V_A$ to the base clock B1 under a bias condition A. FIG. 6B illustrates the clock S1 obtained by adding bias $V_B$ to the base clock B1 under a bias condition B. In FIGS. 6A and 6B, Vth is a threshold value of the switch 110-1. The switch 110-1 is ON during a period in which the amplitude of the clock S1 is equal to or higher than Vth. As illustrated in FIGS. 6A and 6B, the period in which the amplitude of the clock S1 is equal to or higher than the threshold value Vth, i.e., the ON period of the switch 110-1 is changed by adjusting the bias condition.

In FIG. 6A, the ON period $T_{ON}$ of the switch 110-1 is $T_A$ because of addition of the bias $V_A$ to the base clock B1. That is, the clock S1 is equivalent to a rectangular signal whose ON period is $T_A$ illustrated in FIG. 6C. In this case, the duty ratio in the switch 110-1 is $T_A/T_{SIN}$.

In FIG. 6B, the ON period $T_{ON}$ of the switch 110-1 is $T_B$ because of addition of the bias $V_B$ to the base clock B1. That is, the clock S1 is equivalent to a rectangular signal whose ON period is $T_B$ illustrated in FIG. 6D. In this case, the duty ratio in the switch 110-1 is $T_B/T_{SIN}$.

That is, the clock adjusting circuit 130 illustrated in FIG. 5A can control a base clock of a sine-wave signal having a cycle $T_{BIN}$ to have a desired duty ratio ($T_{ON}/T_{SIN}$) by adjusting the bias of the base clock. The configuration of FIG. 5A is effective in a case where it is desired that the circuit be controlled by a high-frequency clock.

Next, the clock adjusting circuit 130 in FIG. 5B is described. In FIG. 5B, elements that are identical to those in FIG. 5A are given reference signs identical to those in FIG. 5A, and description thereof is omitted. The clock adjusting circuit 130 in FIG. 5B includes a variable capacitor 134 in addition to the configuration of FIG. 5A.

The variable capacitor 134 has a variable capacitance value $C_1$ and rounds the waveform of the base clock B1. The degree of rounding of the waveform is controlled by adjusting the capacitance value $C_1$. Note that the capacitance value of the variable capacitor 134 may be fixed.

Figure 7A:
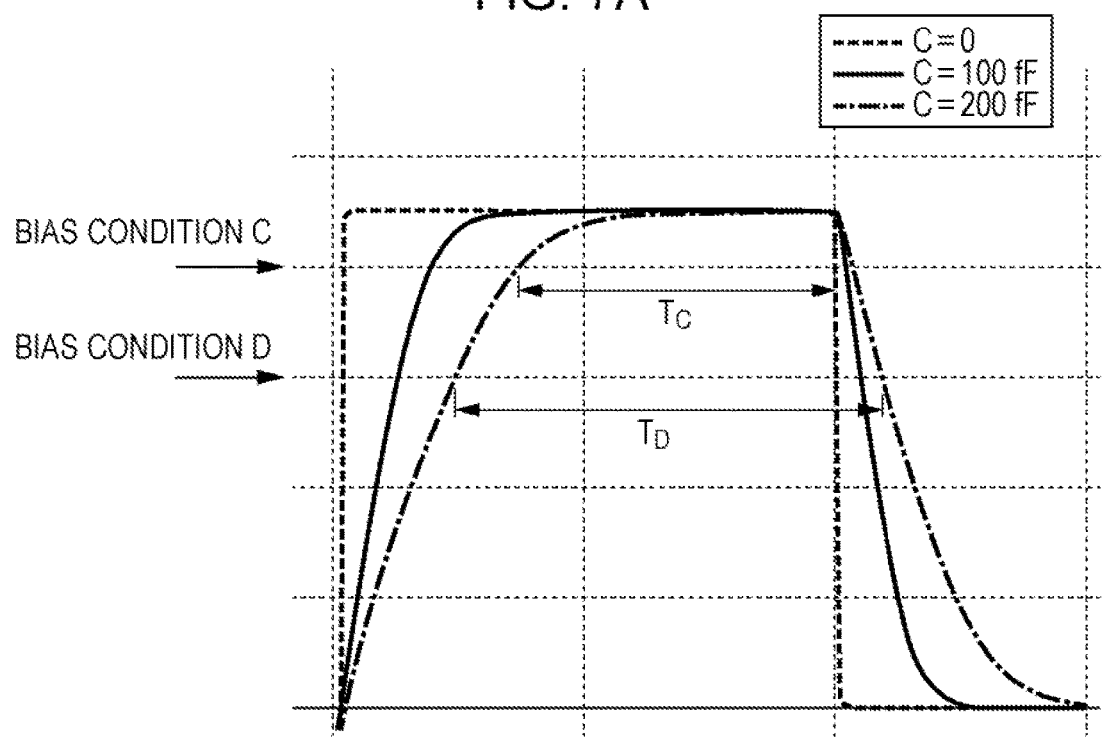
FIG. 7A is a diagram illustrating a method of adjustment in the clock adjusting circuit illustrated in FIG. 5B.
Figure 7B:
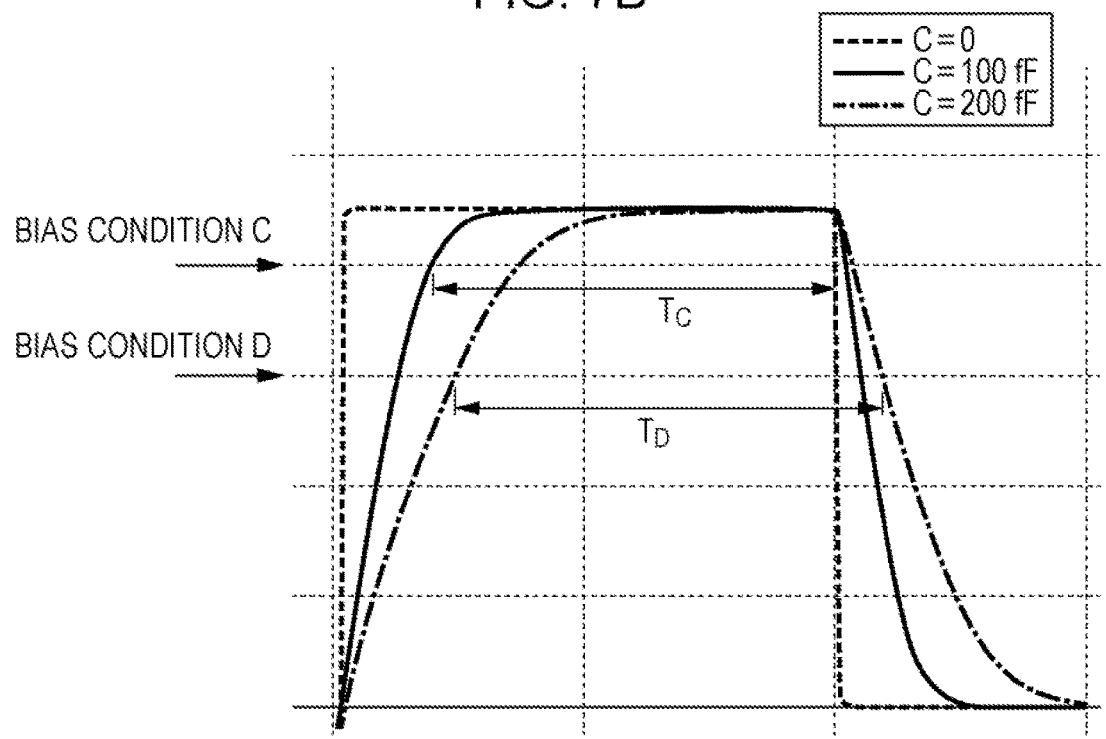
FIG. 7B is a diagram illustrating a method of adjustment in the clock adjusting circuit illustrated in FIG. 5B.

A method of adjustment in the clock adjusting circuit 130 illustrated in FIG. 5B is described below. FIGS. 7A and 7B are diagrams each illustrating a method of adjustment in the clock adjusting circuit 130 illustrated in FIG. 5B.

FIGS. 7A and 7B illustrate an example in which the capacitance value $C_1$ of the variable capacitor 134 is adjusted to 0 [fF], 100 [fF], and 200 [fF] in a case where a rectangular signal is supplied as the base clock B1 to the clock adjusting circuit 130. The arrows of bias conditions C and D indicate cases where the bias of the base clock B1 has been adjusted so that the lines indicated by the respective arrows are threshold values in the switch 110-1.

As illustrated in FIG. 7A, the waveform of the base clock B1 can be rounded by adjusting the capacitance value $C_1$ of the variable capacitor 134. The clock adjusting circuit 130 can control the duty ratio in the switch 110-1 to a desired one by rounding the waveform of the base clock B1 and adjusting the bias condition.

For example, in a case where the capacitance value $C_1$ is adjusted to 200 [fF] and the bias is adjusted to the bias condition C, the ON interval in the switch 110-1 is $T_C$. In a case where the capacitance value $C_1$ is adjusted to 200 [fF] and the bias is adjusted to the bias condition D, the ON interval in the switch 110-1 is $T_D$. That is, an interval in which the switch is ON can be controlled by controlling the capacitance and the bias, and thereby the duty ratio in the switch 110 can be adjusted to a desired one.

Depending on the combination of capacitance and bias, a phase can be controlled as illustrated in FIG. 7B while omitting adjustment of the duty ratio. Note that it is also possible to adjust both of the duty ratio and the phase.

For example, in a case where the capacitance value $C_1$ is adjusted to 100 [fF] and the bias is adjusted to the bias condition C, the ON interval in the switch 110-1 is $T_C$. In a case where the capacitance value $C_1$ is adjusted to 200 [fF] and the bias is adjusted to the bias condition D, the ON interval in the switch 110-1 is $T_D$.

The ON interval $T_C$ and the ON interval $T_D$ have substantially the same length but are different in ON timing and OFF timing. That is, the clock adjusting circuit 130 illustrated in FIG. 5B can adjust the phase by adjusting the capacitance value $C_1$ of the variable capacitor 134 and adjusting the bias condition.

That is, the duty ratio and the phase can be adjusted by adjusting the capacitance and the bias condition.

In FIGS. 7A and 7B, the base clock B1 is a rectangular signal. Note, however, that the base clock B1 is not limited to a rectangular signal, and the clock adjusting circuit 130 illustrated in FIG. 5B can adjust the duty ratio and the phase of any base clock B1.

Next, the clock adjusting circuit 130 in FIG. 5C is described. In FIG. 5C, elements that are identical to those in FIG. 5B are given reference signs identical to those in FIG. 5B, and description thereof is omitted. The configuration of FIG. 5C is different from that of FIG. 5B in terms of the configuration of the switch 110-1.

The switch 110-1 in FIG. 5C is configured to adjust switch-side bias. In a case where the switch 110-1 is an MOS switch, the duty ratio can also be adjusted by adjusting the bias of the switch 110-1. For example, the ON period in the switch 110-1 can be adjusted by adjusting the bias of at least one of or both of the drain and source of the switch 110-1 and the bias of the gate of the switch 110-1. The ON period can also be changed by changing the electric potential of the back gate of the switch 110-1 and changing the threshold value Vth of the switch 110-1.

Configuration of Switch

A configuration of a switch whose bias is adjusted is described below. FIGS. 8A to 8D are diagrams each illustrating an example of a configuration of a switch 110 according to the present embodiment.

Figure 8A:
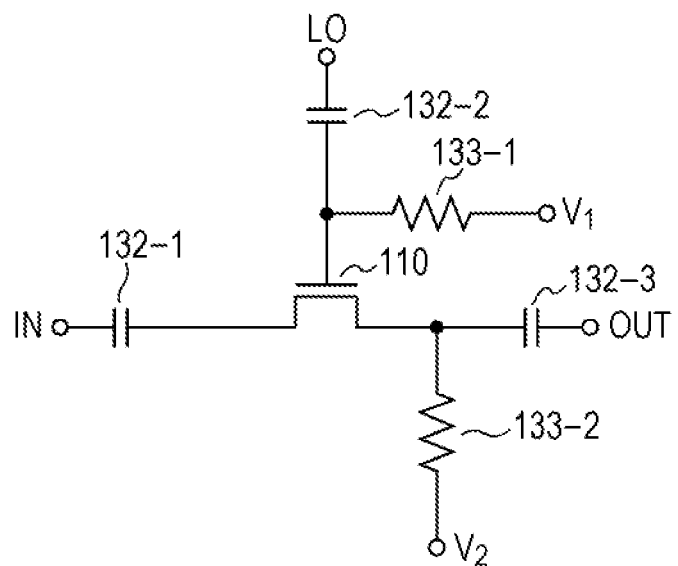
FIG. 8A is a diagram illustrating an example of a configuration of a switch according to Embodiment 1.
Figure 8B:
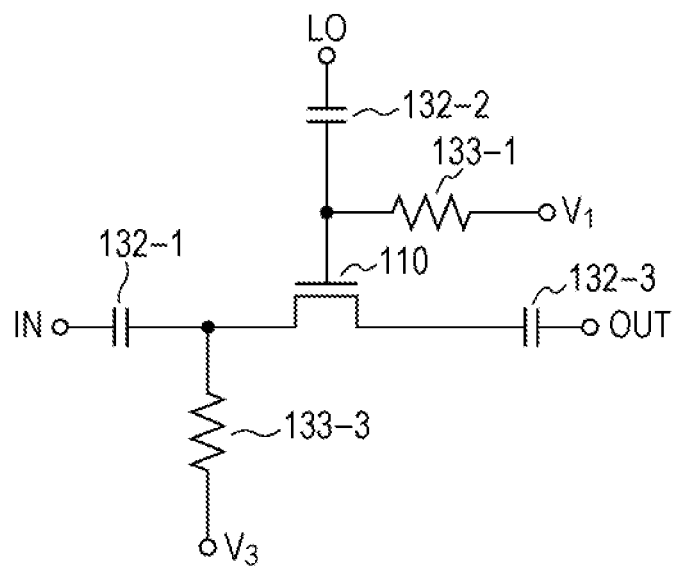
FIG. 8B is a diagram illustrating an example of a configuration of a switch according to Embodiment 1.
Figure 8C:
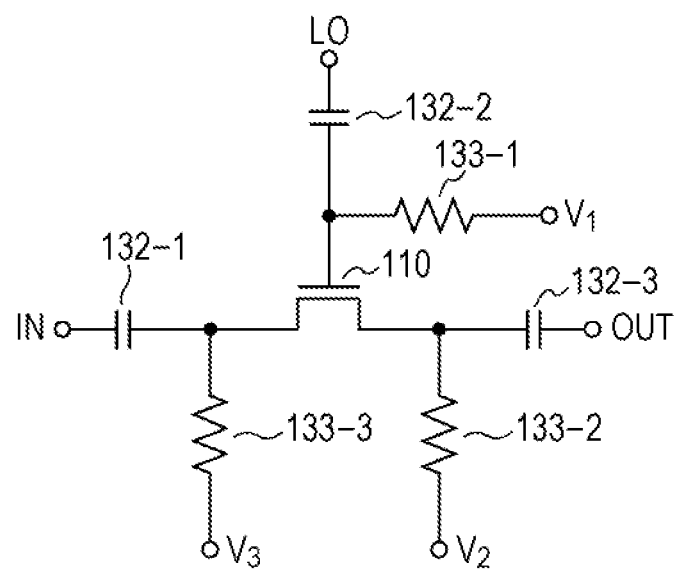
FIG. 8C is a diagram illustrating an example of a configuration of a switch according to Embodiment 1.

In FIGS. 8A to 8C, capacitors 132-1 to 132-3 are provided at a source, a gate, and a drain, respectively, and remove a DC component of a signal that passes therethrough. A resistor 133-1 adjusts the bias of the gate upon application of a voltage $V_1$ from one terminal. A resistor 133-2 adjusts the bias of the drain upon application of a voltage $V_2$ from one terminal. A resistor 133-3 adjusts the bias of the source upon application of a voltage $V_3$ from one terminal. A resistor 133-4 adjusts the bias of the back gate upon application of the voltage $V_3$ from one terminal.

Figure 8D:
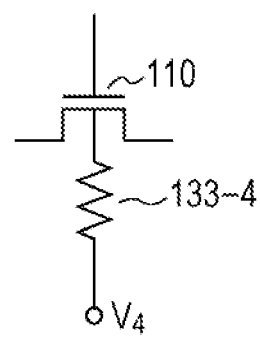
FIG. 8D is a diagram illustrating an example of a configuration of a switch according to Embodiment 1.

As illustrated in FIGS. 8A to 8D, the ON period of the switch 110 can be adjusted by adjusting any of the gate, drain, source, and back gate of the switch 110. The bias may be applied to one of the drain and source as illustrated in FIGS. 8A and 8B or may be applied to both of the drain and source as illustrated in FIG. 8C. In a case where the bias is applied to both of the drain and source, an electric current may be passed through the switch by making the value of the bias applied to the drain and the value of the bias applied to the source different from each other. The threshold value Vth of the switch may be controlled by applying an electric potential to the back gate as illustrated in FIG. 8D.

Configuration of Clock Generating Circuit

A configuration of the clock generating circuit 120 that generates sine-wave signals of four phases from a single sine-wave signal is described below. FIGS. 9A to 9E are diagrams each illustrating an example of a configuration of the clock generating circuit.

Figure 9A:
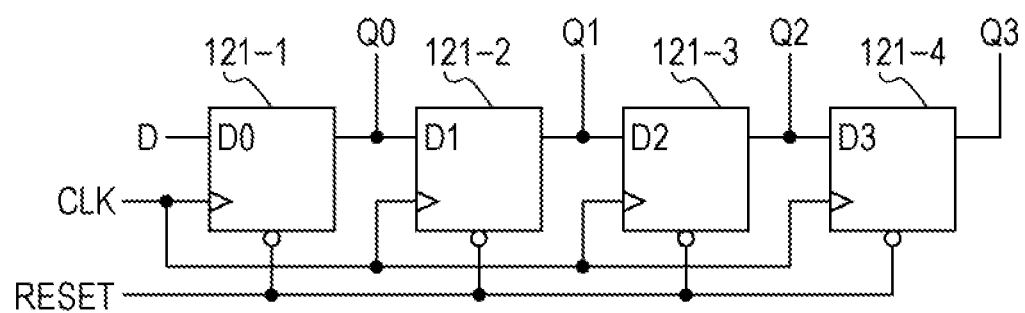
FIG. 9A is a diagram illustrating an example of a configuration of a clock generating circuit.

FIG. 9A illustrates a configuration using a shift register made up of D-type flip-flop circuits 121-1 to 121-4. In the configuration of FIG. 9A, signals of four different phases are output to output terminals Q0 to Q3.

Figure 9B:
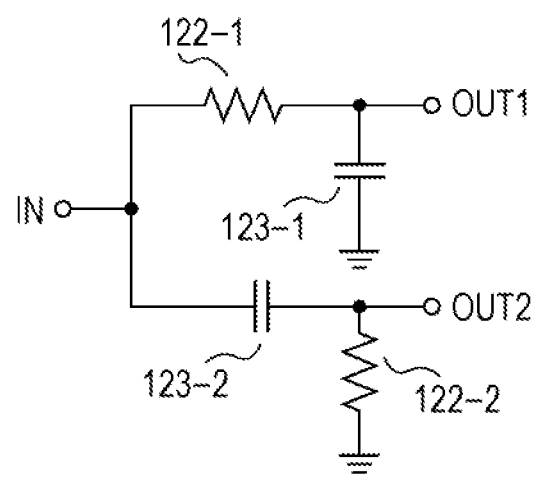
FIG. 9B is a diagram illustrating an example of a configuration of the clock generating circuit.

FIG. 9B illustrates a configuration using resistors 122-1 and 122-2 and capacitors 123-1 and 123-2. Signals whose phases are shifted at a target frequency can be generated by appropriately setting values of the resistors 122-1 and 122-2 and the capacitors 123-1 and 123-2. For example, signals whose phases are shifted by 90 degrees from each other are generated from a signal input from the terminal IN as signals output from output terminals OUT1 and OUT2. Signals of four phases that are shifted by 90 degrees can be generated by dividing each of the signals output from the output terminals OUT1 and OUT2 into signals whose phases are shifted by 180 degrees from each other by using a balun (not illustrated). Alternatively, signals of four phases that are shifted by 90 degrees can be generated by using a combination of RC circuits. For example, signals of four phases that are shifted by 90 degrees can be generated from a single input signal by using a combination of RC circuits as illustrated in FIG. 9E.

Figure 9C:
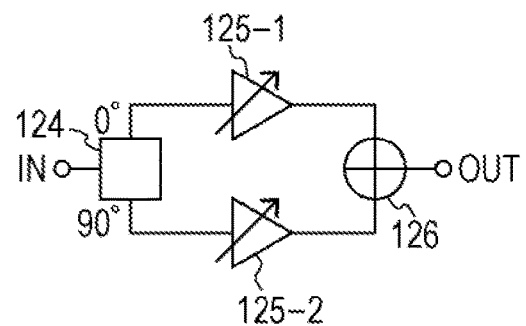
FIG. 9C is a diagram illustrating an example of a configuration of the clock generating circuit.

FIG. 9C illustrates a configuration of a phase shifter that generates a signal of any phase. The phase shifter illustrated in FIG. 9C includes a 90-degree phase difference signal generating circuit 124, variable gain amplifiers 125-1 and 125-2, and a synthesizing circuit 126. The 90-degree phase difference signal generating circuit 124 generates two signals whose phases are shifted by 90 degrees from an input signal. The variable gain amplifiers 125-1 and 125-2 adjusts the amplitudes of the respective signals output from the 90-degree phase difference signal generating circuit 124 to appropriate values. The synthesizing circuit 126 can generate a signal of any phase by synthesizing these signals.

Figure 9D:
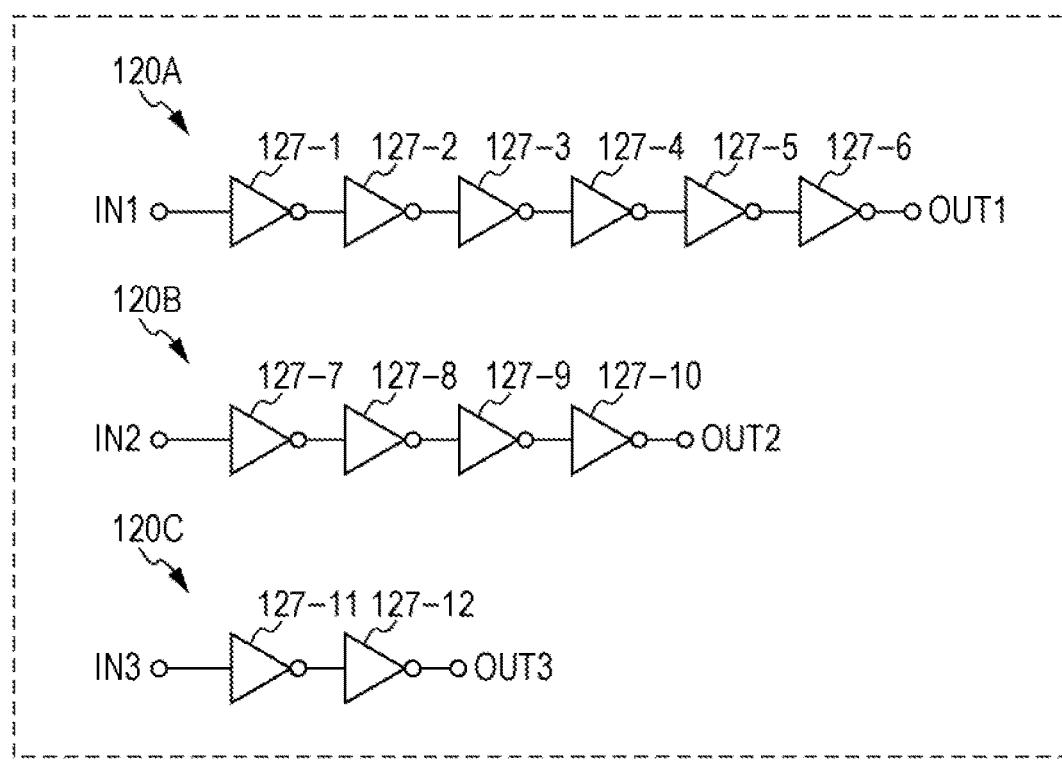
FIG. 9D is a diagram illustrating an example of a configuration of the clock generating circuit.
Figure 9E:
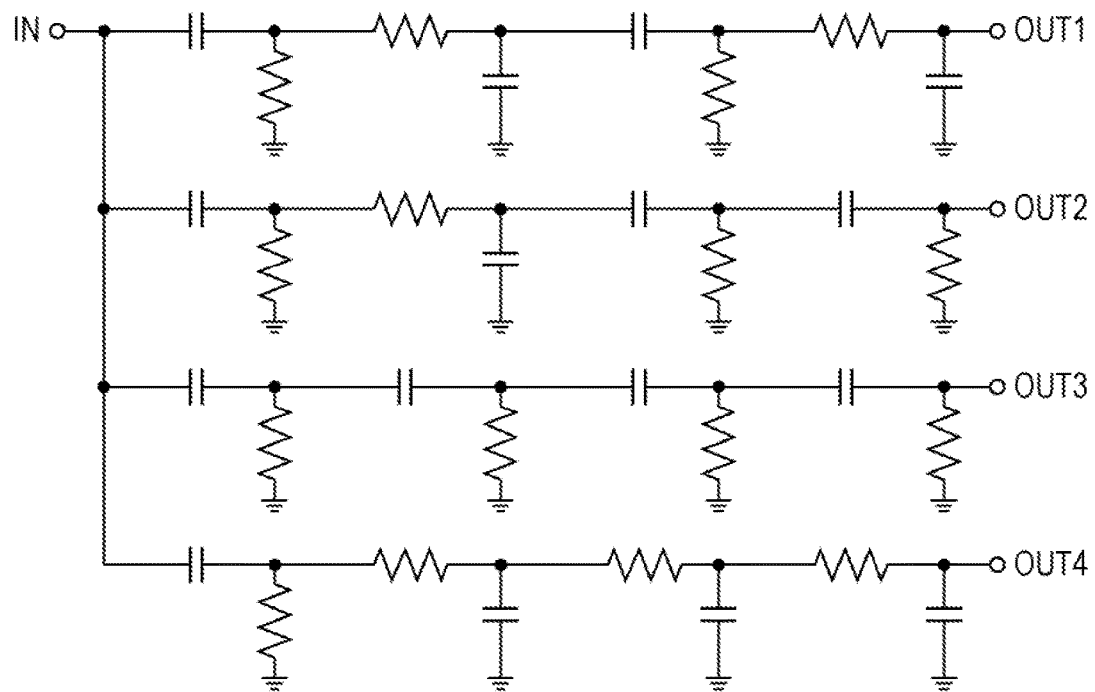
FIG. 9E is a diagram illustrating an example of a configuration of the clock generating circuit.

FIG. 9D illustrates a configuration using CMOS inverters 127-1 to 127-12. Six CMOS inverters 127-1 to 127-6 are connected to an input/output system 120A, four CMOS inverters 127-7 to 127-10 are connected to an input/output system 120B, and two CMOS inverters 127-11 to 127-12 are connected to an input/output system 120C. Note that the number of CMOS inverters connected to each input/output system is not limited to this. The CMOS inverters 127-1 to 127-12 delay a signal that passes therethrough. That is, in a case where different numbers of CMOS process inverters are connected to the input/output systems 120A to 120C, the input/output systems 120A to 120C can delay input signals by amounts different from each other and thereby generate different output signals of four phases.

Another Configuration of Mixer.

FIG. 3 illustrates a case where the mixer 100 is a single-balanced mixer. In the present embodiment, a clock generating circuit and a clock adjusting circuit may be used in a double-balanced mixer.

Figure 10:
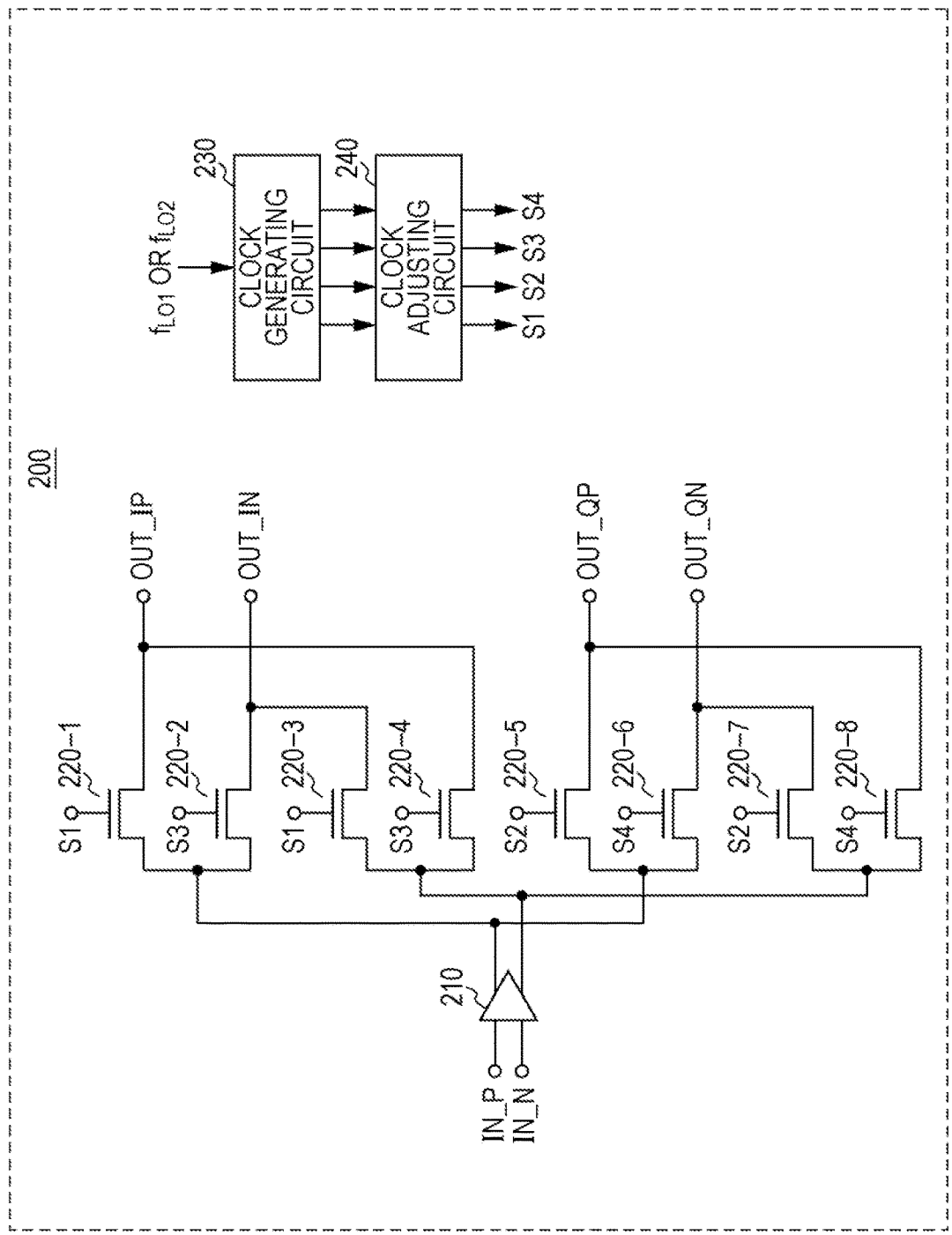
FIG. 10 is a diagram illustrating an example of a configuration of a mixer according to Embodiment 1.

FIG. 10 is a diagram illustrating an example of a configuration of a mixer 200 according to the present embodiment. The mixer 200 illustrated in FIG. 10 includes a voltage-to-current converting circuit (TA) 210, switches 220-1 to 220-8, a clock generating circuit 230, and a clock adjusting circuit 240. The mixer 200 is configured as a double-balanced mixer and outputs signals of four phases in response to signals of positive and negative phases that are input from terminals IN_P and IN_N.

The TA 210 amplifies the input signals. Note that the TA 210 may be an amplifier or may be a buffer.

The switches 220-1 to 220-8 are similar to the switches 110-1 to 110-4 illustrated in FIG. 3 and are controlled by clocks S1 to S4 supplied from the clock adjusting circuit 240.

The clock generating circuit 230 is similar to the clock generating circuit 120 illustrated in FIG. 3. The clock generating circuit 230 generates base clocks B1 to B4 from a local oscillation signal ($f_{LO1}$ or $f_{LO2}$) supplied from an LO frequency oscillator (see FIGS. 2A and 2B) and then supply the base clocks B1 to B4 to the clock adjusting circuit 240.

The clock adjusting circuit 240 is similar to the clock adjusting circuit 130 illustrated in FIG. 3. The clock adjusting circuit 240 adjusts the duty ratios, phases, and amplitudes of the base clocks B1 to B4 and then supplies, as clocks S1 to S4, the adjusted clocks to the switches 220-1 to 220-8.

Configuration of Clock Adjusting Circuit that Adjusts Clocks of Four Phases

Figure 11A:
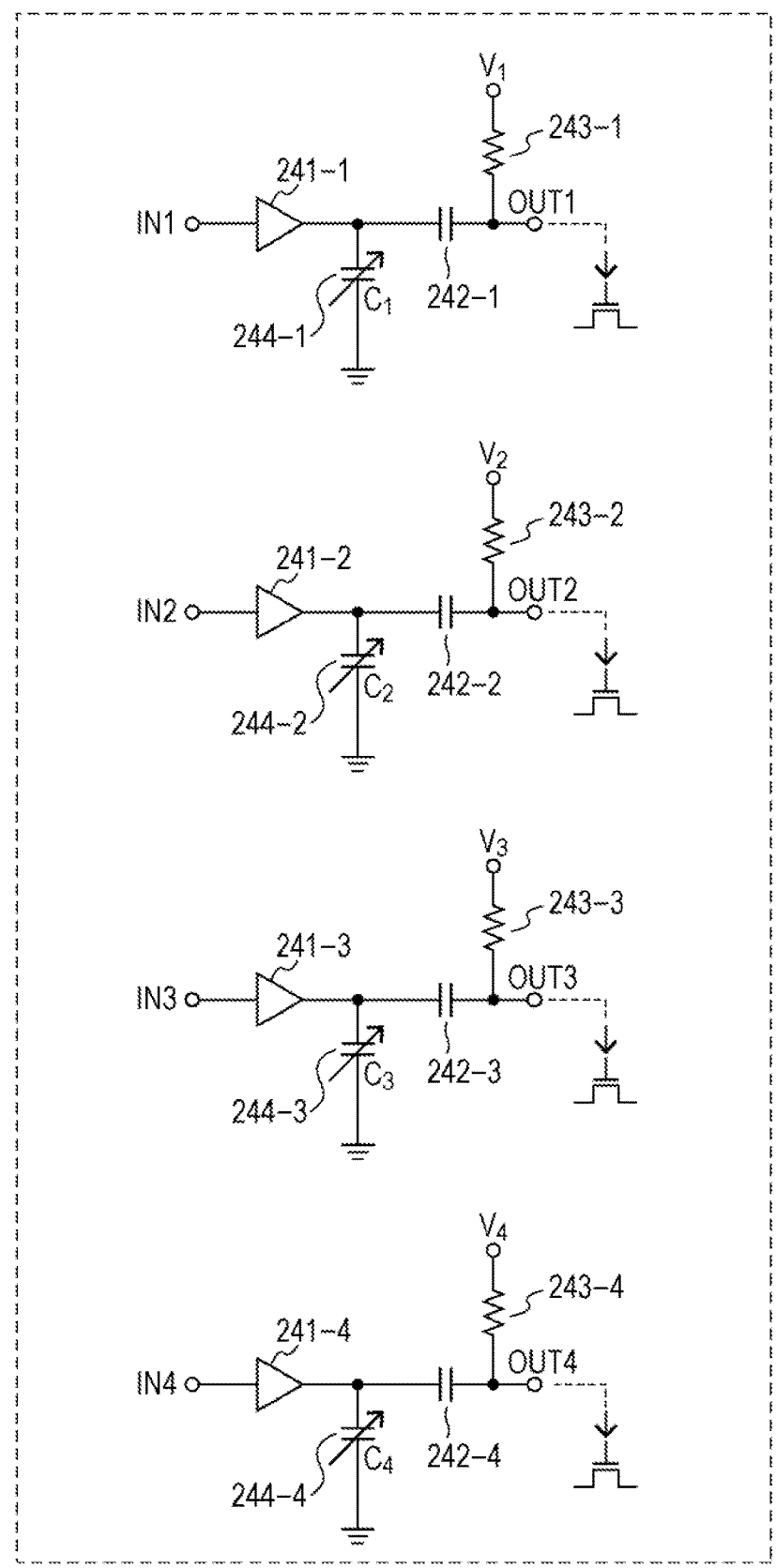
FIG. 11A is a diagram illustrating an example of a configuration of the clock adjusting circuit according to Embodiment 1.
Figure 11B:
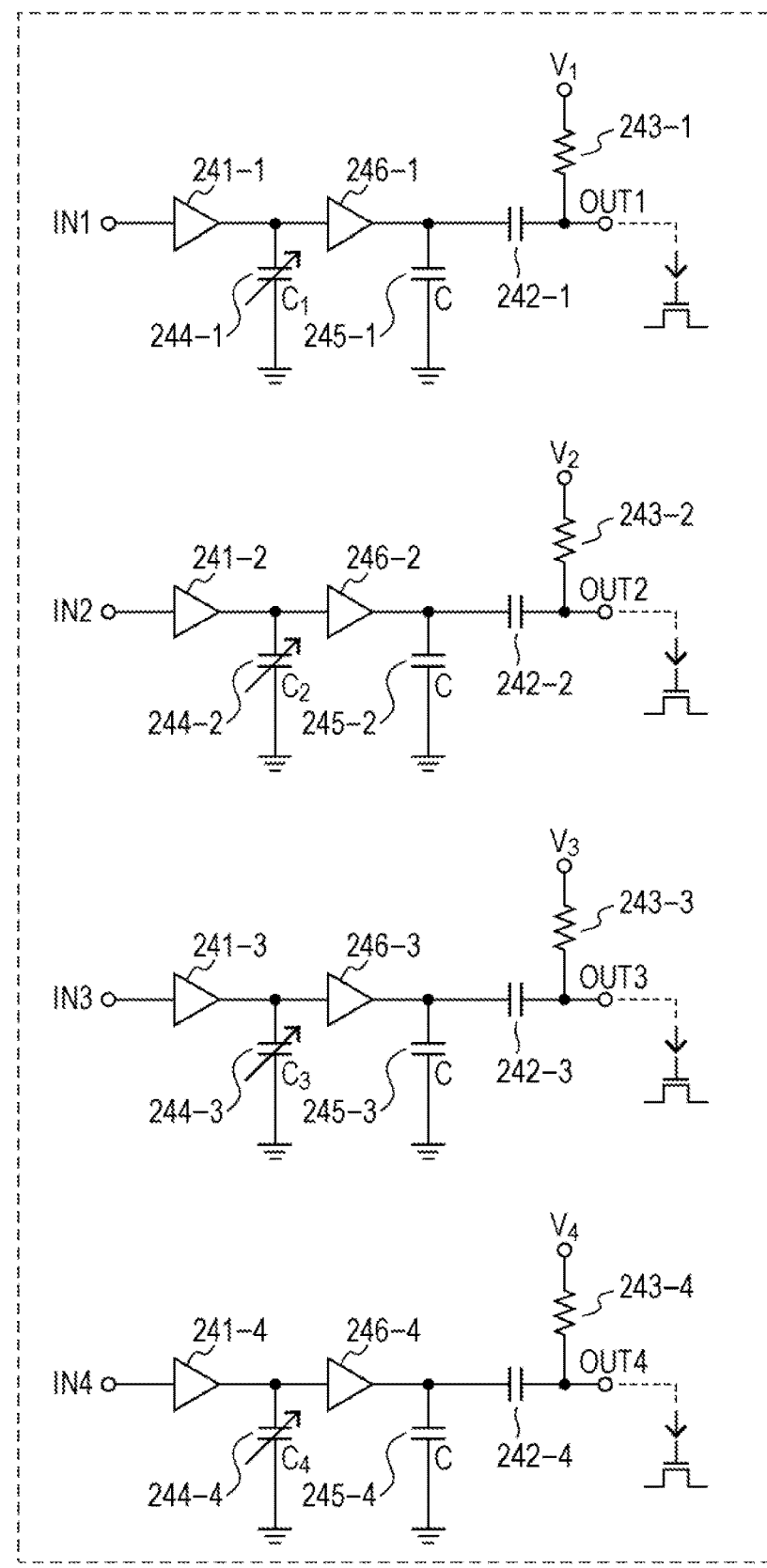
FIG. 11B is a diagram illustrating an example of a configuration of the clock adjusting circuit according to Embodiment 1.
Figure 11C:
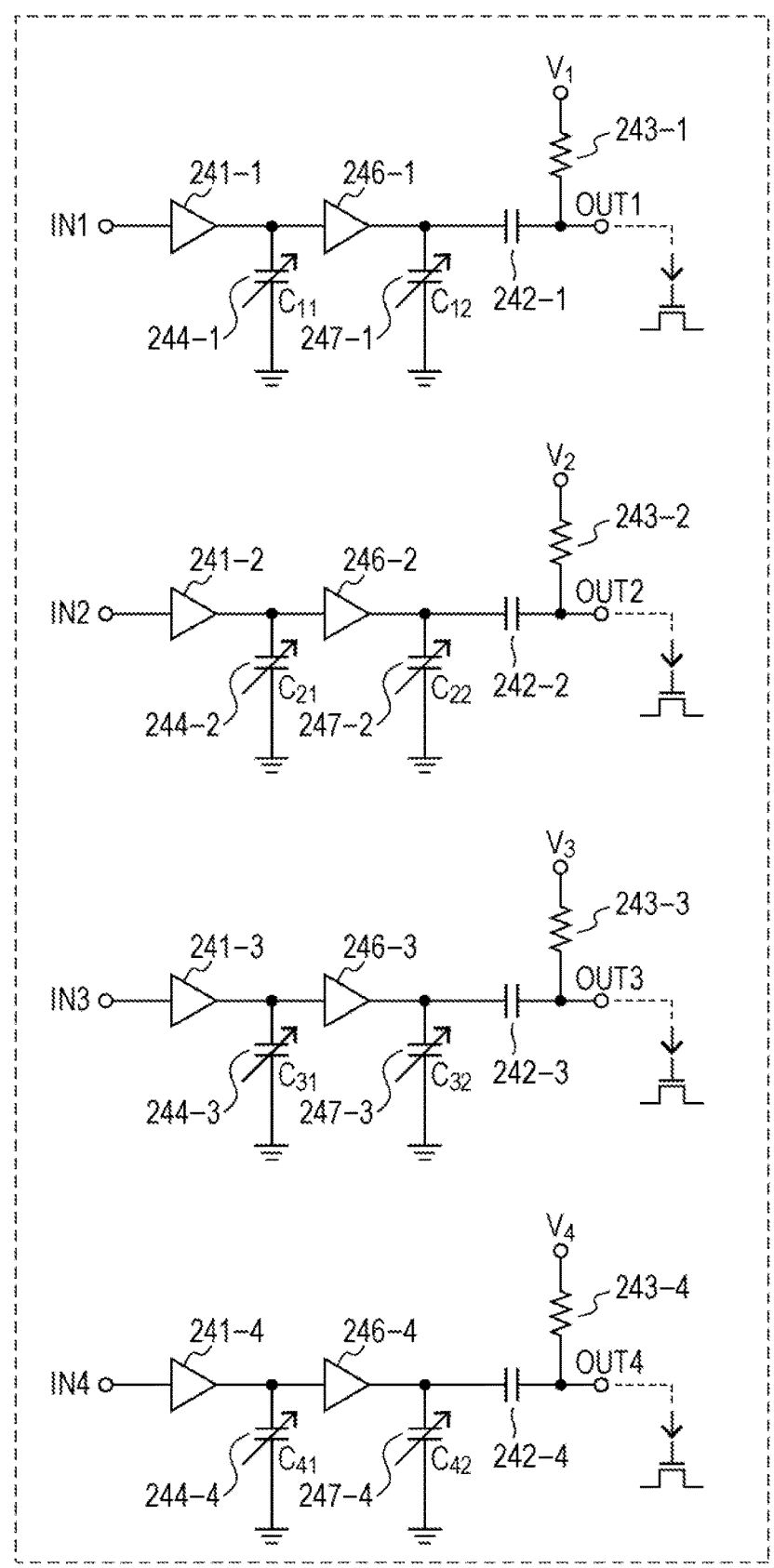
FIG. 11C is a diagram illustrating an example of a configuration of the clock adjusting circuit according to Embodiment 1.

A configuration of the clock adjusting circuit 240 that adjusts clocks of four phases is described below. FIGS. 11A to 11C are diagrams each illustrating an example of a configuration of the clock adjusting circuit 240 according to the present embodiment.

FIG. 11A illustrates a configuration for adjusting the duty ratio of each of the clocks S1 to S4. The configuration of FIG. 11A includes four systems that output the clocks S1 to S4 of four phases in response to the base clocks B1 to B4 of four phases, and has amplifiers 241-1 to 241-4, capacitors 242-1 to 242-4, resistors 243-1 to 243-4, and variable capacitors 244-1 to 244-4. Voltages $V_1$ to $V_4$ are applied to the resistors 243-1 to 243-4 of the four systems, respectively.

In the configuration of FIG. 11A, the duty ratios of the base clocks B1 to B4 supplied to the respective systems can be adjusted by adjusting the bias of the base clocks B1 to B4 to different values by using the voltages $V_1$ to $V_4$ that are different from each other and adjusting capacitance values by using the variable capacitors 244-1 to 244-4. Even in a case where the base clocks B1 to B4 have different duty ratios, for example, due to influence of layout of wires in the circuit, the bias and capacitance values can be adjusted to different values in the respective systems, and therefore the clocks S1 to S4 output from the respective systems can be made equivalent to ideal clocks.

Note that it is also possible to adjust the phases of signals of four phases as illustrated in FIG. 7B by using the configuration of FIG. 11A.

FIG. 11B illustrates a configuration for adjusting the phases of the clocks S1 to S4. In FIG. 11B, elements that are identical to those in FIG. 11A are given reference signs identical to those in FIG. 11A, and description thereof is omitted. The configuration of FIG. 11B includes amplifiers 246-1 to 246-4 and capacitors 245-1 to 245-4 in addition to the configuration of FIG. 11A. A voltage $V_1$ is applied to each of the resistors 243-1 to 243-4 of the four systems.

In the configuration of FIG. 11B, the variable capacitors 244-1 to 244-4 rounds signals in different ways in the respective systems. The amplifiers 246-1 to 246-4 cause the signals that have been rounded in different ways to rise again. According to the configuration, timings of rise of the signals can be made different in the respective systems, and it is therefore possible to adjust the timings of rise, i.e., adjust the phases. The signals output from the amplifiers 246-1 to 246-4 are adjusted by the capacitors 245-1 to 245-4 and the bias in the respective systems so that a duty ratio in the switches becomes a desired one.

FIG. 11C illustrates a configuration for adjusting the phases and duty ratios of the clocks S1 to S4. In FIG. 11C, elements that are identical to those in FIG. 11B are given reference signs identical to those in FIG. 11B, and description thereof is omitted. The configuration of FIG. 11C is obtained by replacing the capacitors 245-1 to 245-4 in the configuration of FIG. 11B with variable capacitors 247-1 to 247-4. Voltages $V_1$ to $V_4$ are applied to resistors 243-1 to 243-4 in four systems, respectively.

The configuration of FIG. 11C adjusts phases by causing signals to rise at different timings in the respective systems by using the variable capacitors 244-1 to 244-4 and amplifiers 246-1 to 246-4 as in FIG. 11B. Furthermore, the duty ratios can be adjusted by adjusting bias to different values by using the different voltages $V_1$ to $V_4$ and adjusting capacitance values by using the variable capacitors 247-1 to 247-4 as in FIG. 11A.

Figure 12A:
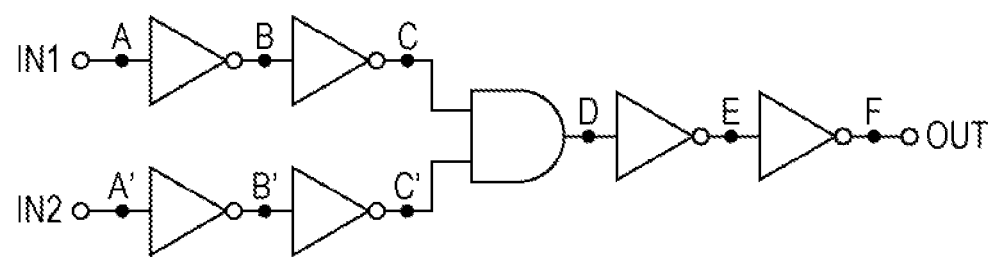
FIG. 12A is a diagram illustrating an example of another configuration of the clock generating circuit.
Figure 12B:
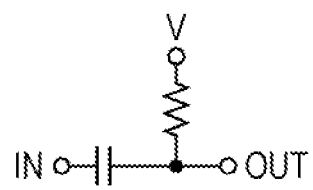
FIG. 12B is a diagram illustrating an example of another configuration of the clock adjusting circuit.

Note that clocks of four phases can also be adjusted by using another configuration. FIG. 12A is a diagram illustrating an example of another configuration of a clock generating circuit. FIG. 12B is a diagram illustrating an example of another configuration of a clock adjusting circuit.

Figure 1A:
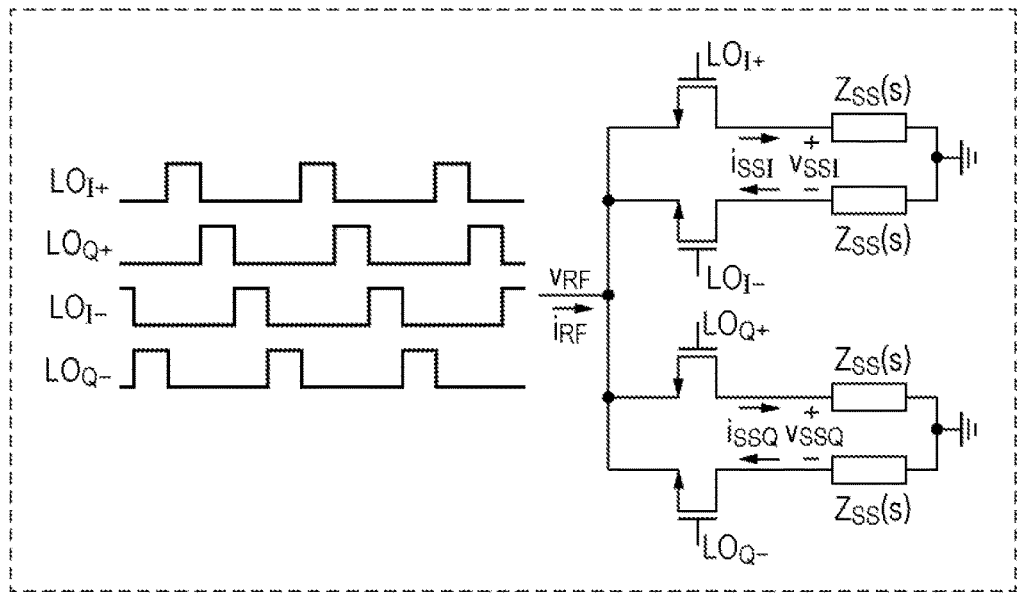
FIG. 1A is a diagram illustrating an outline of a mixer using clocks having a duty ratio of 25% disclosed in Non-Patent Literature 1.
Figure 1B:
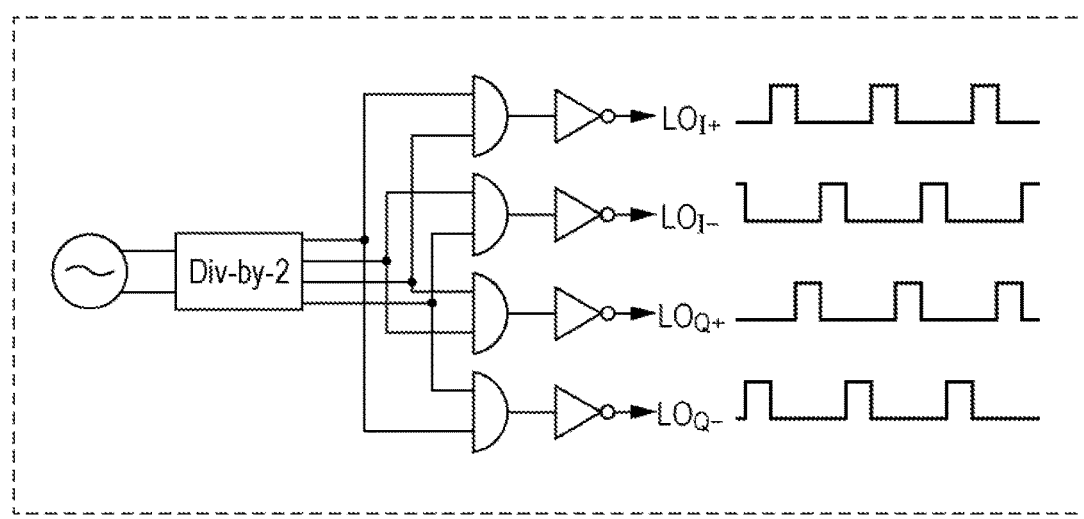
FIG. 1B is a diagram illustrating a specific example of the clocks having a duty ratio of 25% disclosed in Non-Patent Literature 1.

The clock adjusting circuit illustrated in FIG. 12B may be added to the clock generating circuit illustrated in FIG. 12A or the AND circuit for generating signals for four phases in FIG. 1B that is a clock generating circuit.

The bias can be adjusted and the frequency of an AND operation can be increased by inserting the clock adjusting circuit illustrated in FIG. 12B into an insertion point A or an insertion point A' (or an insertion point B or an insertion point B' or an insertion point C or an insertion point C') of the clock generating circuit illustrated in FIG. 12A. The frequency of an inverter operation can be increased by inserting the clock adjusting circuit illustrated in FIG. 12B into an insertion point D or an insertion point E.

An ON period of a switch can be adjusted by inserting the clock adjusting circuit illustrated in FIG. 12B into an insertion point F that is connected to the switch. Note that the clock adjusting circuit in FIG. 12B that is inserted into the clock generating circuit in FIG. 12A may be inserted into any position, and the number of clock adjusting circuits in FIG. 12B inserted into the clock generating circuit in FIG. 12A may be more than 1. The number of inverters (or buffers) is 6 in the clock generating circuit in FIG. 12A, but is not limited to this.

Embodiment 2

In Embodiment 1, a clock adjusting circuit that adjusts the bias, phases, and duty ratios of base clocks generated by a clock generating circuit has been described. In the present embodiment, a configuration of a mixer that uses the clock adjusting circuit described in Embodiment 1 and operates by low-frequency clocks is described with reference to FIGS. 13A to 13C and 14A to 14C.

Figure 13A:
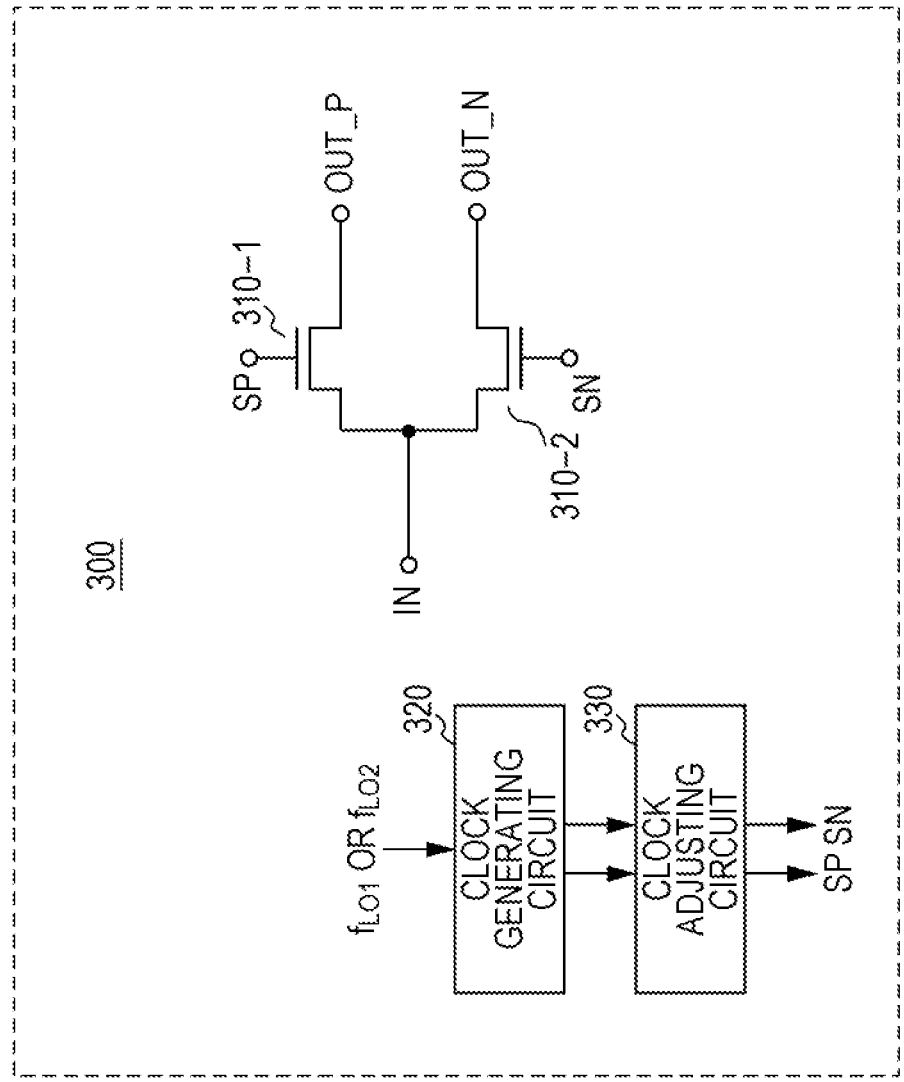
FIG. 13A is a diagram illustrating a configuration of a basic single-balanced mixer.

FIG. 13A is a diagram illustrating a configuration of a basic single-balanced mixer 300. The mixer 300 includes switches 310-1 and 310-2, a clock generating circuit 320, and a clock adjusting circuit 330 and outputs signals of positive and negative phases from terminals OUT_P and OUT_N in response to a signal input from a terminal IN.

Figure 14A:
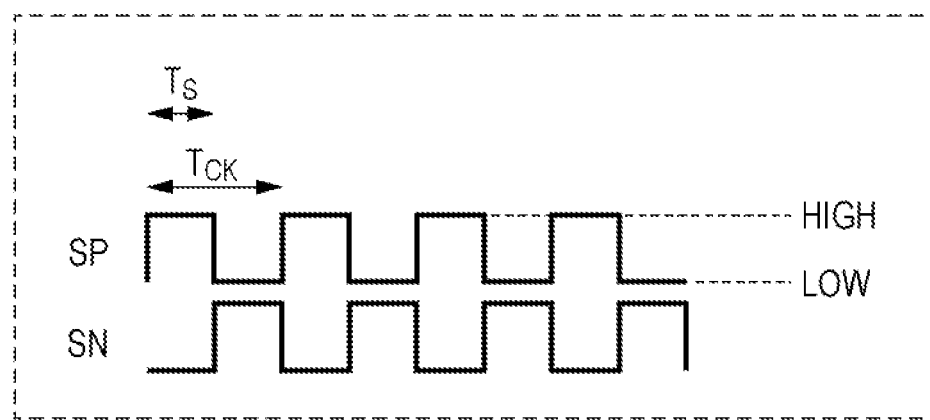
FIG. 14A is a diagram illustrating an example of clocks for operating the mixer illustrated in FIG. 13A.

ON/OFF of the switches 310-1 and 310-2 is controlled by clocks SP and SN supplied from the clock adjusting circuit 330. FIG. 14A is a diagram illustrating an example of clocks for operating the mixer 300 illustrated in FIG. 13A. The clocks SP and SN illustrated in FIG. 14A are equivalent clocks in the switches 310-1 and 310-2, and the switches 310-1 and 310-2 are ON during periods in which the clocks SP and SN are high, respectively, and are OFF during periods in which the clocks SP and SN are low, respectively.

Figure 13B:
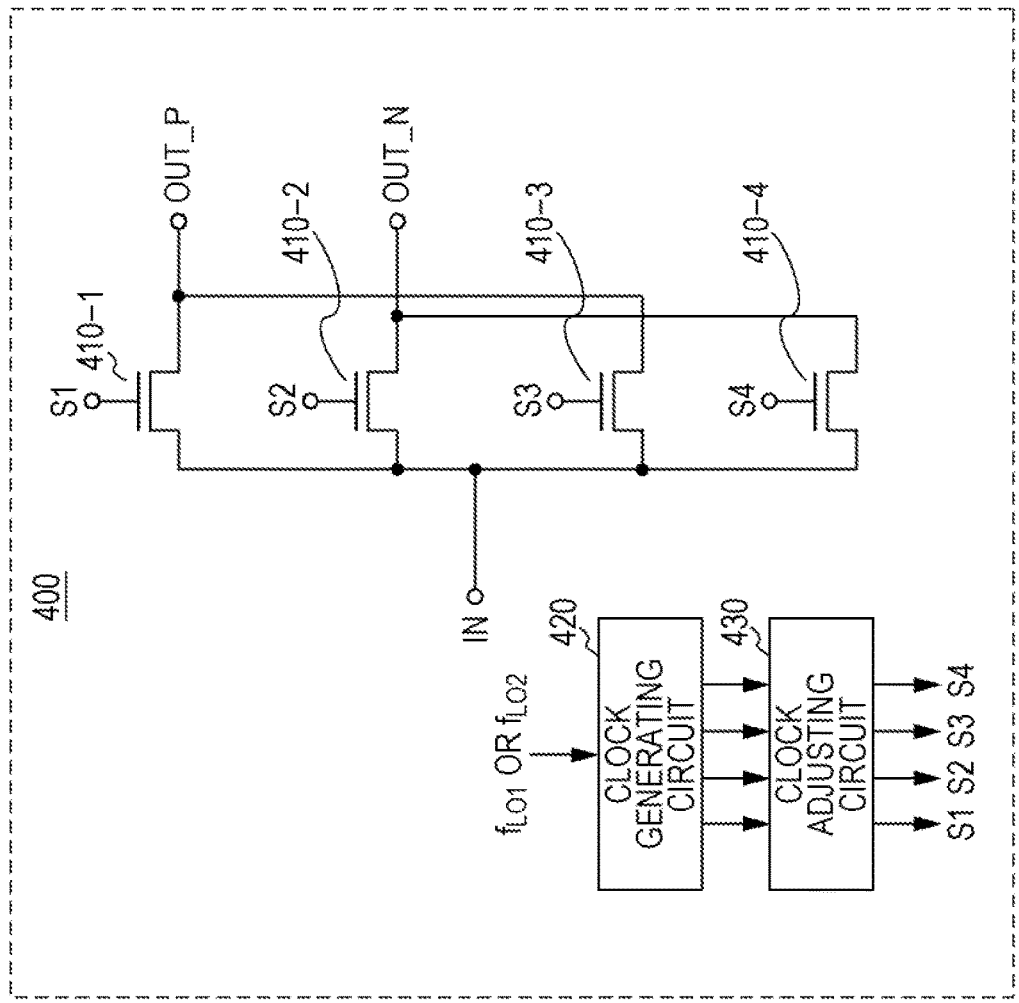
FIG. 13B is a diagram illustrating a configuration of a single-balanced mixer that realizes an operation similar to the mixer in FIG. 13A at a clock frequency that is ½ of the mixer in FIG. 13A.

FIG. 13B is a diagram illustrating a configuration of a single-balanced mixer 400 that realizes an operation similar to that of the mixer 300 in FIG. 13A at a clock frequency that is ½ of that in the mixer 300 in FIG. 13A. The mixer 400 includes switches 410-1 to 410-4, a clock generating circuit 420, and a clock adjusting circuit 430 and outputs signals of positive and negative phases from terminals OUT_P and OUT_N in response to a signal input from a terminal IN.

Figure 14B:
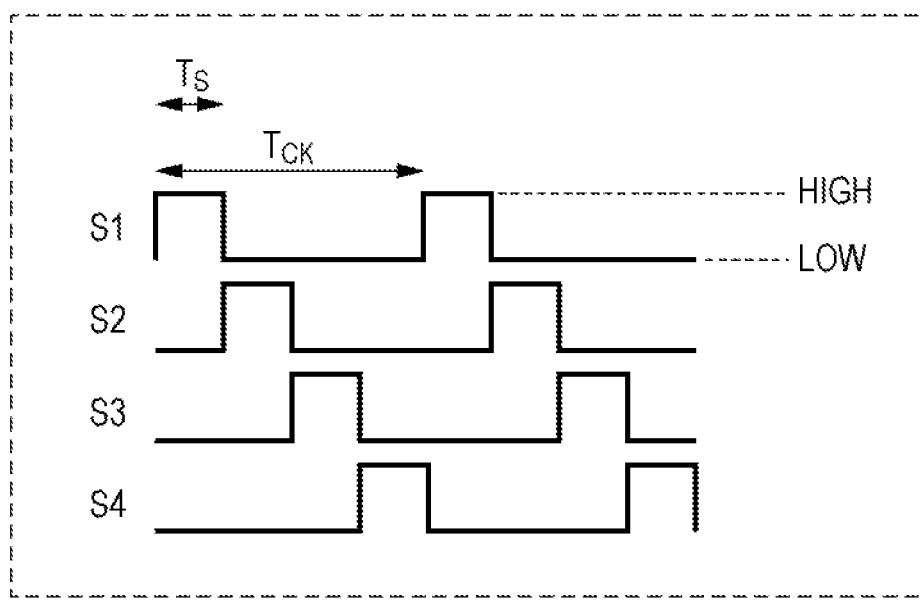
FIG. 14B is a diagram illustrating an example of clocks for operating the mixer illustrated in FIG. 13B.

ON/OFF of the switches 410-1 to 410-4 is controlled by clocks S1 to S4 supplied from the clock adjusting circuit 430. FIG. 14B is a diagram illustrating an example of clocks for operating the mixer 400 illustrated in FIG. 13B. The clocks S1 to S4 illustrated in FIG. 14B are equivalent clocks in the switches 410-1 to 410-4, and the switches 410-1 to 410-4 are ON during periods in which the clocks S1 to S4 are high, respectively, and are OFF during periods in which the clocks S1 to S4 are low, respectively.

The mixer 300 and the mixer 400 perform the same operation in a case where an ON period (i.e., a pulse width Ts) of the clocks for operating the mixer 300 illustrated in FIG. 14A is the same as that of the clocks for operating the mixer 400 illustrated in FIG. 14B. In this case, a cycle $T_{ck}$ of the clocks in FIG. 14B is two times as long as that of the clocks in FIG. 14A. That is, a clock frequency of the clocks in FIG. 14B is ½ of that of the clocks in FIG. 14A.

Figure 13C:
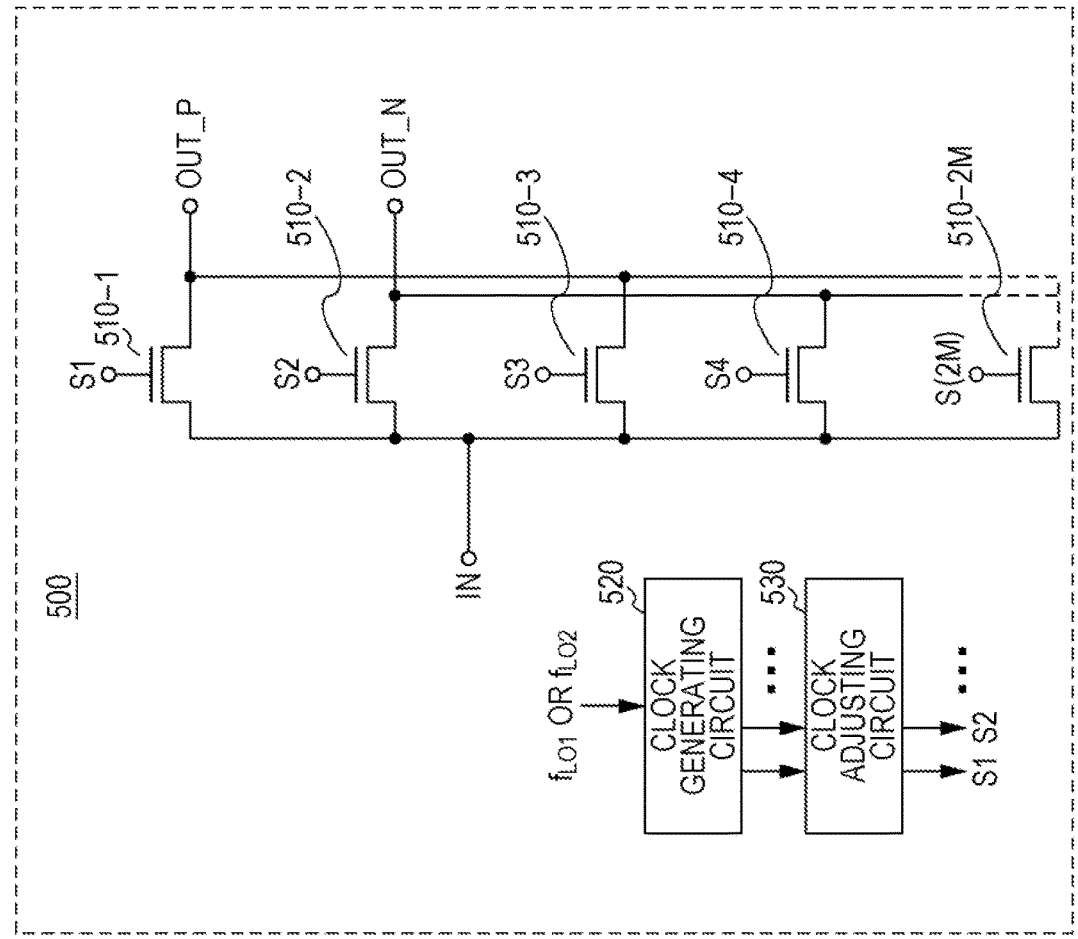
FIG. 13C is a diagram illustrating a configuration of a single-balanced mixer that realizes an operation similar to the mixer in FIG. 13A at a clock frequency that is 1/M of the mixer in FIG. 13A.

FIG. 13C is a diagram illustrating a configuration of a single-balanced mixer 500 that realizes an operation similar to that of the mixer 300 in FIG. 13A at a clock frequency that is 1/M of that in the mixer 300 in FIG. 13A. The mixer 500 includes switches 510-1 to 510-2M, a clock generating circuit 520, and a clock adjusting circuit 530 and outputs signals of positive and negative phases from terminals OUT_P and OUT_N in response to a signal input from a terminal IN.

Figure 14C:
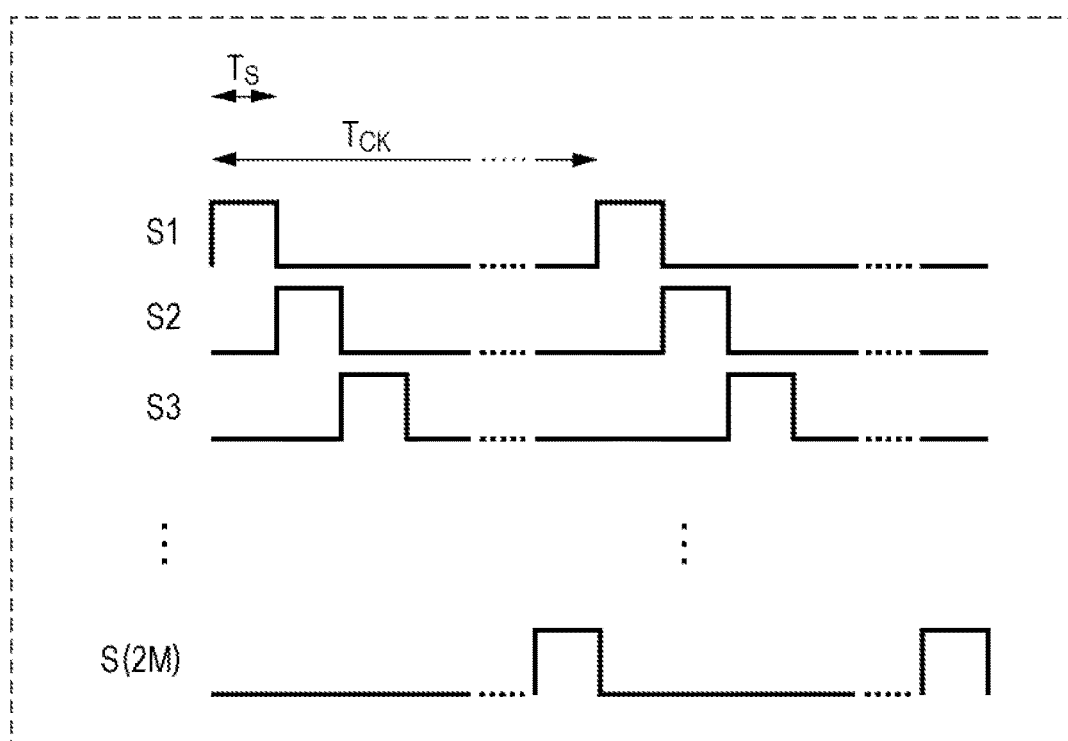
FIG. 14C is a diagram illustrating an example of clocks for operating the mixer illustrated in FIG. 13C.

ON/OFF of the switches 510-1 to 510-2M is controlled by clocks S1 to S(2M) supplied from the clock adjusting circuit 430. FIG. 14C is a diagram illustrating an example of clocks for operating the mixer 500 illustrated in FIG. 13C. The clocks S1 to S(2M) illustrated in FIG. 14C are equivalent clocks in the switches 510-1 to 510-2M, and the switches 510-1 to 510-2M are ON during periods in which the clocks S1 to S(2M) are high, respectively, and are OFF during periods in which the clocks S1 to S(2M) are low, respectively.

The mixer 300 and the mixer 500 perform the same operation in a case where an ON period (i.e., pulse width Ts) of the clocks for operating the mixer 300 illustrated in FIG. 14A is the same as that of the clocks for operating the mixer 500 illustrated in FIG. 14C. In this case, a cycle $T_{CK}$ of the clocks in FIG. 14C is M times as long as that of the clocks in FIG. 14A. That is, a clock frequency of the clocks in FIG. 14C is 1/M of that of the clocks in FIG. 14A.

As illustrated in FIGS. 14A to 14C, the clocks are different in terms of duty ratio and phase. The clock generating circuits 320 to 520 and the clock adjusting circuits 330 to 530 illustrated in FIGS. 13A to 13C have configurations similar to those described in Embodiment 1 and thus adjust the duty ratios and phases of the clocks.

The duty ratios and phases are adjusted by using the configuration of a clock adjusting circuit described in FIGS. 5A to 5C and FIGS. 11A to 11C. The phases are adjusted by using the configuration of a clock generating circuit described in FIGS. 9A, 9B, and 9D. Note that the duty ratios may be adjusted by using the configuration of a switch described in FIGS. 8A to 8D.

According to the present embodiment described above, an operation similar to an operation of a mixer using high-frequency clocks can be realized by low-frequency clocks. In this case, supplied clocks are realized by adjustment of duty ratios and phases in a clock generating circuit and a clock adjusting circuit.

Embodiment 3

In the present embodiment, a case where the analog baseband circuit described with reference to FIGS. 2A and 2B is realized by a discrete-time analog circuit by using the clock adjusting circuit described in Embodiment 1 is described. Note that the "discrete-time analog circuit" as used herein refers to a periodically time-varying continuous-time circuit combining a continuous-time system and a discrete-time system.

Figure 15A:
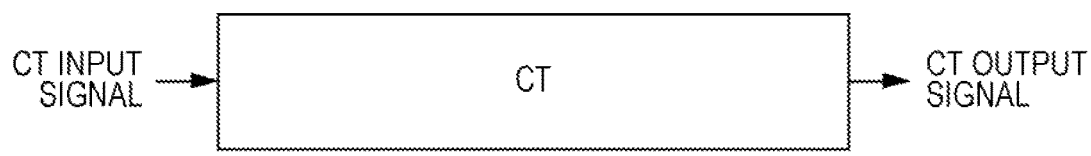
FIG. 15A is a concept diagram of a periodically time-varying continuous-time system.
Figure 15B:
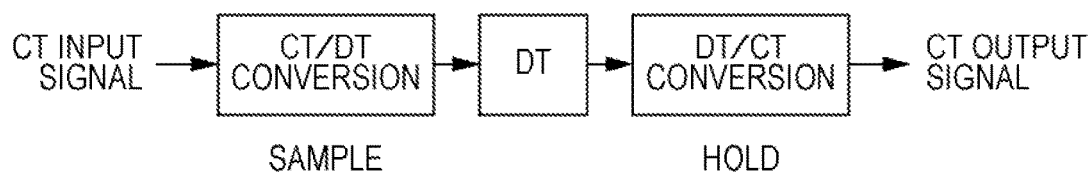
FIG. 15B is a concept diagram of a periodically time-varying continuous-time system.
Figure 15C:
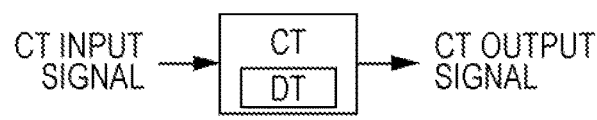
FIG. 15C is a concept diagram of a periodically time-varying continuous-time system.

FIGS. 15A to 15C are concept diagrams each illustrating a periodically time-varying continuous-time system. FIG. 15A illustrates a continuous-time circuit that receives a continuous-time (CT) signal and outputs a CT signal. Design of a continuous-time circuit in a fine CMOS process is not easy since the size of an inductor is large, a variation of absolute values of R and C is large, and it is difficult for an active circuit such as an operational amplifier to operate at a low power-supply voltage.

FIG. 15B illustrates a discrete-time circuit that converts a continuous-time input signal into a discrete-time (DT) signal in a sampling circuit or the like, processes the converted signal in the discrete-time circuit, and converts the processed discrete-time signal into a continuous-time signal in a hold circuit or the like. The discrete-time circuit is suitable for design in a fine CMOS process since the characteristics of the discrete-time circuit are determined on the basis of a ratio of clock frequency and capacitance and the discrete-time circuit can be designed at a low power-supply voltage. However, switches and clocks are necessary for conversion between a continuous system and a discrete system at input and output, and the number of constituent elements is larger because of the switches and clocks than the continuous-time system. In view of a broadband operation, it is desirable that the configuration be made as simple as possible by reducing the number of switches.

FIG. 15C illustrates a configuration of a periodically time-varying continuous-time circuit which is a hybrid of a continuous-time system and a discrete-time system. In this configuration, a discrete-time circuit is used in part of a continuous-time circuit. This makes it possible to realize a circuit that takes advantage of characteristics of a discrete-time system with a simple configuration. It is therefore possible to realize a circuit that can perform a broadband operation suitable for fine CMOS.

Configuration and Operation of Discrete-Time Analog Circuit 600

Figure 16:
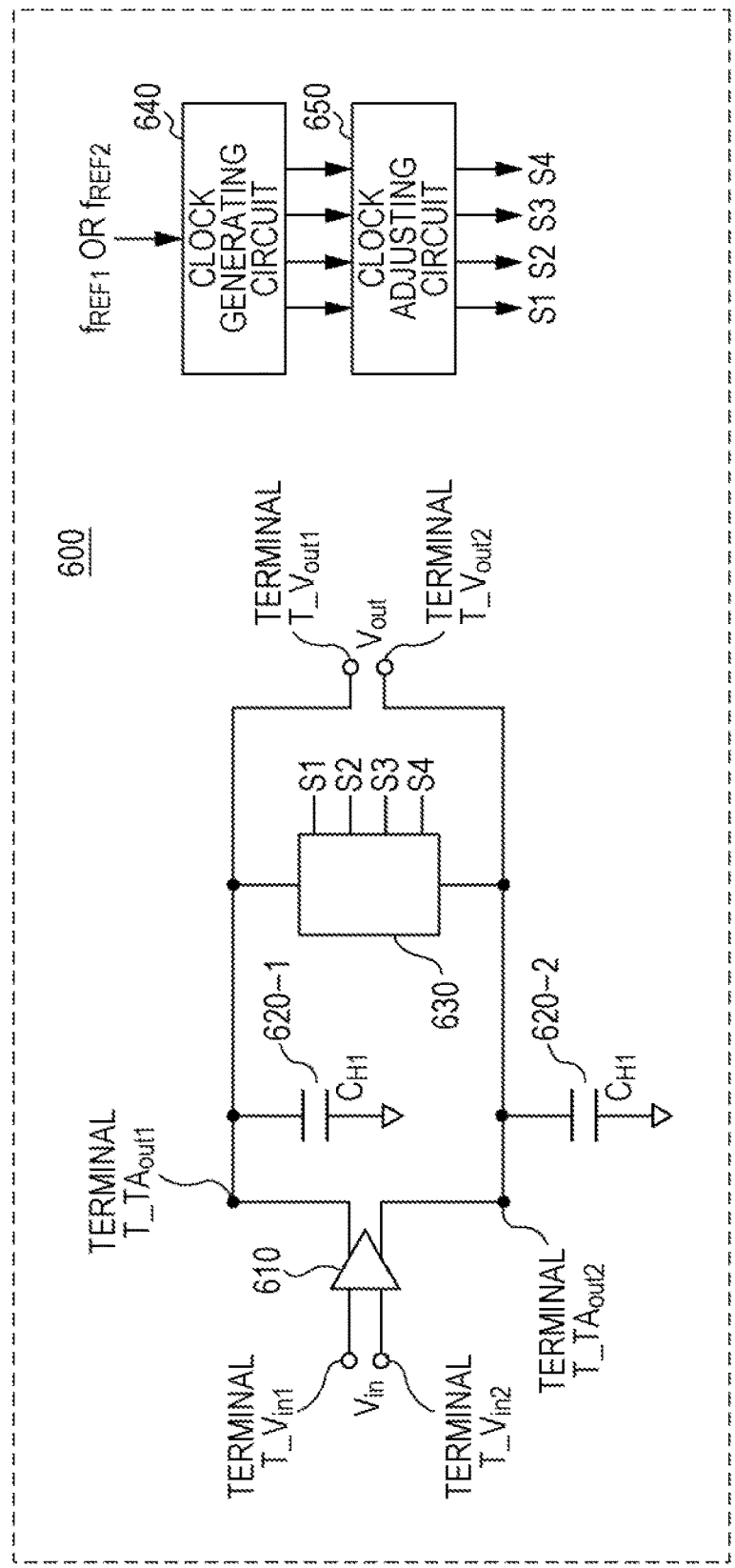
FIG. 16 is a diagram illustrating an example of a configuration of a substantial portion of a discrete-time analog circuit according to Embodiment 3.

FIG. 16 is a diagram illustrating an example of a configuration of a substantial portion of a discrete-time analog circuit 600 according to Embodiment 3. The discrete-time analog circuit 600 illustrated in FIG. 16 includes a TA 610

(Transconductance Amplifier), two capacitors 620 (620-1 and 620-2), an electric charge inversion circuit 630, a clock generating circuit 640, and a clock adjusting circuit 650.

The discrete-time analog circuit 600 is a differential discrete-time analog circuit to which input voltage signals $V_{in}$ including two systems (positive and negative phases) are input.

The TA 610 is a voltage-to-current converting circuit that receives the input voltage signals $V_{in}$ including two systems (positive and negative phases), converts the input voltage signals $V_{in}$ into electric currents ($g_m \times V_{in}$), and outputs electric currents of two systems (positive and negative phases). Note that $g_m$ is a value of transconductance (mutual conductance) of the TA 610.

The capacitor 620-1 is connected to a positive-phase output terminal $T\_TA_{out1}$ of the TA 610, and the capacitor 620-2 is connected to a negative-phase output terminal $T\_TA_{out2}$ of the TA 610. Capacitance values of the capacitors 620-1 and 620-2 are $C_{H1}$.

The electric charge inversion circuit 630 includes a plurality of switches, and one terminal of the electric charge inversion circuit 630 is connected to the output terminal $T\_TA_{out1}$ of the TA 610, and the other terminal of the electric charge inversion circuit 630 is connected to the output terminal $T\_TA_{out2}$. The electric charge inversion circuit 630 is a switching circuit that performs an operation of retaining an electric charge and an operation of inverting the electric charge and establishing connection by controlling ON/OFF of the plurality of switches. The electric charge inversion circuit 630 performs filtering processing on an input analog signal by electric charge sharing based on clocks supplied from the clock adjusting circuit 650.

The clock generating circuit 640 and the clock adjusting circuit 650 have configurations similar to those described in Embodiment 1 and supply clocks S1 to S4 to the electric charge inversion circuit 630. The clocks S1 to S4 are made up of a high period which is an ON period of a switch and a low period which is a period (OFF period) in which a switch is OFF.

Example 1 of Configuration of Electric Charge Inversion Circuit

Figure 17A:
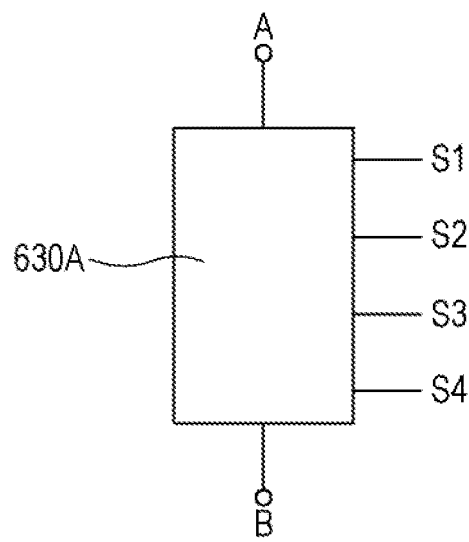
FIG. 17A is a diagram illustrating an example of a configuration of an electric charge inversion circuit according to Embodiment 3.
Figure 17B:
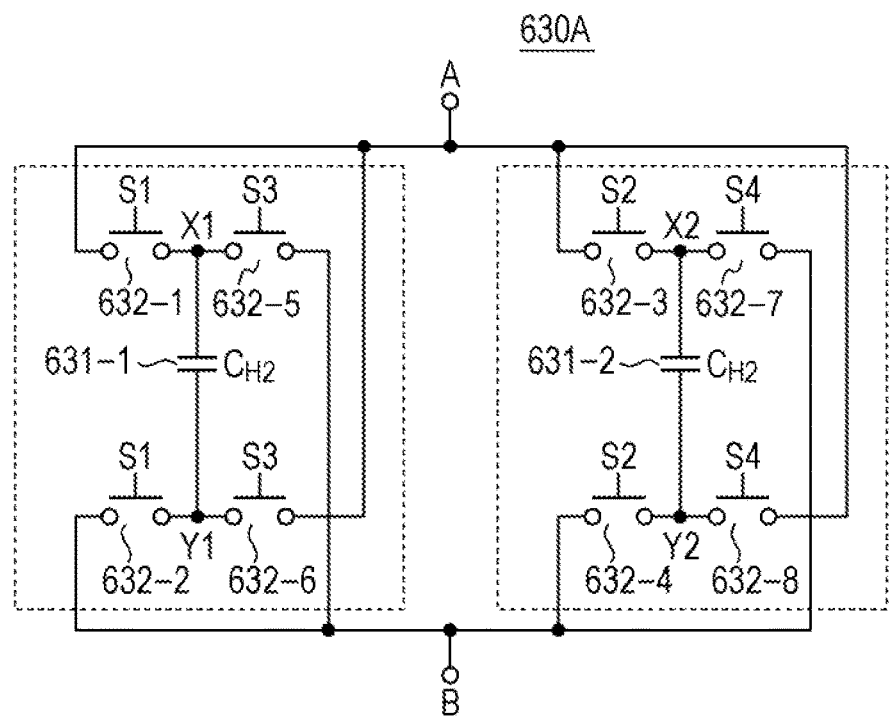
FIG. 17B is a diagram illustrating an example of an internal configuration of the electric charge inversion circuit according to Embodiment 3.

A specific configuration of the electric charge inversion circuit 630 is described below. FIG. 17A is a diagram illustrating an example of a configuration of an electric charge inversion circuit 630A according to Embodiment 3. FIG. 17B is a diagram illustrating an example of an internal configuration of the electric charge inversion circuit 630A according to Embodiment 3. The electric charge inversion circuit 630A illustrated in FIG. 17B includes two capacitors 631-1 and 631-2 and eight switches 632-1 to 632-8 that control connection of the capacitors 631-1 and 631-2. A terminal A of the electric charge inversion circuit 630 is connected to a positive-phase output terminal $T\_TA_{out1}$ of the TA 610, and a terminal B of the electric charge inversion circuit 630 is connected to a negative-phase output terminal $T\_TA_{out2}$ of the TA 610.

The switch 632-1 controls connection between a terminal X1 and the terminal A by using a clock S1, and the switch 632-1 connects the terminal X1 and the terminal A during a high period and cuts connection between the terminal X1 and the terminal A during a low period. The switch 632-2 controls connection between a terminal Y1 and the terminal B by using the clock S1, and the switch 632-2 connects the terminal Y1 and the terminal B during a high period and cuts connection between the terminal Y1 and the terminal B during a low period. The switch 632-3 controls connection between a terminal X2 and the terminal A by using a clock S2, and the switch 632-3 connects the terminal X2 and the terminal A during a high period and cuts connection between the terminal X2 and the terminal A during a low period. The switch 632-4 controls connection between a terminal Y2 and the terminal B by using the clock S2, and the switch 632-4 connects the terminal Y2 and the terminal B during a high period and cuts connection between the terminal Y2 and the terminal B during a low period. The switch 632-5 controls connection between the terminal X1 and the terminal B by using the clock S3, and the switch 632-5 connects the terminal X1 and the terminal B during a high period and cuts connection between the terminal X1 and the terminal B during a low period. The switch 632-6 controls connection between a terminal Y1 and the terminal A by using the clock S3, and the switch 632-6 connects the terminal Y1 and the terminal A during a high period and cuts connection between the terminal Y1 and the terminal A during a low period. The switch 632-7 controls connection between the terminal X2 and the terminal B by using the clock S4, and the switch 632-7 connects the terminal X2 and the terminal B during a high period and cuts connection between the terminal X2 and the terminal B during a low period. The switch 632-8 controls connection between a terminal Y2 and the terminal A by using the clock S4, and the switch 632-8 connects the terminal Y2 and the terminal A during a high period and cuts connection between the terminal Y2 and the terminal A during a low period.

In the above description, the "high period" and the "low period" refer to ones of the ideal clocks in FIG. 4A, but even in a case where the clock generating circuit 640 generates sine-wave signals as illustrated in FIG. 4B, ON and OFF periods of a switch that are equivalent to those in FIG. 4A can be realized by the clock adjusting circuit 650.

Generation of Clocks

Generation of clocks supplied from the clock generating circuit 640 and the clock adjusting circuit 650 is described below. In the present embodiment, the clock generating circuit 640 and the clock adjusting circuit 650 generate clocks equivalent to the ideal clock illustrated in FIG. 4A. In FIG. 4A, the pulse width Ts is identical to a sample interval. The clocks S1 to S4 are control signals of four phases whose duty ratio (=pulse width Ts/clock cycle $T_{CK}$) is 0.25 and whose phases are shifted by 90 degrees.

That is, the clock adjusting circuit 650 controls a switch so that the switch to be controlled is ON during an interval in which the clock in FIG. 4A is high and so that the switch to be controlled is OFF during an interval in which the clock in FIG. 4A is low. Although rectangular clocks are illustrated as ideal clock waveforms in FIG. 4A, a switch operation equivalent to that realized by similar waveforms can be realized even in a case where sine waves are input. For example, the clock generating circuit 640 generates sine-wave signals of four phases illustrated in FIG. 4B, and the clock adjusting circuit 650 adjusts periods in which the switches are ON by adjusting bias and capacitance. Generation of signal of different phases in the clock generating circuit 640 can be achieved by the configuration in FIGS. 9A to 9D, and adjustment of bias in the clock adjusting circuit 650 can be achieved by the configuration in FIGS. 5A to 5C and 11A to 11C. Note that adjustment of bias can be achieved by the configuration in FIGS. 32A and 32B that will be described later. Adjustment of a threshold value that determines ON/OFF of the switches can also be achieved by employing the configuration of FIGS. 8A to 8D as the switches 632-1 to 632-8.

Example 1 of Operation of Discrete-Time Analog Circuit 600

An operation in the discrete-time analog circuit 600 is described below. FIGS. 18A to 18D are diagrams each illustrating an outline of an operation in the discrete-time analog circuit 600. In FIGS. 18A to 18D, states of connection of the TA 610, the capacitors 631-1 and 631-2, and the capacitor 620-1 are illustrated. Although the discrete-time analog circuit 600 illustrated in FIG. 16 has been described as a differential configuration including two systems (positive and negative phases), FIGS. 18A to 18D illustrate, for simplification of description, a configuration of a single-phase input/output system.

The discrete-time analog circuit 600 generates sample values by repeatedly performing electric charge sharing every interval Ts. The discrete-time analog circuit 600 shares the following three types of electric charges.

(1-a) An electric charge obtained when the TA 610 converts an input voltage signal $V_{in}$ into an electric current, i.e., an electric charge (hereinafter referred to as an input electric charge) that is output to the output terminal $T\_TA_{out}$ of a TA 610

(1-b) An electric charge of a previous sample retained by the capacitor 620

(1-c) An electric charge of a sample preceding the previous sample retained by the electric charge inversion circuit 630

Note that the electric charge inversion circuit 630 shares three types of electric charges by inverting polarities of the retained electric charge of the sample preceding the previous sample.

The electric charge inversion circuit 630 performs the following four operations within 1 cycle (1 $T_{CK}$) as illustrated in FIGS. 18A to 18D by control (ON and OFF) of the switches 632-1 to 632-8 based on the clocks S1 to S4 equivalent to the ideal clocks illustrated in FIG. 4A and repeats the following four operations every cycle $T_{CK}$. Note that the following first to fourth operations correspond to FIGS. 18A to 18D, respectively.

First operation: During a high period of the clock S1, the terminal X1 of the capacitor 631-1 is connected to the terminal A, and the terminal Y1 of the capacitor 631-1 is connected to the terminal B (hereinafter referred to as positive-phase connection of the capacitor 631-1).

Second operation: During a high period of the clock S2, the terminal X2 of the capacitor 631-2 is connected to the terminal A, and the terminal Y2 of the capacitor 631-2 is connected to the terminal B (hereinafter referred to as positive-phase connection of the capacitor 631-2).

Third operation: During a high period of the clock S3, the terminal Y1 of the capacitor 631-1 is connected to the terminal A, and the terminal X1 of the capacitor 631-1 is connected to the terminal B (hereinafter referred to as negative-phase connection of the capacitor 631-1).

Fourth operation: During a high period of the clock S4, the terminal Y2 of the capacitor 631-2 is connected to the terminal A, and the terminal X2 of the capacitor 631-2 is connected to the terminal B (hereinafter referred to as negative-phase connection of the capacitor 631-2).

That is, the four operations, i.e., the first operation in which capacitor 631-1 is positive-phase connected, and an electric charge shared by negative-phase connection of the capacitor 631-2 is retained, the second operation in which the capacitor 631-2 is positive-phase connected, and an electric charge shared by positive-phase connection of the capacitor 631-1 is retained, the third operation in which the capacitor 631-1 is negative-phase connected, and an electric charge shared by positive-phase connection of the capacitor 631-2 is retained, and the fourth operation in which the capacitor 631-2 is negative-phase connected, and an electric charge shared by negative-phase connection of the capacitor 631-1 is retained are performed every interval Ts.

The capacitors 631-1 and 631-2 perform an operation of inverting polarities of a retained electric charge and establishing connection by negative-phase connection (positive-phase connection) of an electric charge shared by positive-phase connection (negative-phase connection).

That is, through the first to fourth operations, the electric charge inversion circuit 630A alternately perform, every Ts period, an operation (the first operation and the third operation) in which the capacitor 631-1 is connected by inverting polarities of an electric charge retained by the capacitor 631-1 and connection of the capacitor 631-2 is released and an electric charge is retained and an operation (the second operation and the fourth operation) in which the capacitor 631-2 is connected by inverting polarities of an electric charge retained by the capacitor 631-2 and connection of the capacitor 631-1 is released and an electric charge is retained.

The following the first to fourth operations in mathematical terms.

An outline of electric charge sharing at the point n in the discrete-time analog circuit 600 can be described by the difference equation expressed by the following formula (1):

$$q_{in}(n) + C_{H1}V_{out}(n-1) - C_{H2}V_{out}(n-2) = (C_{H1} - C_{H2})V_{out}(n) \quad (1)$$

In the formula (1), the first term of the left-hand side corresponds to an input electric charge, the second term of the left-hand side is an electric charge of a previous sample retained by the capacitor 620, and the third term of the left-hand side is an electric charge of a sample preceding the previous sample that is retained in the capacitor 631-1 or 631-2. By z conversion, a core part of a transfer function of the discrete-time analog circuit 600 is expressed by the following formula (2):

$$H_H = \frac{\frac{1}{C_{H1} + C_{H2}}}{1 - \frac{C_{H1}}{C_{H1} + C_{H2}} z^{-1} + \frac{C_{H2}}{C_{H1} + C_{H2}} z^{-2}} \quad (2)$$

$$z = e^{j\omega Ts}$$

Note that the formula is an outline of the transfer function in a case where the circuit is regarded as a discrete system. Analysis of a periodically time-varying continuous-time system is necessary to derive accurate input output characteristics.

That is, analysis of a circuit including a discrete-time circuit in a continuous-time GmC filter illustrated in FIG. 16 (or a parallel system of a continuous-time system and a discrete-time system) is needed, and the transfer function is one in which a transfer function of a GmC continuous-time filter and a transfer function of a discrete-time filter are synthesized, but the core of the transfer function is the aforementioned formula, and in-band deviation can be adjusted due to an effect of the discrete-time system.

Frequency characteristics of the discrete-time analog circuit 600 are described below. FIG. 19 is a diagram illustrating a result of circuit simulation of low-pass characteristics of the discrete-time analog circuit 600. In FIG. 19, the horizontal axis represents a frequency, and the vertical axis represents gain. In FIG. 19, $C_{H1}$ is 300 fF, and $C_{H2}$ is low-pass characteristics of the discrete-time analog circuit 600 that change as a parameter. Note that in the discrete-time analog circuit 600, $C_{H2}$ may be fixed and $C_{H1}$ may be a parameter.

As illustrated in FIG. 19, the discrete-time analog circuit 600 allows passage of a broadband signal and can adjust in-band deviation (level difference) in a pass band by changing $C_{H2}$ (or $C_{H1}$). Furthermore, since the discrete-time analog circuit 600 has a differential configuration, an even-order component can be removed after differential synthesis.

Example 2 of Configuration of Electric Charge Inversion Circuit

Figure 17C:
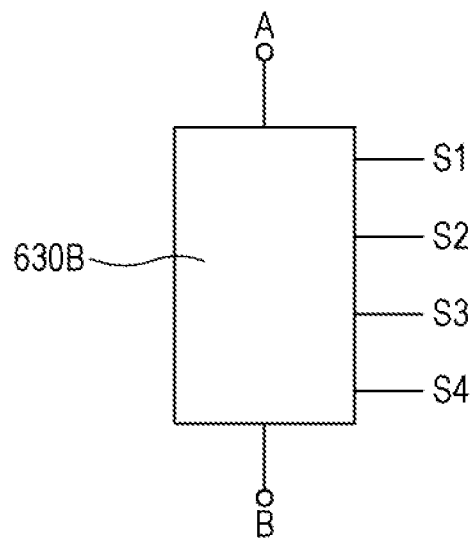
FIG. 17C is a diagram illustrating an example of a configuration of the electric charge inversion circuit according to Embodiment 3.
Figure 17D:
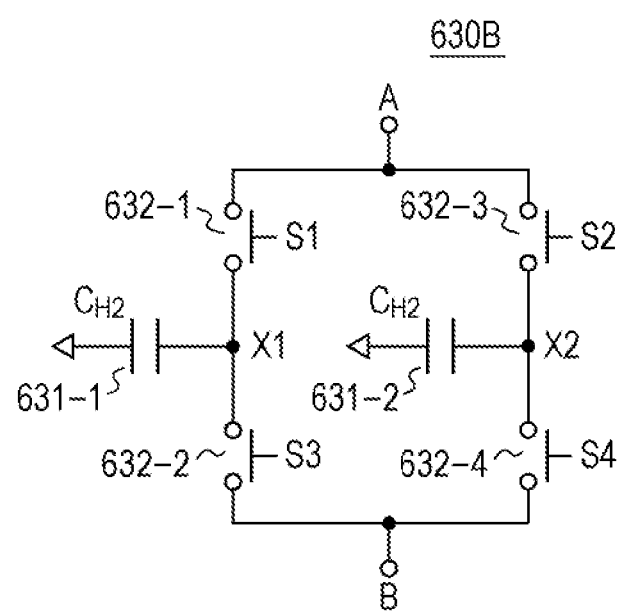
FIG. 17D is a diagram illustrating an example of an internal configuration of the electric charge inversion circuit according to Embodiment 3.
Figure 18A:
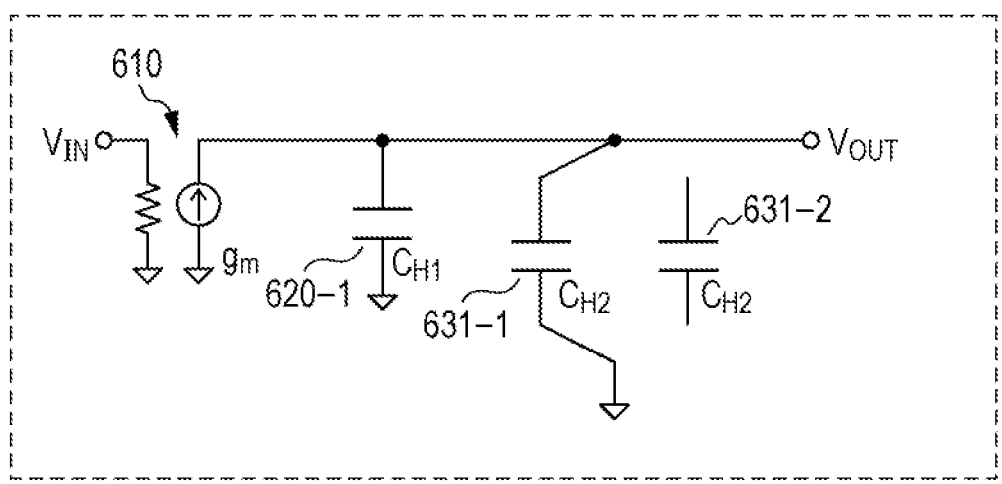
FIG. 18A is a diagram illustrating an outline of an operation in a discrete-time analog circuit.
Figure 18B:
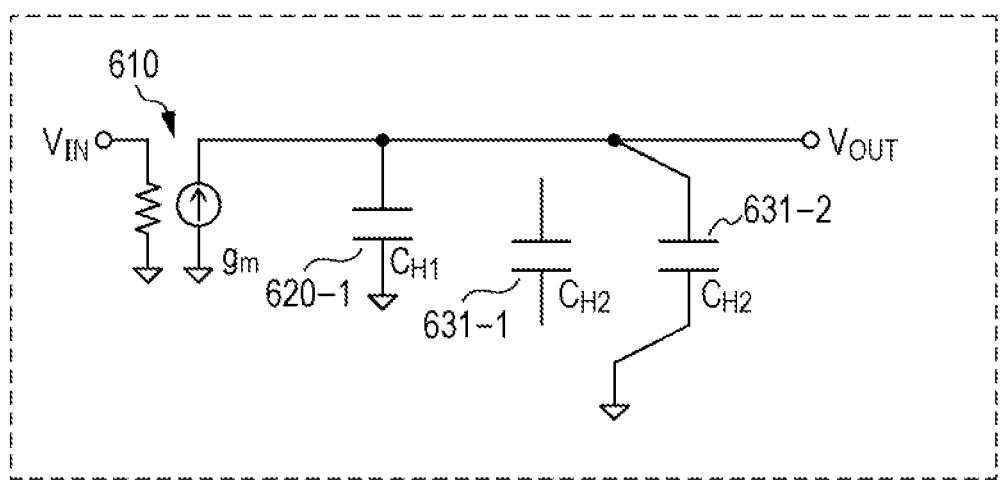
FIG. 18B is a diagram illustrating an outline of an operation in the discrete-time analog circuit.
Figure 18C:
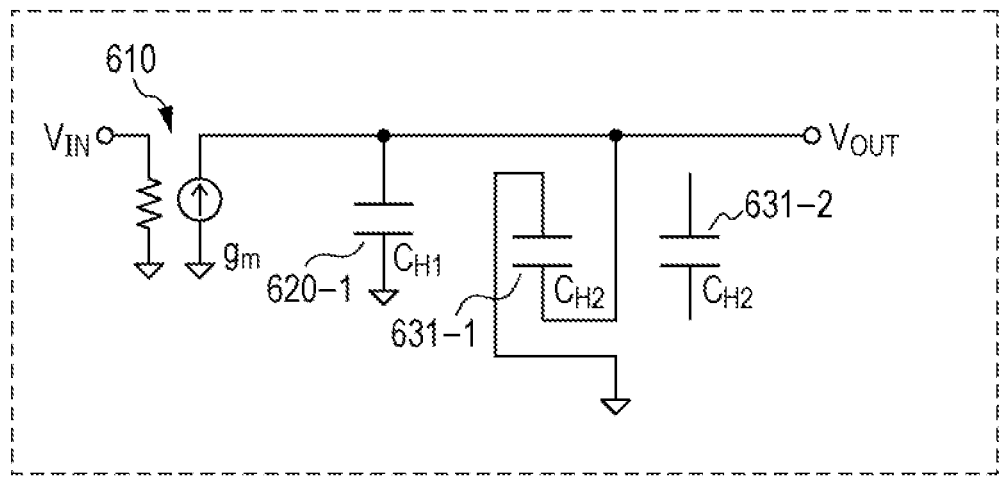
FIG. 18C is a diagram illustrating an outline of an operation in the discrete-time analog circuit.
Figure 18D:
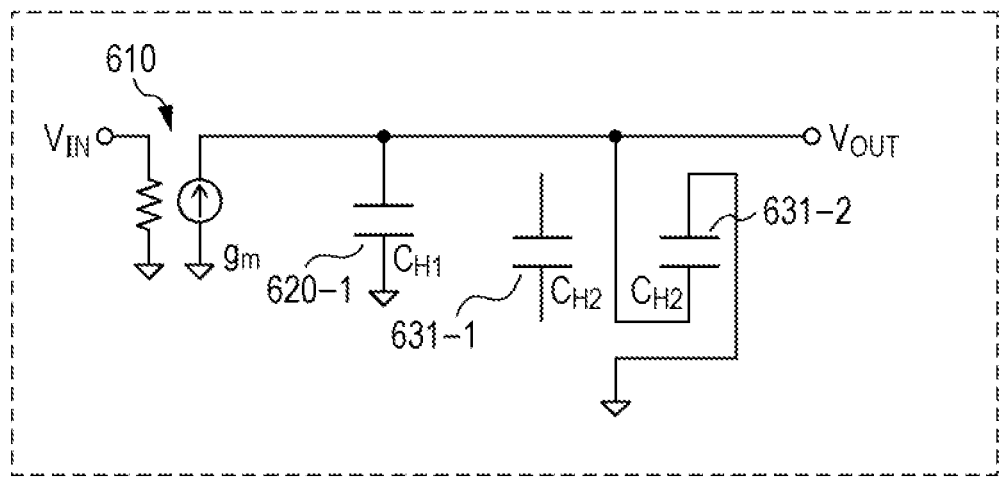
FIG. 18D is a diagram illustrating an outline of an operation in the discrete-time analog circuit.

Next, another configuration of the electric charge inversion circuit 630 is described. FIG. 17C is a diagram illustrating an example of a configuration of an electric charge inversion circuit 630B according to Embodiment 3. FIG. 17D is a diagram illustrating an example of an internal configuration of the electric charge inversion circuit 630B according to Embodiment 3. In FIGS. 17C and 17D, constituent elements that are identical to those in FIGS. 17A and 17B are given identical reference signs, and detailed description thereof is omitted. Clocks S1 to S4 supplied to the electric charge inversion circuit 630B are similar to those supplied to the electric charge inversion circuit 630A described above, and therefore description thereof is omitted.

The electric charge inversion circuit 630B is different from the electric charge inversion circuit 630A in terms of the number of switches and connection positions of capacitors 631-1 and 631-2. The following describes an operation performed in a case where the electric charge inversion circuit 630 in FIG. 16 is the electric charge inversion circuit 630B.

The following four operations are performed within 1 cycle (1 $T_{CK}$) by control (ON and OFF) of switches 632-1 to 632-4 based on the clocks S1 to S4 that are equivalent to the ideal clocks S1 to S4 illustrated in FIG. 4A, and the following four operations are repeated every cycle $T_{CK}$.

First operation: During a high period of the control signal S1, the terminal X1 of the capacitor 631-1 is connected to the terminal A (hereinafter referred to as positive-phase connection of the capacitor 631-1).

Second operation: During a high period of the control signal S2, the terminal X2 of the capacitor 631-2 is connected to the terminal A (hereinafter referred to as positive-phase connection of the capacitor 631-2).

Third operation: During a high period of the control signal S3, the terminal X1 of the capacitor 631-1 is connected to the terminal B (hereinafter referred to as negative-phase connection of the capacitor 631-1).

Fourth operation: During a high period of the control signal S4, the terminal X2 of the capacitor 631-2 is connected to the terminal B (hereinafter referred to as negative-phase connection of the capacitor 631-2).

That is, the four operations, i.e., the first operation in which capacitor 631-1 is positive-phase connected, and an electric charge shared by negative-phase connection of the capacitor 631-2 is retained, the second operation in which the capacitor 631-2 is positive-phase connected, and an electric charge shared by positive-phase connection of the capacitor 631-1 is retained, the third operation in which the capacitor 631-1 is negative-phase connected, and an electric charge shared by positive-phase connection of the capacitor 631-2 is retained, and the fourth operation in which the capacitor 631-2 is negative-phase connected, and an electric charge shared by negative-phase connection of the capacitor 631-1 is retained are performed every interval Ts.

The capacitors 631-1 and 631-2 perform an operation of inverting polarities of a retained electric charge and establishing connection by negative-phase connection (positive-phase connection) of an electric charge shared by positive-phase connection (negative-phase connection).

That is, through the first to fourth operations, the electric charge inversion circuit 630B alternately perform, every Ts period, an operation (the first operation and the third operation) in which the capacitor 631-1 is connected by inverting polarities of an electric charge retained by the capacitor 631-1 and connection of the capacitor 631-2 is released and an electric charge is retained and an operation (the second operation and the fourth operation) in which the capacitor 631-2 is connected by inverting polarities of an electric charge retained by the capacitor 631-2 and connection of the capacitor 631-1 is released and an electric charge is retained.

Note that mathematical description and frequency characteristics in a case where the electric charge inversion circuit 630 in FIG. 16 is the electric charge inversion circuit 630B are similar to those in the case where the electric charge inversion circuit 630 in FIG. 16 is the electric charge inversion circuit 630A.

Even in the configuration of FIGS. 17C and 17D, a passband can have ripple, and broadband filter characteristics can be achieved.

Example 3 of Configuration of Electric Charge Inversion Circuit

Figure 20A:
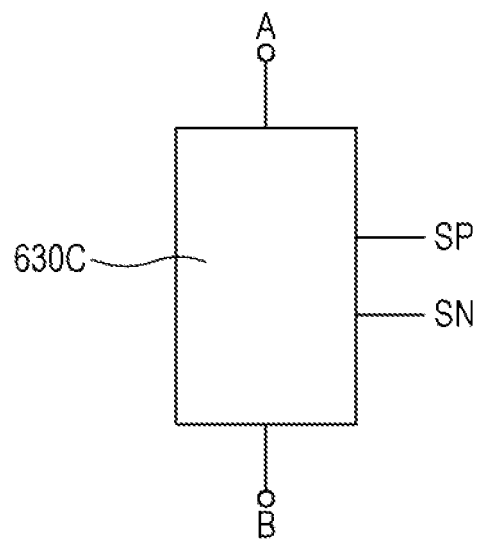
FIG. 20A is a diagram illustrating an example of a configuration of the electric charge inversion circuit according to Embodiment 3.
Figure 20B:
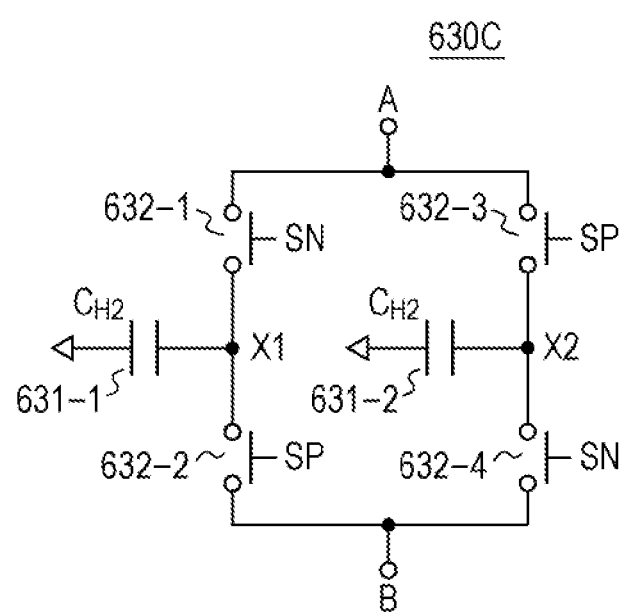
FIG. 20B is a diagram illustrating an example of an internal configuration of the electric charge inversion circuit according to Embodiment 3.

Next, a still another configuration of the electric charge inversion circuit 630 is described. FIG. 20A is a diagram illustrating an example of a configuration of an electric charge inversion circuit 630C according to Embodiment 3. FIG. 20B is a diagram illustrating an example of an internal configuration of the electric charge inversion circuit 630C according to Embodiment 3. In FIGS. 20A and 20B, constituent elements that are identical to those in FIGS. 17C and 17D are given identical reference signs, and detailed description thereof is omitted.

The circuit configuration of the electric charge inversion circuit 630C is identical to that of the electric charge inversion circuit 630B. However, clocks SP and SN that control switches 632-1 to 632-4 are different from those in the case of the electric charge inversion circuit 630B.

In a case where the electric charge inversion circuit 630 in FIG. 16 is the electric charge inversion circuit 630C, clocks supplied from the clock adjusting circuit 650 in FIG. 16 are also different from those in the case of the electric charge inversion circuit 630B.

Specifically, the clocks SP and SN that control the switches 632-1 to 632-4 of the electric charge inversion circuit 630C are ideally clocks like the ones illustrated in FIG. 14A.

The clock adjusting circuit 650 adjusts bias and a phase so that a switch to be controlled is ON during an interval in which the clock in FIG. 14A is high and so that the switch to be controlled is OFF during an interval in which the clock in FIG. 14A is low. For example, the clock generating circuit 640 generates sine-wave signal of two phases, and the clock adjusting circuit 650 adjusts periods in which switches are ON by adjusting the bias and phases.

An outline of a transfer function $H_H$ of the discrete-time analog circuit 600 in a case where the electric charge inversion circuit 630 in FIG. 16 is the electric charge inversion circuit 630C is expressed by the following formula:

$$H_H = \frac{\frac{1}{C_{H1}+C_{H2}}}{1 - \frac{C_{H1}}{C_{H1}+C_{H2}}z^{-1} + \frac{C_{H2}}{C_{H1}+C_{H2}}z^{-1}} \quad (3)$$

As indicated by the formula (3), the electric charge inversion circuit 630C can realize a first-order transfer function. The frequency characteristics can have ripple by adjusting $C_{H1}$, $C_{H2}$, and fs. Note that a similar operation is possible even in a configuration in which the capacitor 620 (capacitance value $C_{H1}$) is omitted.

Figure 21A:
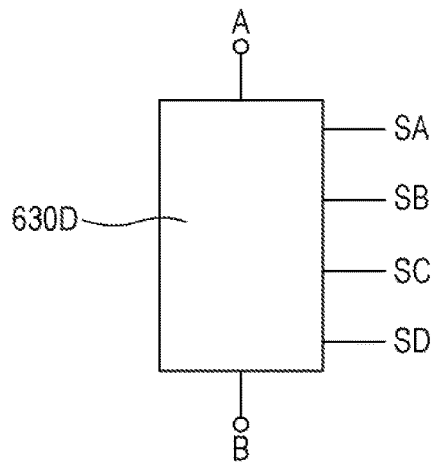
FIG. 21A is a diagram illustrating another example of the configuration of the electric charge inversion circuit according to Embodiment 3.
Figure 21B:
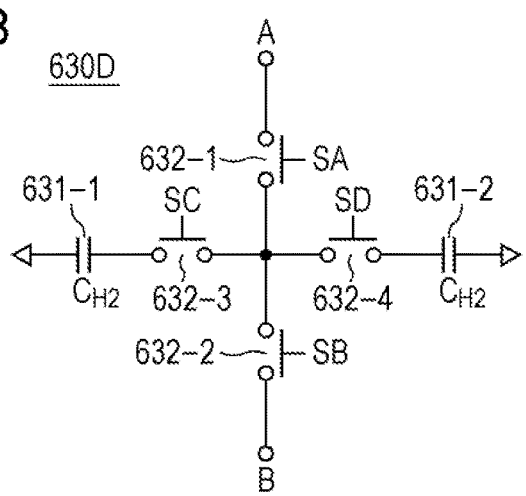
FIG. 21B is a diagram illustrating another example of an internal configuration of the electric charge inversion circuit according to Embodiment 3.
Figure 21C:
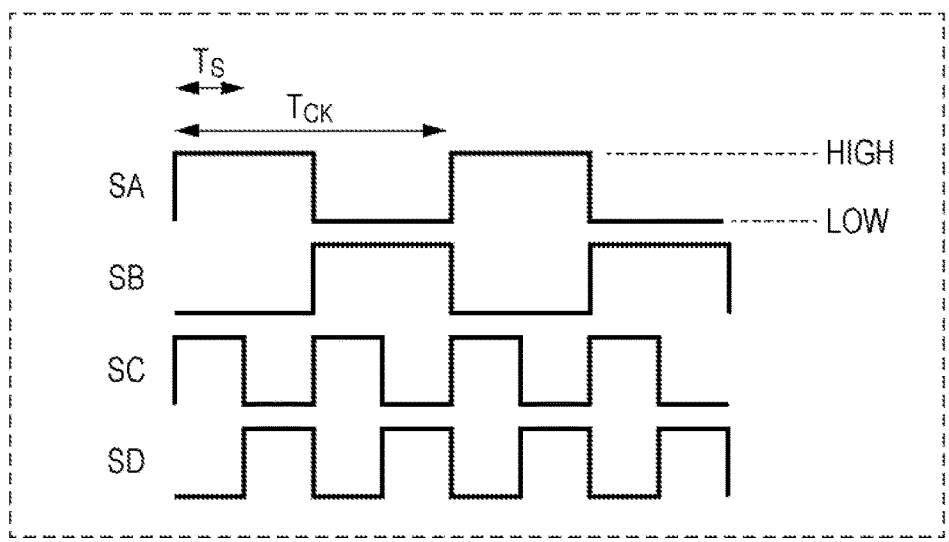
FIG. 21C is a diagram illustrating an example of clocks for operating the electric charge inversion circuit illustrated in FIG. 21B.

An operation similar to FIG. 17D can also be performed by using another configuration. FIG. 21A is a diagram illustrating another example of a configuration of an electric charge inversion circuit 630D according to Embodiment 3. FIG. 21B is a diagram illustrating another example of an internal configuration of the electric charge inversion circuit 630D according to Embodiment 3. FIG. 21C is a diagram illustrating an example of clocks for operating the electric charge inversion circuit 630D illustrated in FIG. 21B.

The electric charge inversion circuit 630D illustrated in FIG. 21B performs an operation similar to FIG. 17D by using the clocks illustrated in FIG. 21C.

Effects

As described above, according to the present embodiment, a filter that has broadband pass characteristics illustrated in FIG. 19 and in which in-band deviation can be adjusted can be realized by controlling a ratio of $C_{H1}$ and $C_{H2}$ in the configuration illustrated in FIGS. 16 and 17A to 17D, specifically, the TA 610 which is a voltage-to-current converting circuit, capacitors (the capacitors 620-1 and 620-2 and the capacitors 631-1 and 631-2), switches, and four types of clocks (S1 to S4).

That is, although the influence of parasitic capacitance of switches is large in a case where broadband pass characteristics (e.g., higher than several GHz) are realized, according to the present disclosure, in which the number of switches is small, the discrete-time analog circuit 600 can be realized while keeping parasitic capacitance low. Furthermore, the discrete-time analog circuit 600 can also function as an equalizer since in-band deviation can be adjusted, and therefore in-band deviation including frequency characteristics of other circuit blocks can be reduced. Furthermore, the discrete-time analog circuit 600 can also be used as a variable gain amplifier (VGA) since gain can be adjusted by adjusting values of $g_m$, $C_{H1}$, and $C_{H2}$. The gain may be increased by connecting an amplifier to the input of the TA 610.

Note that in a case where the capacitors 620-1 and 620-2 (capacitance value $C_{H1}$) and the capacitors 631-1 and 631-2 (capacitance value $C_{H2}$) of the discrete-time analog circuit 600 are variable capacitors, the characteristics can be easily changed. It is therefore possible to adaptively change the characteristics in accordance with a communication environment (e.g., a change in ambient temperature or power-supply voltage) or the influence of a variation of circuit elements.

To configure the variable capacitors, methods such as a method of controlling the number of capacitors connected by using switches or a method of changing capacitance values by controlling values of voltages applied to varactor capacitors by using the voltages. The same applies to the subsequent embodiments. That is, in a conventional discrete-time analog circuit, the number of switches increases in accordance with an increase in the number of capacitors that constitute variable capacitors, and as a result, the total amount of parasitic capacitance increases, whereas in the present disclosure, the number of capacitors is smaller and therefore the total number of switches is smaller than those in the conventional discrete-time analog circuit, and as a result, the total amount of parasitic capacitance is smaller than that in the conventional configuration.

The switches 632-1 to 632-8 may be realized by transistors. As a general configuration of the transistors, a configuration using NMOS transistors, a configuration using PMOS transistors, and a configuration of complementary switches using NMOS and PMOS are known in a case where the transistors are manufactured by a fine CMOS process.

Note that the output terminals $T\_V_{out1}$ and $T\_V_{out2}$ may be monitored by connecting a buffer or an amplifier such as a VCVS (Voltage-Controlled Voltage Source) that minimizes movement of a retained electric charge.

The discrete-time analog circuit 600 may be configured not to include the capacitors 620 (capacitance value $C_{H1}$). According to the configuration, a second-order IIR transfer function ($C_{H1}$=0 in the formula (4)) can be realized in a case where the electric charge inversion circuit 630A or 630B is used. Note that effects similar to those described above can also be produced in the other embodiments.

In the present embodiment, the capacitors 620-1 and 620-2 are connected to the positive-phase output terminal $T\_TA_{out1}$ and the negative-phase output terminal $T\_TA_{out2}$ of the TA 610, respectively, but a single capacitor may be connected between the positive-phase output terminal $T\_TA_{out1}$ and the negative-phase output terminal $T\_TA_{out2}$ of the TA 610. Two capacitors connected to the positive-phase output terminal $T\_TA_{out1}$ and the negative-phase output terminal $T\_TA_{out2}$ of the TA 610, respectively, have basically the same value, but may have different values in order to achieve greater flexibility of the characteristics.

Realization of Higher-Order Transfer Function

A higher-order transfer function can be realized in a denominator of an IIR portion (hereinafter referred to as an IIR function) of a transfer function of a discrete-time analog circuit by prolonging a period in which an electric charge inversion circuit retains an electric charge. In the present embodiment described above, positive/negative of a coefficient of each term of the IIR function can be changed by changing the configuration of the electric charge inversion circuit. In the present embodiment described above, the number of terms of the IIR function can be changed by changing the number of electric charge inversion circuits. The following describes an example of these variations.

Configuration of Discrete-Time Analog Circuit 700

Figure 22:
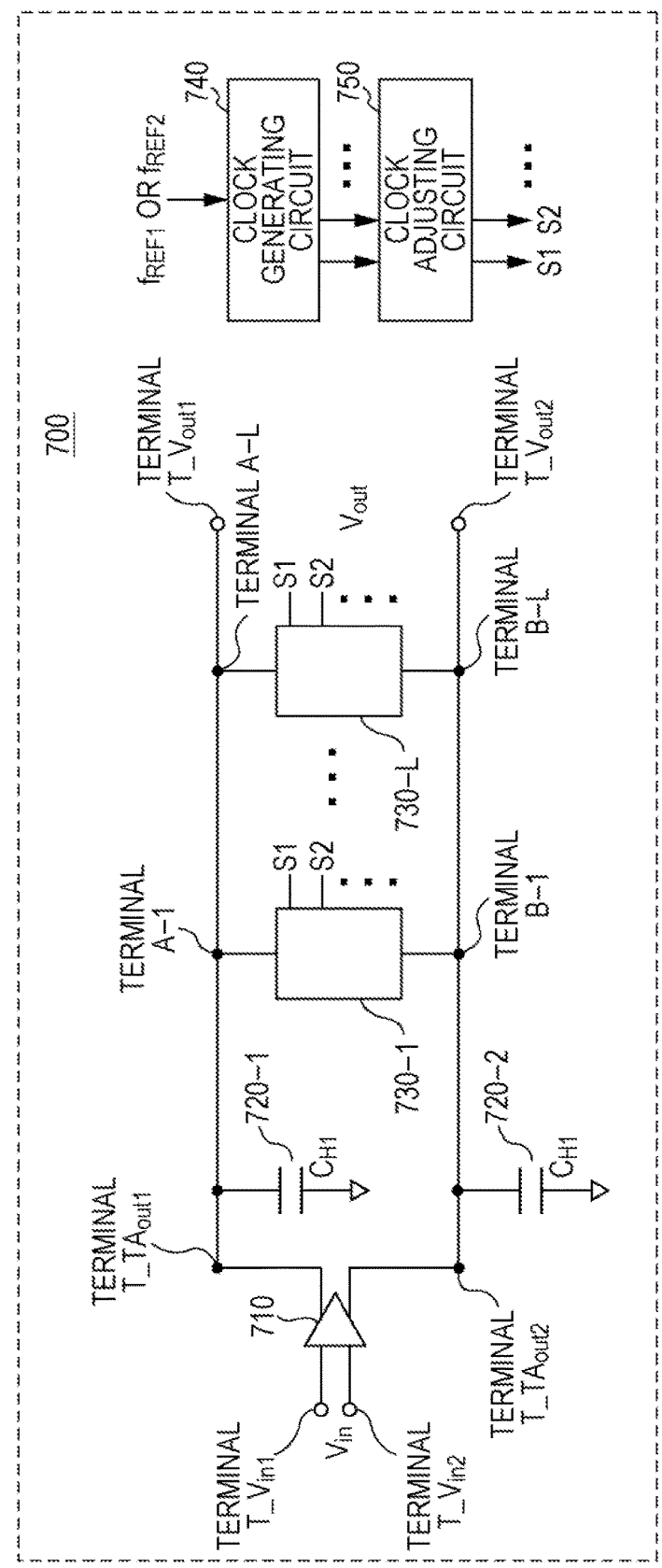
FIG. 22 is a diagram illustrating an example of a configuration of the discrete-time analog circuit according to Embodiment 3.

FIG. 22 is a diagram illustrating an example of a configuration of a discrete-time analog circuit 700 according to Embodiment 3. The discrete-time analog circuit 700 includes a TA 710, two capacitors 720 (capacitors 720-1 and 720-2), L electric charge circuits 730 (electric charge circuits 730-1 to 730-L), a clock generating circuit 740, and a clock adjusting circuit 750.

Note that the discrete-time analog circuit 700 may be configured not to include the capacitors 720. In the configuration illustrated in FIG. 22, the discrete-time analog circuit 700 includes the capacitors 720. Therefore, the IIR function of the discrete-time analog circuit 700 has, for example, a first-order term having a negative coefficient attributable to the capacitors 720. Meanwhile, in a case where the capacitors 720 are omitted, positive/negative of the coefficient of the first-order term of the IIR function can be selected by the L electric charge circuits 730.

The TA 710 and the capacitors 720 illustrated in FIG. 22 are similar to the TA 610 and the capacitors 620 illustrated in FIG. 16, respectively.

Terminals A-1 to A-L of the L electric charge circuits 730-1 to 730-L are connected to an output terminal T_TA$_{out1}$ of the TA 710, and terminals B-1 to B-L of the L electric charge circuits 730-1 to 730-L are connected to an output terminal T_TA$_{out2}$.

Depending on desired frequency characteristics, each of the electric charge circuits 730 has a configuration of an electric charge inversion circuit that performs an operation of establishing connection without inverting polarities of an electric charge after retaining the electric charge or a configuration of an electric charge retention connection circuit that performs an operation of establishing connection by inverting polarities of an electric charge after retaining the electric charge. Note that the discrete-time analog circuit 700 may include, as the electric charge circuits 730, both electric charge retention connection circuits and electric charge inversion circuits or may include, as the electric charge circuits 730, either electric charge retention connection circuits or electric charge inversion circuits.

The following describes a configuration in which the electric charge circuits 730 are electric charge inversion circuits.

Figure 23A:
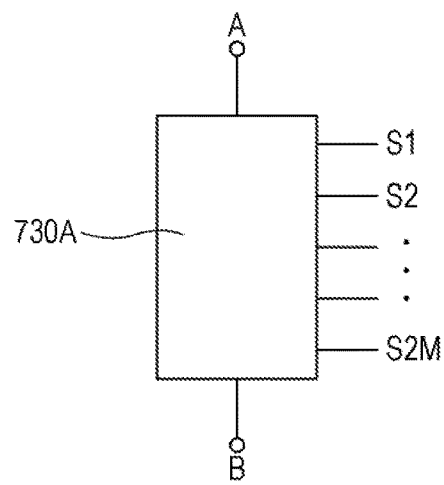
FIG. 23A is a diagram illustrating an example of a configuration of the electric charge inversion circuit according to Embodiment 3.
Figure 23B:
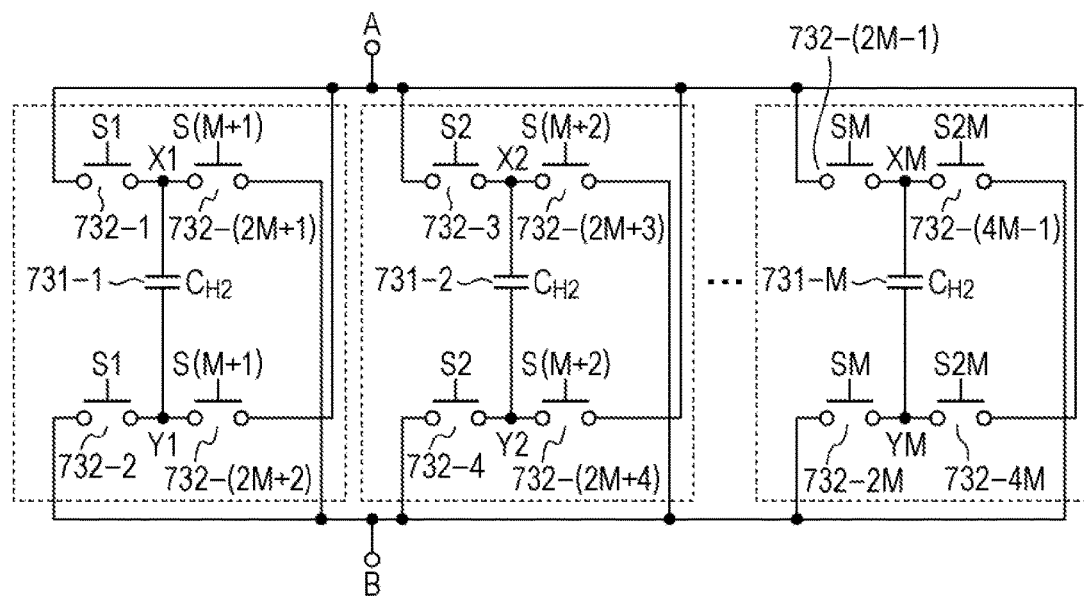
FIG. 23B is a diagram illustrating an example of an internal configuration of the electric charge inversion circuit according to Embodiment 3.

FIG. 23A is a diagram illustrating an example of a configuration of an electric charge inversion circuit 730A according to Embodiment 3. FIG. 23B is a diagram illustrating an example of an internal configuration of the electric charge inversion circuit 730A according to Embodiment 3. The electric charge inversion circuit 730A illustrated in FIG. 29B includes M capacitors 731-1 to 731-M and 4M switches 732-1 to 732-4M that control connection of the M capacitors 731-1 to 731-M. The configuration of the electric charge inversion circuit 730A is one obtained by extending the configuration of the electric charge inversion circuit 630A described above, and therefore detailed description thereof is omitted.

Figure 24A:
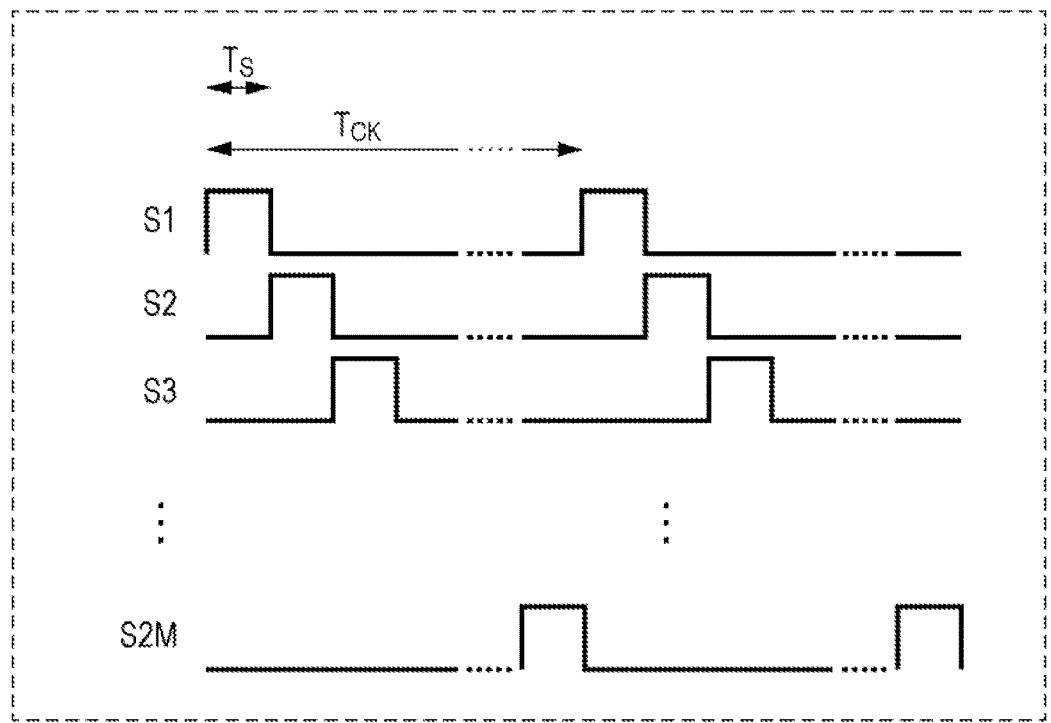
FIG. 24A is a timing diagram of ideal clocks for the electric charge inversion circuit illustrated in FIG. 23B.

Clocks generated by the clock generating circuit 740 and the clock adjusting circuit 750 in a case where the configuration of the electric charge inversion circuit 730A illustrated in FIG. 23B is employed are described below. FIG. 24A is a timing diagram of ideal clocks for the electric charge inversion circuit 730A illustrated in FIG. 23B. The clocks have a pulse width Ts and a cycle T$_{CK}$. The pulse width Ts is identical to a sample interval. Although FIG. 24A illustrates rectangular signals as ideal clocks, the clock generating circuit 740 and the clock adjusting circuit 750 performs adjustment so that a switch to be controlled is ON during a high period of an ideal clock and so that the switch to be controlled is OFF during a low period of the ideal clock.

Specifically, the clock generating circuit 740 and the clock adjusting circuit 750 supply, to the electric charge inversion circuit 730A illustrated in FIG. 23B, clock S1 to S2M of 2M phases whose duty ratios in switches (=ON periods T$_{ON}$ of the switches/cycles T$_{CK}$ of the clocks) are ½M and whose phases are shifted by (360/2M) degrees.

An operation of the electric charge inversion circuit 730A using the clocks S1 to S2M is similar to that of the electric charge inversion circuit 630A having two capacitors described in Embodiment 1, and therefore detailed description thereof is omitted.

The M capacitors of the electric charge inversion circuit 730A alternately repeats an operation of retaining a shared electric charge during a (M−1)Ts period and an operation of establishing connection to an outside by inverting polarities of the retained electric charge.

That is, the electric charge inversion circuit 730A establishes connection by inverting polarities of a retained electric charge of M samples before in electric charge sharing of the discrete-time analog circuit 700.

In a case where the electric charge inversion circuit 730A illustrated in FIG. 23B is connected as any of the electric charge inversion circuits 730-1 to 730-L illustrated in FIG. 22, the IIR function of the discrete-time analog circuit 700 illustrated in FIG. 22 has an M-order term having a positive coefficient.

Next, a configuration in which the electric charge circuit 730 is used as an electric charge retention connection circuit is described.

Figure 23C:
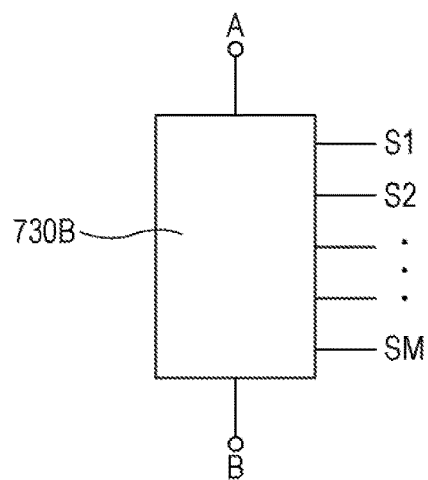
FIG. 23C is a diagram illustrating an example of a configuration of the electric charge retention connection circuit according to Embodiment 3.
Figure 23D:
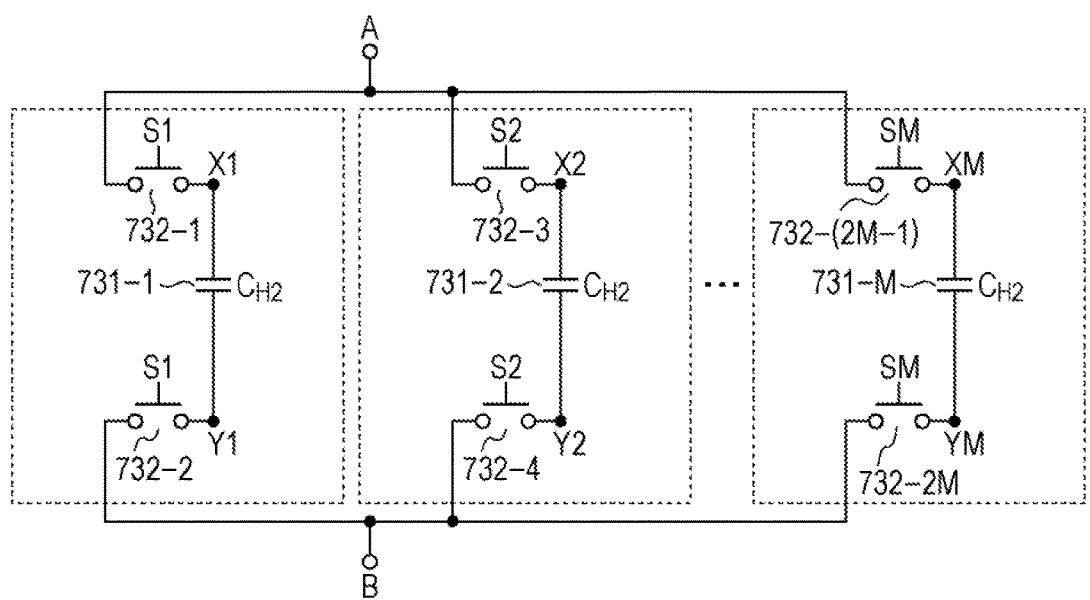
FIG. 23D is a diagram illustrating an example of an internal configuration of the electric charge retention connection circuit according to Embodiment 3.

FIG. 23C is a diagram illustrating an example of a configuration of an electric charge retention connection circuit 730B according to Embodiment 3. FIG. 23D is a diagram illustrating an example of an internal configuration of the electric charge retention connection circuit 730B according to Embodiment 3. The electric charge retention connection circuit 730B illustrated in FIG. 23D includes terminals A and B, M capacitors 731-1 to 731-M, and 2M switches 732-1 to 732-2M that control connection of the M capacitors 731-1 to 731-M.

A configuration and an operation of the electric charge retention connection circuit 730B illustrated in FIG. 23D are described by taking the capacitor 731-1 as an example.

The capacitor 731-1 has a terminal X1 and a terminal Y1 that are connected to the switches 732-1 and 732-2, respectively. The switch 732-1 connects the terminal X1 and the terminal A during a high period of the clock S1 and cuts connection between the terminal X1 and the terminal A during a low period of the clock S1. The switch 732-2 connects the terminal Y1 and the terminal B during a high period of the clock S1 and cuts connection between the terminal Y1 and the terminal B during a low period of the clock S1.

The same applies to the capacitors 732-2 to 732-M. Note, however, that connection of the capacitors is controlled by clocks whose phases are shifted by (360/M) degrees from each other.

Figure 24B:
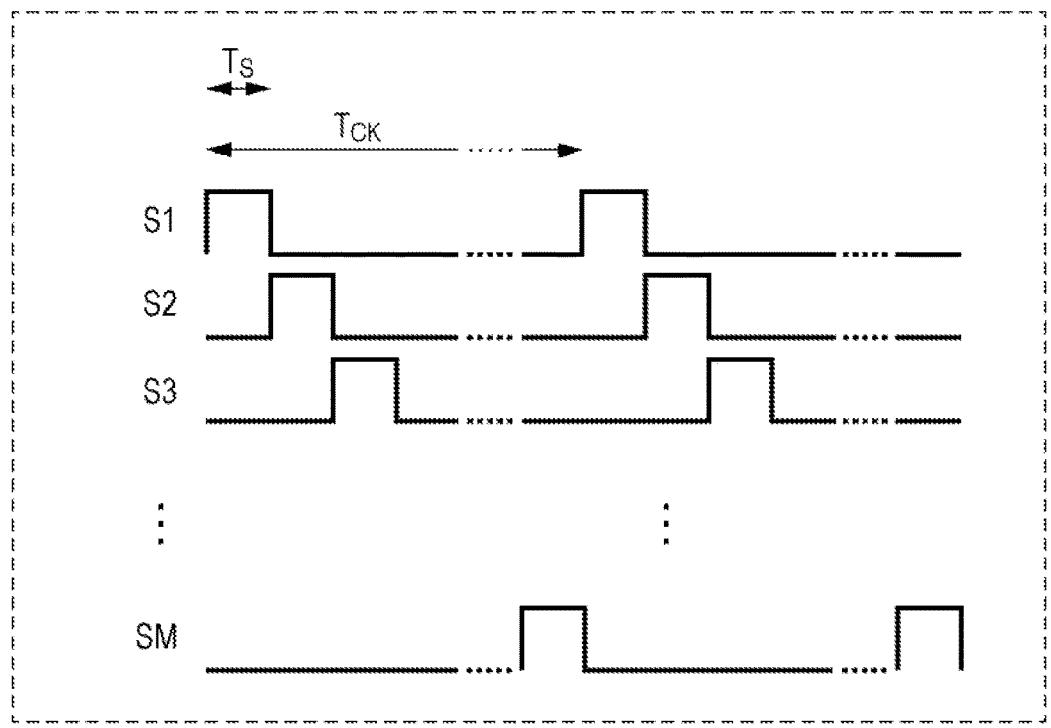
FIG. 24B is a timing diagram of ideal clocks for the electric charge retention connection circuit illustrated in FIG. 23D.

FIG. 24B is a timing chart of ideal clocks for the electric charge retention connection circuit 730B illustrated in FIG. 23D. The clocks have a pulse width Ts and a cycle T$_{CK}$. The pulse width Ts is identical to a sample interval. Although FIG. 24B illustrates rectangular signals as ideal clocks, the clock generating circuit 740 and the clock adjusting circuit 750 perform adjustment so that a switch to be controlled is ON during a high period of an ideal clock and so that the switch to be controlled is OFF during a low period of the ideal clock.

As illustrated in FIG. 24B, the clock generating circuit 740 and the clock adjusting circuit 750 supply, to the electric charge retention connection circuit 730B illustrated in FIG. 23D, clocks S1 to SM of M phases whose duty ratios in switches (=ON periods T$_{ON}$ of the switches/cycles T$_{CK}$ of the clocks) are 1/M and whose phases are shifted by (360/M) degrees.

The M capacitors of the electric charge retention connection circuit 730B illustrated in FIG. 23D alternately repeat an operation of retaining a shared electric charge during a (M−1)Ts period and an operation of establishing connection to an outside without inverting polarities of the retained electric charge by using the clocks illustrated in FIG. 24B.

That is, the electric charge retention connection circuit 730B illustrated in FIG. 23D establishes connection without inverting polarities of a retained electric charge M samples before in electric charge sharing of the discrete-time analog circuit 700.

In a case where the electric charge retention connection circuit 730B illustrated in FIG. 23D is connected as any of the electric charge circuits 730-1 to 730-L illustrated in FIG. 22, the IIR function of the discrete-time analog circuit 700 illustrated in FIG. 22 has an M-order term having a negative coefficient.

Note that the capacitors 720 are equivalent to the electric charge retention connection circuit 730B in which M=1.

By connecting the electric charge inversion circuit 730A illustrated in FIG. 23B or the electric charge retention connection circuit 730B illustrated in FIG. 23D as the electric charge circuits 730-1 to 730-L illustrated in FIG. 22, the number of terms, positive/negative of coefficients, and the order of IIR function of the discrete-time analog circuit 700 illustrated in FIG. 22 can be freely designed as indicated by the following formula (4):

$$H_{H\_M} = \cfrac{\cfrac{1}{C_{H1}+C_{H2}}}{1 \pm \cfrac{C_{H1}}{C_{H1}+C_{H2}}z^{-1} \pm \ldots \pm \cfrac{C_{H2}}{C_{H1}+C_{H2}}z^{-M} \pm \ldots \pm \cfrac{C_{H2}}{C_{H1}+C_{H2}}z^{-M'}} \quad (4)$$

That is, it is possible to increase flexibility of filter characteristics that can be realized by combining the electric charge inversion circuit 730A illustrated in FIG. 23B and the electric charge retention connection circuit 730B illustrated in FIG. 23D and by changing the respective orders.

Figure 25A:
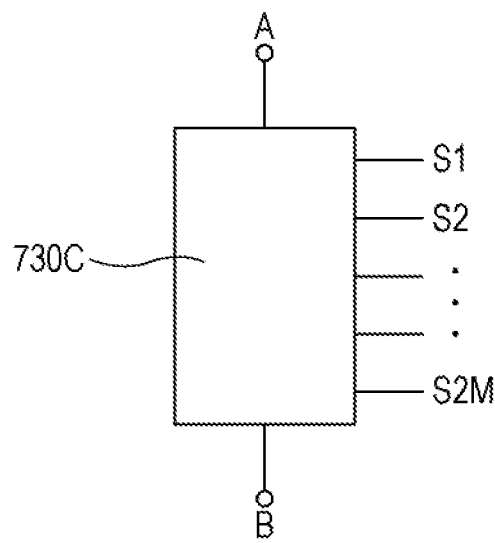
FIG. 25A is a diagram illustrating an example of a configuration of the electric charge inversion circuit according to Embodiment 3.
Figure 25B:
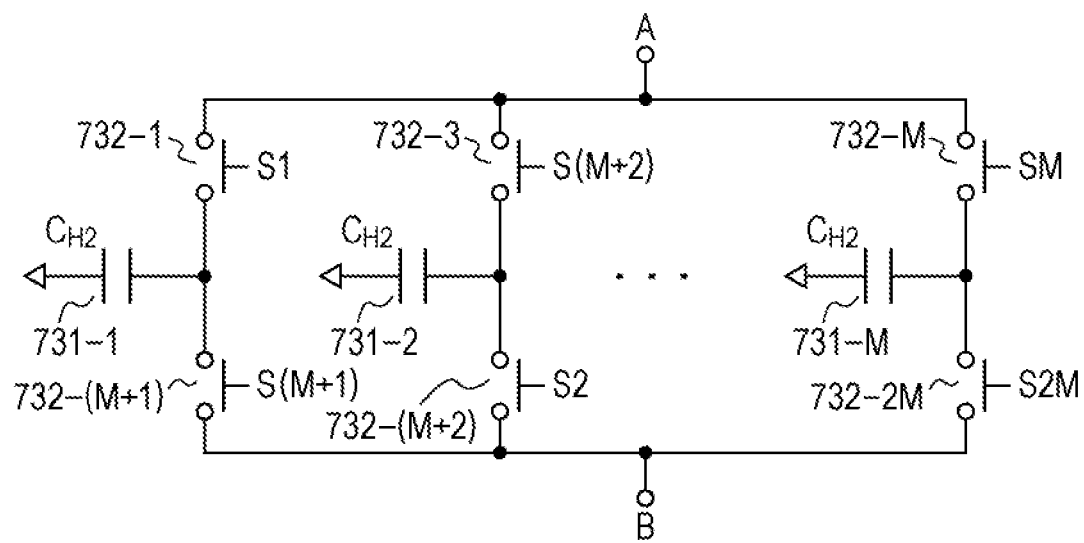
FIG. 25B is a diagram illustrating an example of an internal configuration of the electric charge inversion circuit according to Embodiment 3.

Next, another example of the configuration of FIGS. 23A and 23B is described. FIG. 25A is a diagram illustrating an example of a configuration of an electric charge inversion circuit 730C according to Embodiment 3. FIG. 25B is a diagram illustrating an example of an internal configuration of the electric charge inversion circuit 730C according to Embodiment 3. In FIGS. 25A and 25B, constituent elements that are identical to those in FIGS. 23A and 23B are given reference signs identical to those in FIGS. 23A and 23B, and detailed description thereof is omitted.

A configuration and an operation of the electric charge inversion circuit 730C are ones obtained by extending the configuration and operation of the electric charge inversion circuit 630B described above in accordance with the number of capacitors, and therefore detailed description thereof is omitted. Even in a case where the configuration of the electric charge inversion circuit 730C is used as the electric charge circuits 730, it is possible to increase flexibility of filter characteristics that can be realized as in the case of the electric charge inversion circuit 730A.

Figure 25C:
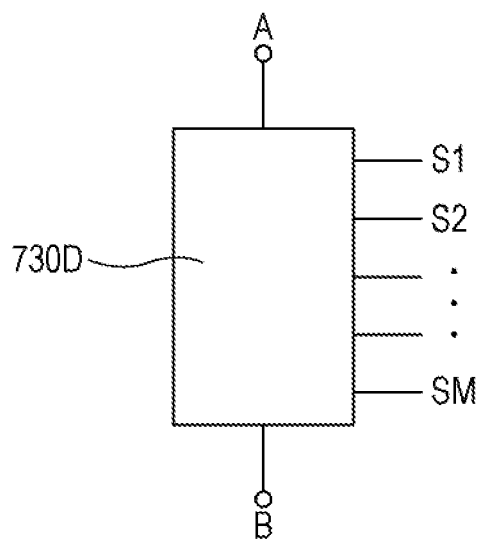
FIG. 25C is a diagram illustrating an example of a configuration of the electric charge retention connection circuit according to Embodiment 3.
Figure 25D:
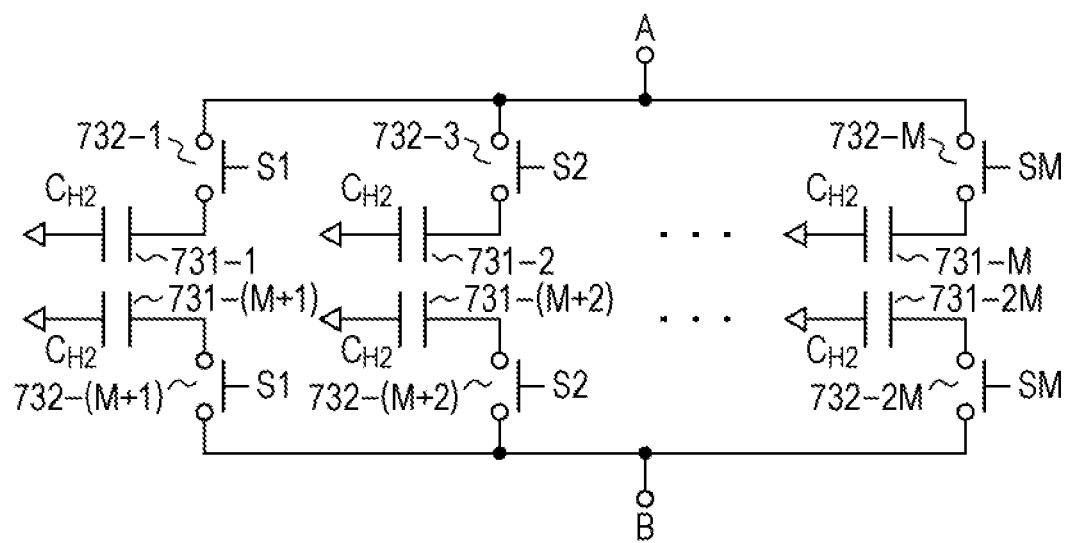
FIG. 25D is a diagram illustrating an example of an internal configuration of the electric charge retention connection circuit according to Embodiment 3.

Next, another example of the configuration of FIGS. 23C and 23D is described. FIG. 25C is a diagram illustrating an example of a configuration of an electric charge retention connection circuit 730D according to Embodiment 3. FIG. 25D is a diagram illustrating an example of an internal configuration of the electric charge retention connection circuit 730D according to Embodiment 3. In FIGS. 25C and 25D, constituent elements that are identical to those in FIGS. 23C and 23D are given reference signs identical to those in FIGS. 23C and 23D, and detailed description thereof is omitted.

The electric charge retention connection circuit 730B illustrated in FIG. 23D includes the M capacitors 731-1 to 731-M each of which is provided between two switches. Meanwhile, the electric charge retention connection circuit 730D illustrated in FIG. 25D includes 2M capacitors 731-1 to 731-2M each having terminals, one of which is connected to a switch, while the other one is grounded.

According to the configuration, the electric charge retention connection circuit 730D performs an operation similar to the electric charge retention connection circuit 730B and can increase flexibility of filter characteristics that can be realized as in the case of the electric charge retention connection circuit 730B.

Configuration and Operation of Multi-Stage Discrete-Time Analog Circuit 800

Figure 26A:
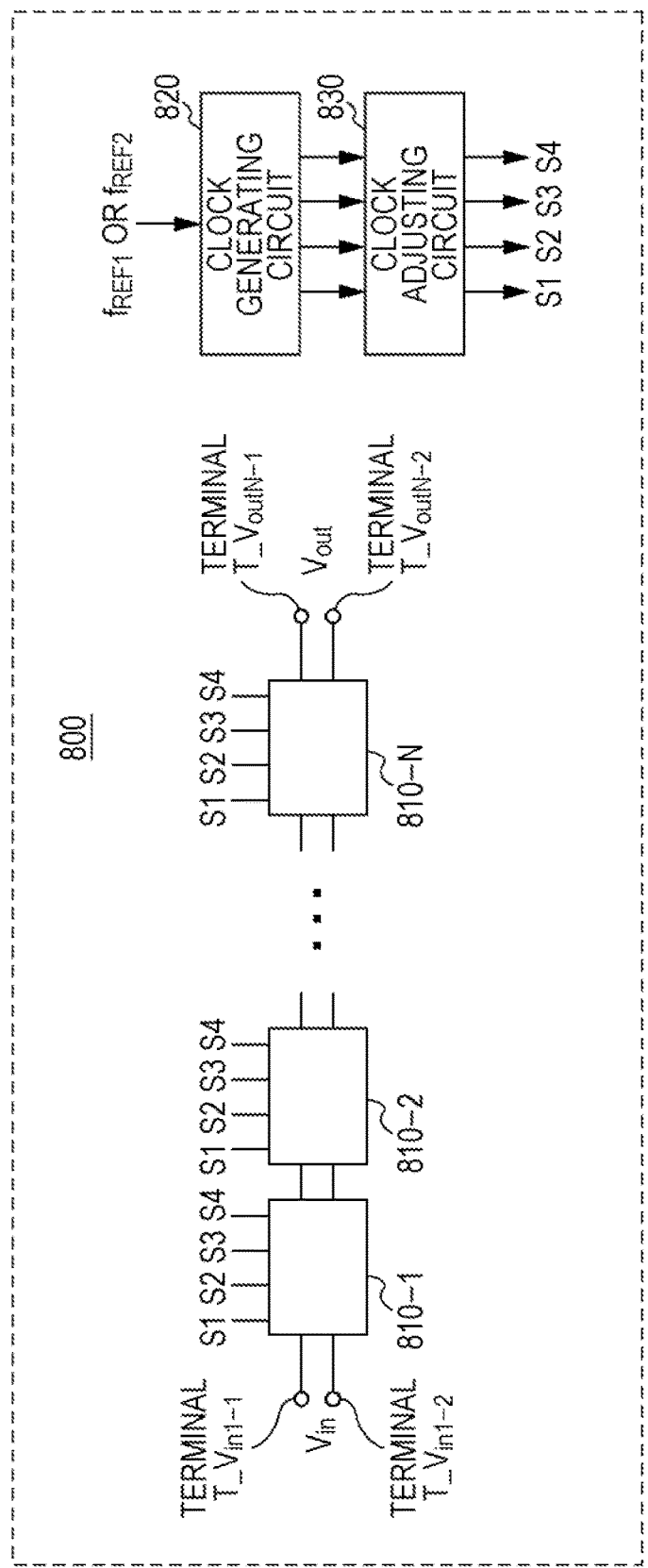
FIG. 26A is a diagram illustrating an example of a configuration of a multi-stage discrete-time analog circuit.

FIG. 26A is a diagram illustrating an example of a configuration of a multi-stage discrete-time analog circuit 800. FIG. 26B is a diagram illustrating an example of an internal configuration of the multi-stage discrete-time analog circuit 800. The multi-stage discrete-time analog circuit 800 illustrated in FIG. 26A includes N discrete-time analog circuits 810 (810-1 to 810-N) that are connected in cascade, a clock generating circuit 820, and a clock adjusting circuit 830.

The discrete-time analog circuit 810 illustrated in FIG. 26B has a configuration similar to the discrete-time analog circuit 600 illustrated in FIG. 16, and a TA 811 and capacitors 812 illustrated in FIG. 26B are similar to the TA 610 and the capacitors 620 illustrated in FIG. 16, respectively.

The configuration of an electric charge inversion circuit 813 illustrated in FIG. 26B is similar to that of the electric charge inversion circuit 630 illustrated in FIGS. 17A to 17D, 20A, and 20B.

The clock generating circuit 820 and the clock adjusting circuit 830 illustrated in FIG. 26B are similar to the clock generating circuit 640 and the clock adjusting circuit 650 illustrated in FIG. 16, and supply signals that control ON/OFF periods of switches and that are similar to the waveforms illustrated in FIGS. 14A and 14B to the N discrete-time analog circuits 810-1 to 810-N.

Since the multi-stage discrete-time analog circuit 800 is configured such that the N discrete-time analog circuits 810 are connected in cascade, the transfer function of the multi-stage discrete-time analog circuit 800 is expressed by the following formula (5):

$$H_{LPF\_N} \prod_{k=1}^{k=N} H_{Hk} \quad (5)$$

$$H_{Hk} = \cfrac{\cfrac{1}{C_{H1k}+C_{H2k}}}{1 - \cfrac{C_{H1k}}{C_{H1k}+C_{H2k}}z^{-1} + \cfrac{C_{H2k}}{C_{H1k}+C_{H2k}}z^{-2}}$$

$$z = e^{j\omega_{in}T_s}$$

where $g_{mk}$, $C_{H1k}$, and $C_{H2k}$ are $g_m$, $C_{H1}$ and $C_{H2}$ of a k-th discrete-time analog circuit 810-$k$ (N is an integer of 1 or more, and k is an integer of 1 to N), and $H_{Hk}$ is the transfer function of the k-th discrete-time analog circuit 810-$k$. The values of $g_{mk}$, $C_{H1}$, and $C_{H2}$ may be appropriately changed in each stage.

The following formula (6) is a result of changing $C_{H1k}$ and $C_{H2k}$ of each stage to the same value in the formula (5):

$$H_{LPF\_N} = H_H{}^N \qquad (6):$$

As indicated by the above formula, the multi-stage discrete-time analog circuit 800 can realize higher-order filter characteristics and realize steeper filter characteristics as the number of stages connected in cascade becomes larger.

Effects

With the above configuration in which discrete-time analog circuits are connected in cascade, it is possible to realize steep filter characteristics. Since the discrete-time analog circuits 810 are small and have a simple configuration, the number of switches and the number of capacitors can be kept small even in a case where the number of stages is increased in order to achieve a higher order. Furthermore, since the multi-stage discrete-time analog circuit 800 has a differential configuration, an even-order component can be removed after differential synthesis.

Note that capacitance values of capacitors of each of the N discrete-time analog circuits 810-1 to 810-N may be identical to each other or may be different from each other.

Note that the configuration of FIG. 16 is employed as the configuration of the discrete-time analog circuits 810 in FIG. 26B, but the configuration of FIG. 22 may be employed as the configuration of the discrete-time analog circuits 810.

Note that Embodiment 3 has discussed a case where a differential configuration is employed, but can also be applied to a single-end configuration.

Note that Embodiment 3 has discussed an example where a periodically time-varying continuous-time circuit is used, but a clock generating circuit and a clock adjusting circuit can also be used in a discrete-time circuit.

Embodiment 4

Next, Embodiment 4 of the present disclosure is described. In the present embodiment, a mixer that operates by low-frequency clocks in Embodiment 2 is applied to a discrete-time receiver.

Discrete-Time Receiver that Operates by Low-Frequency Clocks

FIG. 27 is a block diagram illustrating a configuration of a receiving device 30 according to Embodiment 4. The receiving device 30 illustrated in FIG. 27 includes an antenna 31, a low noise amplifier 32, a reference frequency oscillator 33, a discrete-time analog circuit 34, an A/D conversion processor 35, and a digital reception processor 36.

The receiving device 30 has a configuration obtained by deleting the reception mixer 25 and the LO frequency oscillator 24 from the receiving device 20 illustrated in FIG. 2B. The discrete-time analog circuit 34 of the receiving device 30 has functions of the analog baseband circuit 26 that is a discrete-time analog circuit, the reception mixer 25, and the LO frequency oscillator 24 of the receiving device 20.

The antenna 31, the low noise amplifier 32, the reference frequency oscillator 33, the A/D conversion processor 35, and the digital reception processor 36 of the receiving device 30 are similar to the antenna 21, the low noise amplifier 22, the reference frequency oscillator 23, the A/D conversion processor 27, and the digital reception processor 28 of the receiving device 20, respectively, and therefore description thereof is omitted.

The discrete-time analog circuit 34 performs frequency conversion and filtering of an RF analog reception signal that is output from the low noise amplifier 32.

Note that the receiving device 30 illustrated in FIG. 27 has been described as a direct conversion configuration. The receiving device 30 according to the present embodiment may additionally include one or more mixers and use an intermediate frequency (IF). The discrete-time analog circuit 34 may be used as an RF-IF mixer or an IF-baseband mixer. In a case where a plurality of IFs are used, the discrete-time analog circuit 34 may be used as an IF-IF mixer.

Direct Sampling Mixer with Clock Adjusting Circuit

Figure 28A:
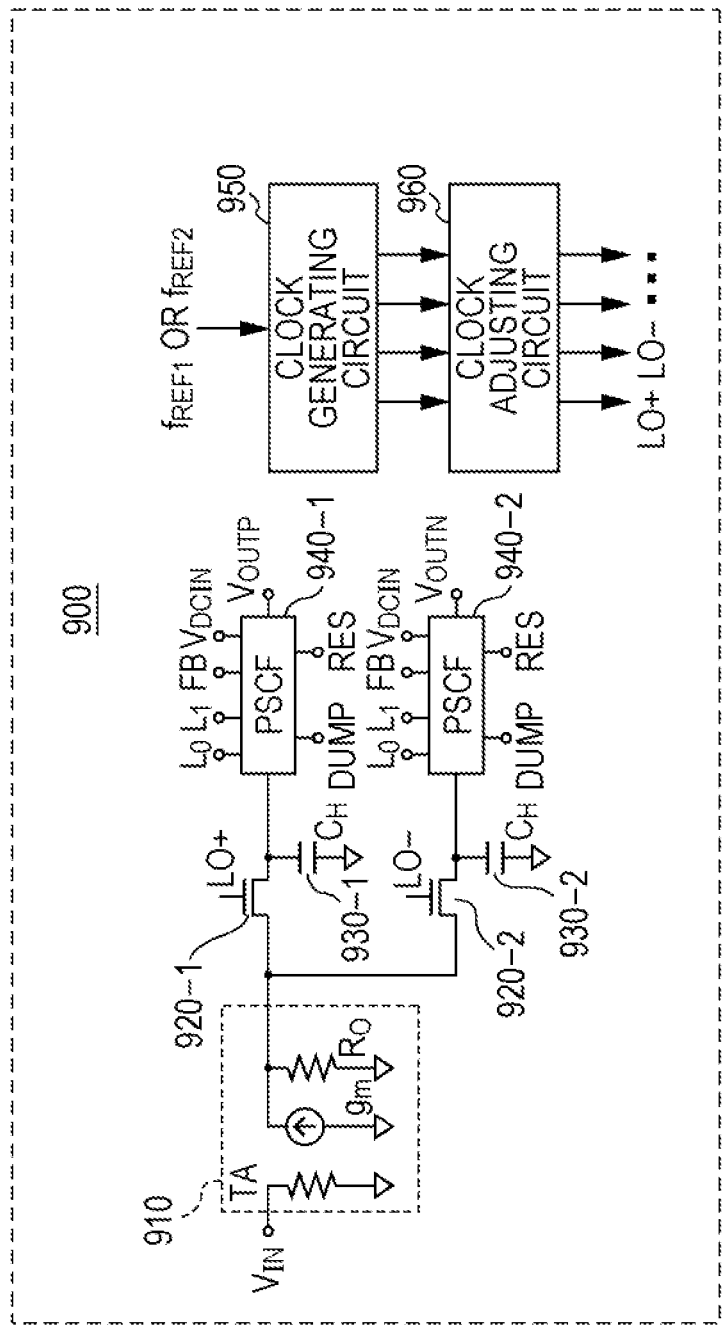
FIG. 28A is a diagram illustrating an example of a configuration of a discrete-time analog circuit according to Embodiment 4.

FIG. 28A is a diagram illustrating an example of a configuration of a discrete-time analog circuit 900 according to Embodiment 4. The discrete-time analog circuit 900 corresponds to the discrete-time analog circuit 34 in FIG. 27.

The discrete-time analog circuit 900 includes a TA 910 that converts a voltage into an electric current, two local switches 920 (920-1 and 920-2) that perform frequency conversion, two history capacitors 930 (930-1 and 930-2), two passive switched capacitor filters (PSCFs) 940 (940-1 and 940-2), a clock generating circuit 950, and a clock adjusting circuit 960.

Figure 28B:
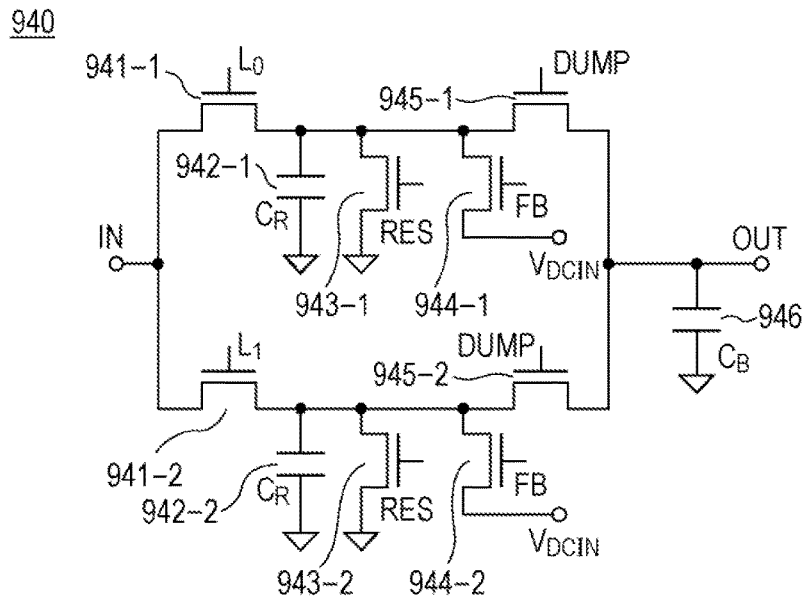
FIG. 28B is a diagram illustrating an example of a configuration of a PSCF according to Embodiment 4.

FIG. 28B is a diagram illustrating an example of a configuration of each of the PSCFs 940 according to Embodiment 4. The PSCF 940 includes electric charge sharing switches 941 (941-1 and 941-2), rotation capacitors 942 (942-1 and 942-2), reset switches 943 (943-1 and 943-2), feedback switches 944 (944-1 and 944-2), dump switches 945 (945-1 and 945-2), and a buffer capacitor 946.

Figure 28C:
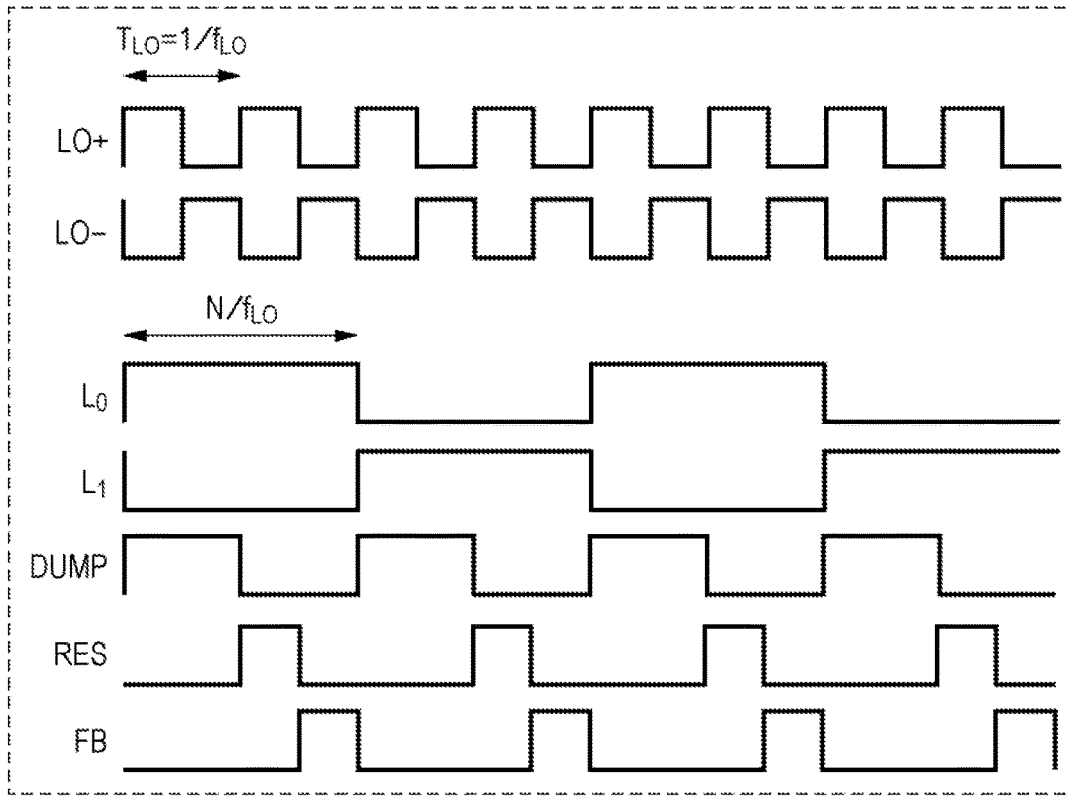
FIG. 28C is a timing diagram of ideal clocks for the discrete-time analog circuit illustrated in FIG. 28A.

FIG. 28C is a timing chart of ideal clocks for the discrete-time analog circuit 900 illustrated in FIG. 28A. Although FIG. 28C illustrates rectangular signals as ideal clocks, the clock generating circuit 950 and the clock adjusting circuit 960 perform adjustment so that a switch to be controlled is ON during a high period of an ideal clock and so that the switch to be controlled is OFF during a low period of the ideal clock.

An operation of the discrete-time analog circuit 900 to which clocks equivalent to the ideal clocks illustrated in FIG. 28C are supplied is described below.

First, the TA 910 converts an input voltage into an electric current. The history capacitors 930 and the rotation capacitors 942 accumulate the input electric charge while the local switches 920 and the electric charge sharing switches 941 are ON. Next, the rotation capacitors 942 and the buffer capacitors 946 perform electric charge sharing while the local switches 920 are OFF and the dump switches 945 are ON, and the electric potential of the buffer capacitor 946 is output.

Next, the rotation capacitors 942 discharge the accumulated electric charge via the reset switches 943 while the reset switches 943 are ON. Finally, a bias electric potential is applied to the rotation capacitors 942 via the feedback switches 944 while the feedback switches 944 are ON.

The discrete-time analog circuit 900 performs frequency conversion and filtering by repeating this operation.

Next, a configuration in which an operation similar to the aforementioned operation of the discrete-time analog circuit 900 is realized by low-frequency clocks is described.

Direct Sampling Mixer that Operates by Low-Frequency Clocks

Figure 29A:
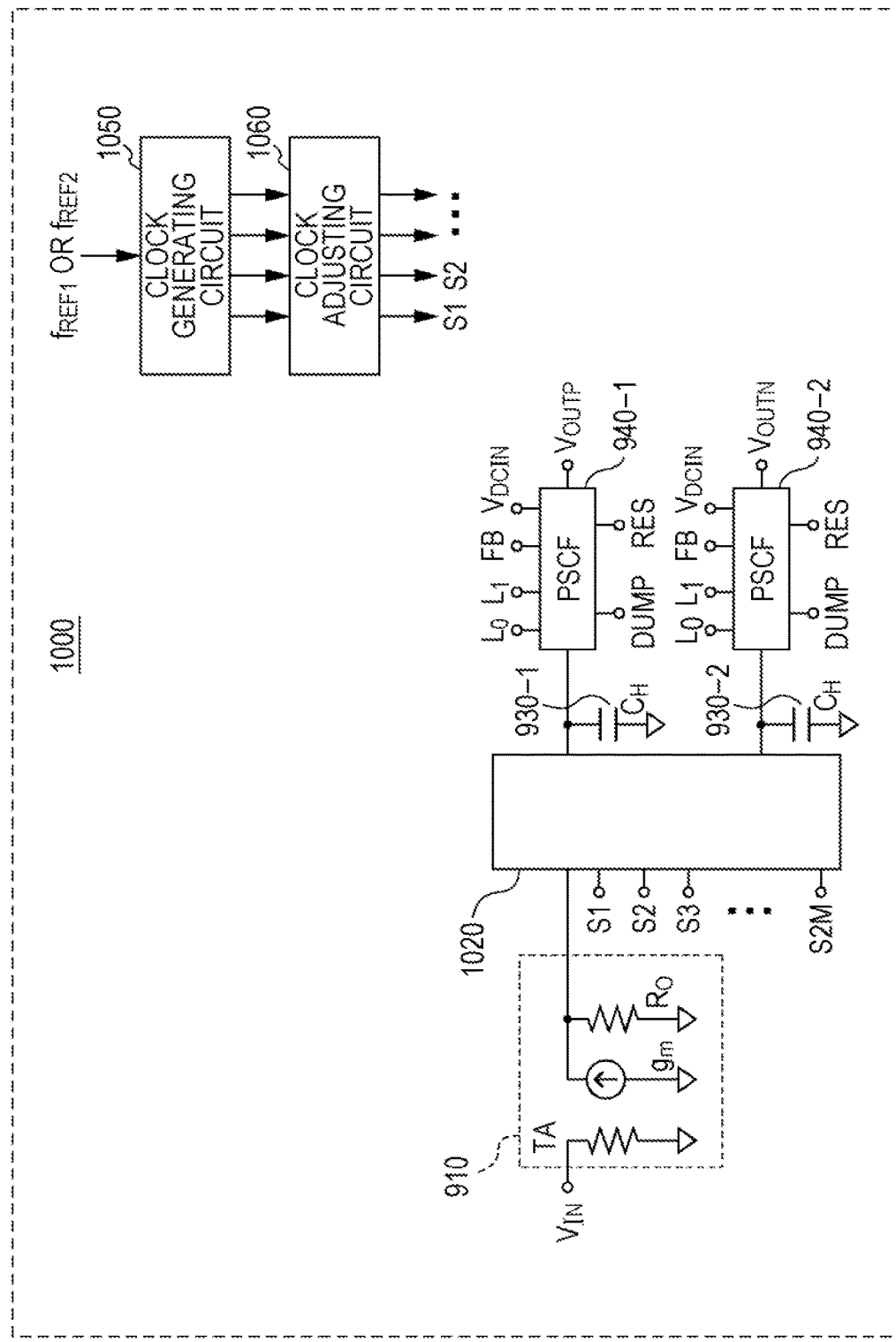
FIG. 29A is a diagram illustrating an example of a configuration of the discrete-time analog circuit according to Embodiment 4.

FIG. 29A is a diagram illustrating an example of a configuration of a discrete-time analog circuit 1000 according to Embodiment 4. In FIG. 29A, constituent elements that are identical to those in FIG. 28A are given reference numerals identical to those in FIG. 28A, and detailed description thereof is omitted.

The discrete-time analog circuit 1000 in FIG. 29A has a configuration obtained by replacing the local switches 920, the clock generating circuit 950, and the clock adjusting circuit 960 in the discrete-time analog circuit 900 in FIG. 28A with a local switch unit 1020, a clock generating circuit 1050, and a clock adjusting circuit 1060, respectively.

The local switch unit 1020 has the configuration of the mixer 500 that operates by low-frequency clocks illustrated in FIG. 13C. The clock adjusting circuit 960 in FIG. 28A supplies clocks LO+ and LO− to the local switches 920, but the clock adjusting circuit 1060 in FIG. 29A supplies clocks S1 to S(2M) to the local switch unit 1020.

Figure 29B:
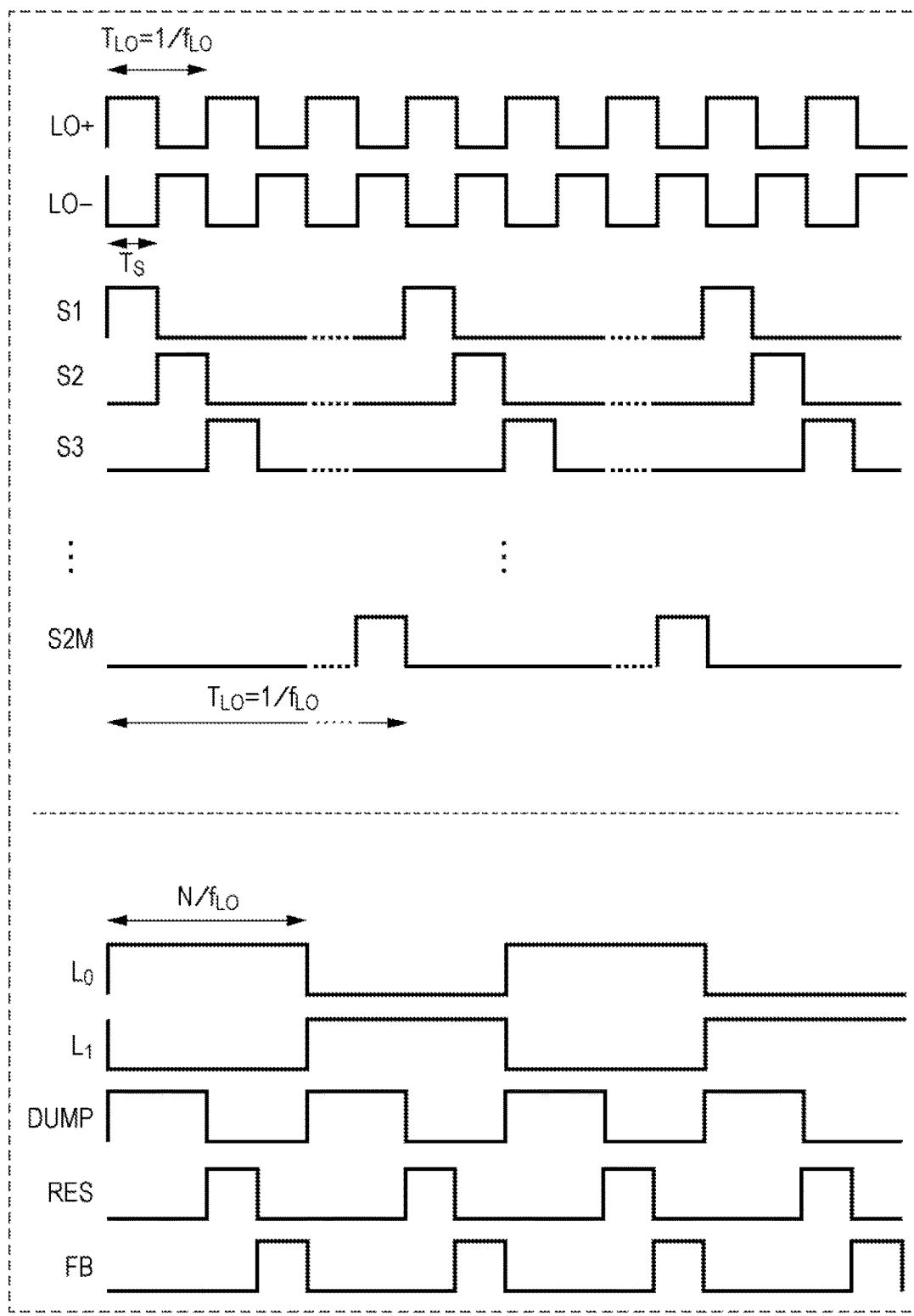
FIG. 29B is a timing diagram of ideal clocks for the discrete-time analog circuit illustrated in FIG. 29A.

FIG. 29B is a timing chart of ideal clocks for the discrete-time analog circuit 1000 illustrated in FIG. 29A. Although FIG. 29B illustrates the clocks LO+ and LO-illustrated in FIG. 28C for comparison, these clocks are not used in the discrete-time analog circuit 1000. Although FIG. 29B illustrates rectangular signals as ideal clocks, the clock generating circuit 1050 and the clock adjusting circuit 1060 perform adjustment so that a switch to be controlled is ON during a high period of an ideal clock and so that the switch to be controlled is OFF during a low period of the ideal clock.

The discrete-time analog circuit 900 and the discrete-time analog circuit 1000 perform the same operation by setting ON periods in the switches of the discrete-time analog circuit 900 and ON periods in the switches of the discrete-time analog circuit 1000 (i.e., a pulse width Ts of the ideal clocks illustrated in FIG. 28C and a pulse width Ts of the ideal clocks illustrated in FIG. 29B) to the same value. In this case, a cycle $T_{LO}$ of the clocks in FIG. 29B is M times as long as a cycle $T_{LO}$ of the clocks in FIG. 28C, i.e., a clock frequency $f_{LO}$ of the clocks in FIG. 29B is 1/M of that of the clocks in FIG. 28C, and therefore the discrete-time analog circuit 1000 can operate by low-frequency clocks.

According to the configuration, the discrete-time analog circuit 1000 can also operate by low-frequency clocks.

Embodiment 5

There is a possibility that the characteristics of the mixers and the discrete-time analog circuits described in the above embodiments depend on duty ratios of clocks. In the present embodiment, a configuration in which characteristics of a mixer or a discrete-time analog circuit are monitored, and the characteristics are controlled by a clock generating circuit and a clock adjusting circuit.

FIG. 30A is a diagram illustrating a configuration of a mixer or discrete-time analog circuit 1100 having a characteristic control function according to Embodiment 5. The mixer or discrete-time analog circuit 1100 having a characteristic control function includes a mixer or discrete-time analog circuit 1110, a characteristic monitoring circuit 1120, and a characteristic control circuit 1130. The mixer or discrete-time analog circuit 1110 includes a clock generating circuit 1140, a clock adjusting circuit 1150, and a target circuit 1160.

For example, in a case where the mixer or discrete-time analog circuit 1110 is the mixer 100 illustrated in FIG. 3, the target circuit 1160 corresponds to a circuit obtained by removing the clock generating circuit 120 and the clock adjusting circuit 130 from the mixer 100. In a case where the mixer or discrete-time analog circuit 1110 is the discrete-time analog circuit 600 illustrated in FIG. 16, the target circuit 1160 corresponds to a circuit obtained by removing the clock generating circuit 640 and the clock adjusting circuit 650 from the discrete-time analog circuit 600.

Figure 30B:
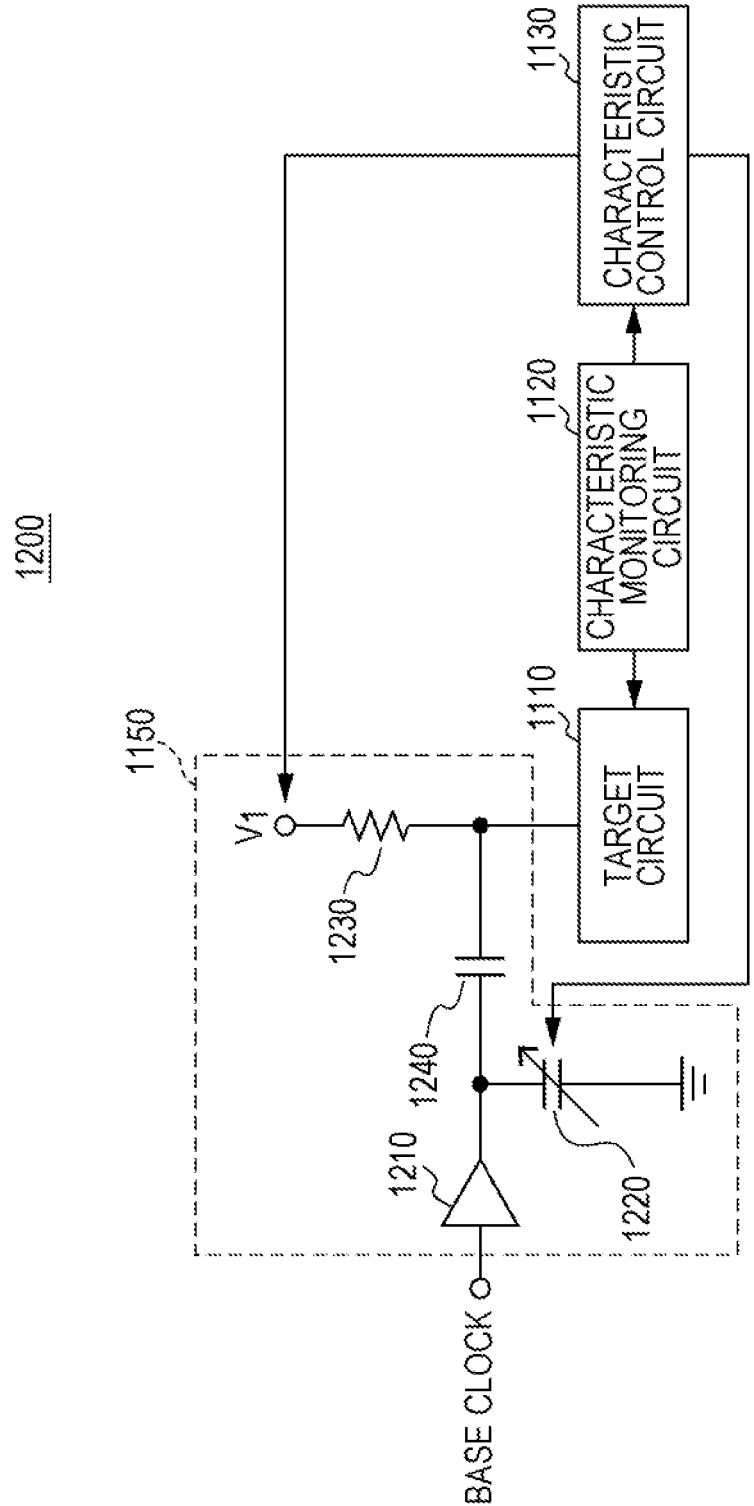
FIG. 30B is a diagram illustrating a configuration of a mixer or discrete-time analog circuit having a characteristic control function that includes a clock adjusting circuit having the configuration illustrated in FIG. 5B.

FIG. 30B is a diagram illustrating a configuration of a mixer or discrete-time analog circuit 1200 having a characteristic control function that includes a clock adjusting circuit 1150 having the configuration illustrated in FIG. 5B. The clock adjusting circuit 1150 includes a buffer 1210, a variable capacitor 1220, a resistor 1230, and a capacitor 1240 and receives base clocks from a clock generating circuit 1140 (see FIG. 30A). An operation of the clock adjusting circuit 1150 is similar to the clock adjusting circuit described with reference to FIG. 5B, and therefore description thereof is omitted.

Figure 30C:
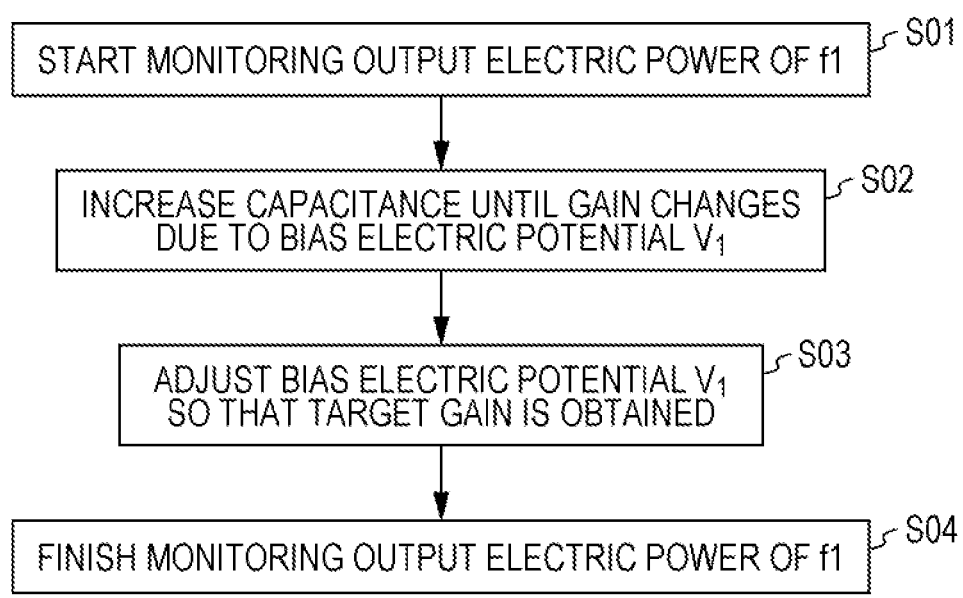
FIG. 30C is a diagram illustrating an example of a control flow of the configuration illustrated in FIG. 30B.

A control flow of the mixer or discrete-time analog circuit 1200 having a characteristic control function is described below. FIG. 30C is a diagram illustrating an example of a control flow of the configuration illustrated in FIG. 30B.

In the mixer or discrete-time analog circuit 1200 having a characteristic control function, the characteristic monitoring circuit 1120 starts monitoring output electric power of any frequency f1 of the target circuit 1160 (S01).

The characteristic monitoring circuit 1120 causes the characteristic control circuit 1130 to increase a capacitance value of the variable capacitor 1220 until a change of gain of the output electric power of the frequency f1 caused by adjustment of a bias electric potential V1 is detected (S02).

Next, the characteristic monitoring circuit 1120 causes the characteristic control circuit 1130 to adjust the bias electric potential V1 so that the gain of the monitored output electric power of the frequency f1 becomes target gain (S03).

The characteristic monitoring circuit 1120 causes the characteristic control circuit 1130 to finish bias adjustment and finishes monitoring in a case where it is determined that the output electric power falls within a target range (S04).

Through the aforementioned control, the characteristics of the mixer or discrete-time analog circuit 1200 having a characteristic control function can be kept at desired ones by adjusting bias and phases of clocks while monitoring the output electric power of the target circuit 1160.

Although a configuration in which the characteristic monitoring circuit 1120 monitors the output electric power of the target circuit 1160 has been described above, the following describes a configuration in which the characteristic monitoring circuit 1120 monitors other output.

Figure 31:
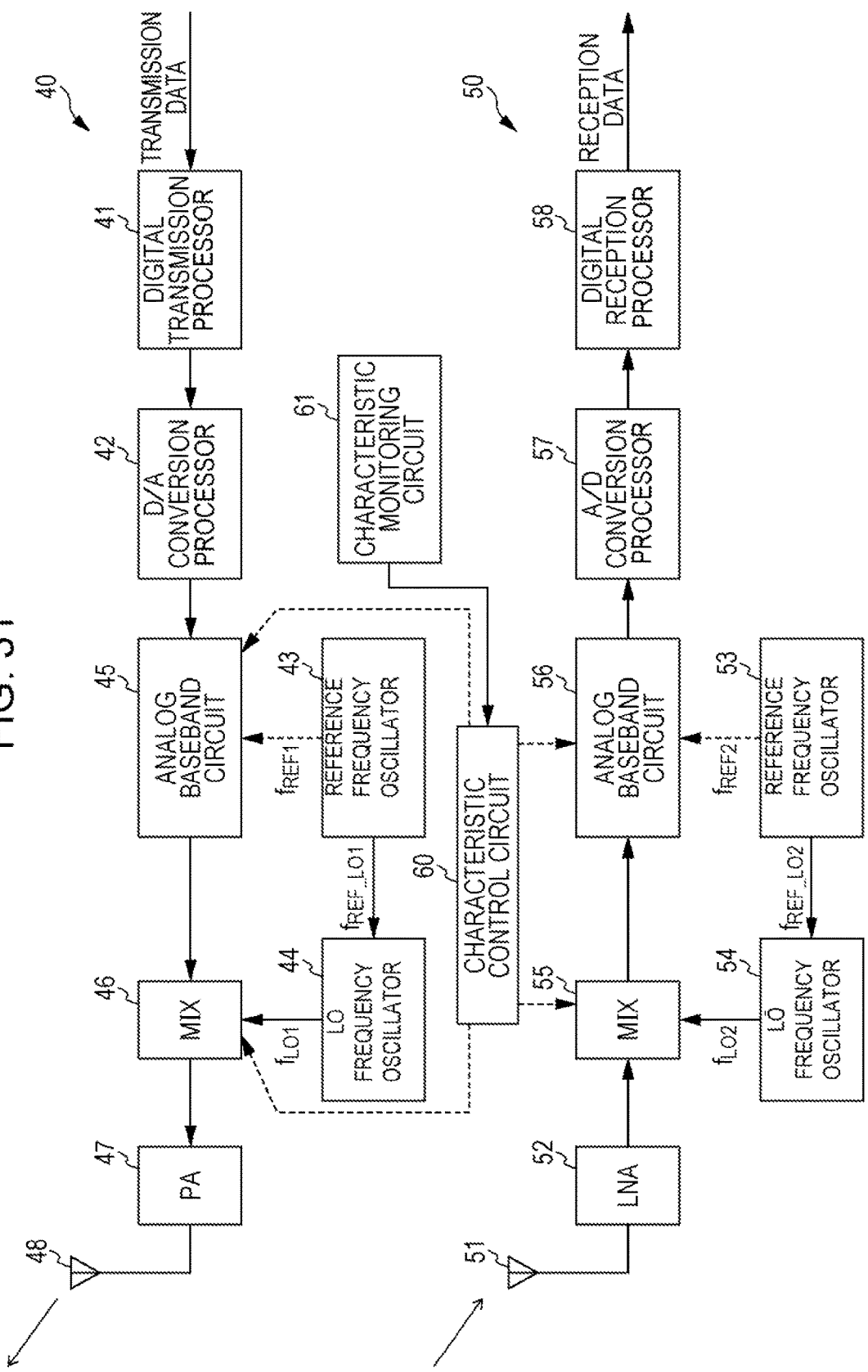
FIG. 31 is a diagram illustrating an example in which a characteristic monitoring circuit according to Embodiment 5 monitors output of a transmission receiving device.

Specifically, an example in which the characteristic monitoring circuit 1120 illustrated in FIGS. 30A to 30C monitors other output of a transmitting/receiving device is described. FIG. 31 is a diagram illustrating an example in which the characteristic monitoring circuit 1120 according to Embodiment 5 monitors output of a transmitting/receiving device.

FIG. 31 illustrates a transmitting device 40, a receiving device 50, a characteristic monitoring circuit 61 that monitors characteristics of output of the transmitting device 40 and the receiving device 50, and a characteristic control circuit 60 that controls mixers of the transmitting device 40 and the receiving device 50. The following describes a method in which the characteristic monitoring circuit 61 compares input to the transmitting device 40 and output from the receiving device 50 in a communication device including both of the transmitting device 40 and the receiving device 50.

The configuration of the transmitting device 40 and the configuration of the receiving device 50 are similar to the configuration of the transmitting device 10 and the configuration of the receiving device 20 described with reference to FIGS. 2A and 2B, and therefore description thereof is omitted.

Note that in a case where analog baseband circuits 45 and 56 are replaced by discrete-time analog circuits, the characteristic control circuit 60 controls the replaced discrete-time analog circuits 45 and 56.

The characteristic control circuit 60 and the characteristic monitoring circuit 61 are similar to the characteristic control circuit 1130 and the characteristic monitoring circuit 1120 illustrated in FIG. 30A, respectively. In FIG. 31, the characteristic control circuit 60 controls at least one of the mixers 46 and 55 and discrete-time analog circuits 45 and 56.

A specific characteristic monitoring method in the characteristic monitoring circuit 61 is described below.

In one example, the transmitting device 40 transmits predetermined transmission data from the antenna 48 after the predetermined transmission data is subjected to processing from the processing in the digital transmission processorprocessor 41 to the processing in the power amplifier 47, and the receiving device 50 receives data from the antenna 51 and generates reception data through processing from the processing in the low noise amplifier 52 to the processing in the digital reception processorprocessor 58. In this processing, the characteristic monitoring circuit 61 compares characteristics such as frequency characteristics, SNRs, and bit error rates of the transmission data and the reception data. The characteristic monitoring circuit 61 causes the characteristic control circuit 60 to control the mixers 46 and 55 and/or the discrete-time analog circuits 45 and 56 so that the characteristics become desired ones.

In another example, the transmitting device 40 performs processing from the processing in the digital transmission processor 41 to the processing in the discrete-time analog circuit 45 on predetermined transmission data, the output of the discrete-time analog circuit 45 is input to the discrete-time analog circuit 56 of the receiving device 50, and reception data is generated through the processing in the A/D conversion processor 57 and the processing in the digital reception processor 58. In this processing, the characteristic monitoring circuit 61 compares characteristics such as frequency characteristics, SNRs, and bit error rates of the transmission data and the reception data. The characteristic monitoring circuit 61 causes the characteristic control circuit 60 to control the discrete-time analog circuits 45 and 56 so that the characteristics become desired ones.

Alternatively, the transmitting device 40 performs processing from the processing in the digital transmission processor 41 to the processing in the mixer 46 on predetermined transmission data, the output of the mixer 46 is input to the mixer 55 of the receiving device 50, and the receiving device 50 generates reception data through processing from the processing in the discrete-time analog circuit 56 to the processing in the digital reception processor 58. In this processing, the characteristic monitoring circuit 61 compares characteristics such as frequency characteristics, SNRs, and bit error rates of the transmission data and the reception data. The characteristic monitoring circuit 61 causes the characteristic control circuit 60 to control the mixers 46 and 55 and/or the discrete-time analog circuits 45 and 56 so that the characteristics become desired ones.

The frequency characteristics are monitored, for example, by transmitting sine-wave signals of some frequencies as transmission signals and checking the amplitudes of the respective received signals.

As the transmitting device, a device that actually transmits data may be used or a simple transmitting device for characteristic correction may be prepared.

An example of an adjusting circuit that adjusts a voltage value of bias in Embodiments 1 to 5 described above is described below.

Figure 32A:
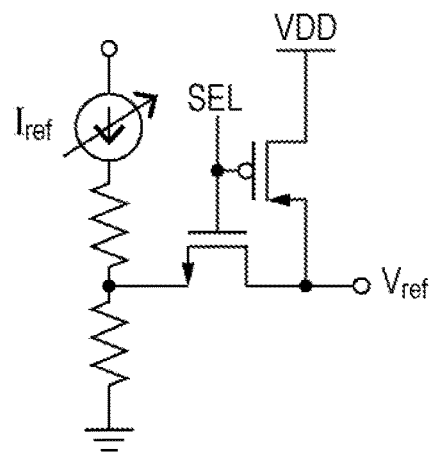
FIG. 32A is a diagram illustrating an example of an adjusting circuit that adjusts a voltage value of bias.
Figure 32B:
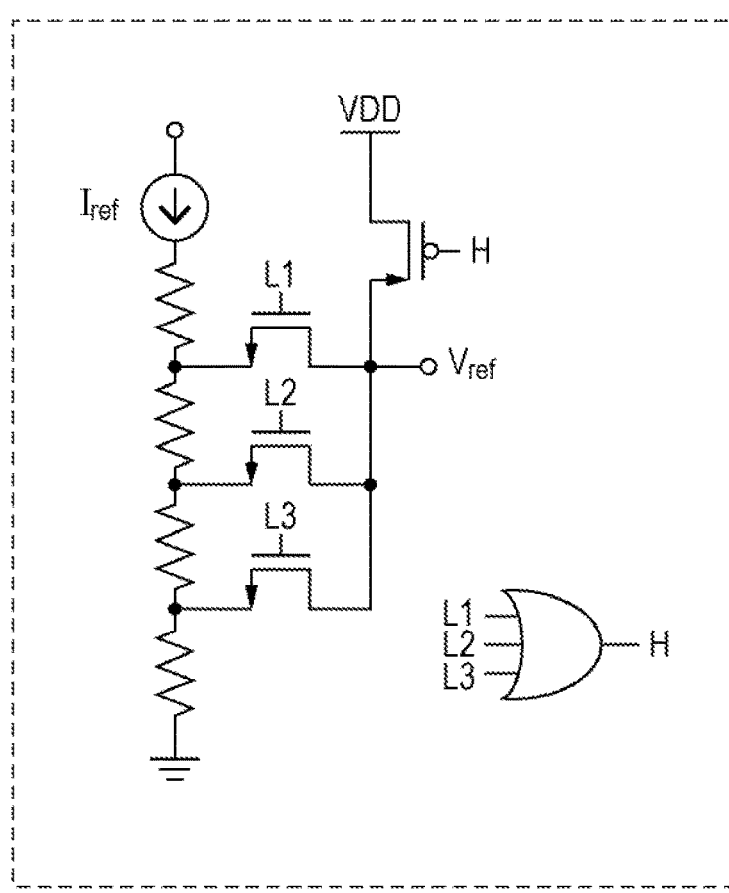
FIG. 32B is a diagram illustrating an example of an adjusting circuit that adjusts a voltage value of bias.

FIGS. 32A and 32B are diagrams each illustrating an example of an adjusting circuit that adjusts a voltage value of bias. The configuration of FIG. 32A is a configuration for obtaining a target voltage $V_{ref}$ by adjusting a variable reference electric current $I_{ref}$, and FIG. 32B is a method for obtaining a target voltage $V_{ref}$ by passing a fixed reference electric current $I_{ref}$ into a plurality of resistors and selecting a resistor and an output position.

Embodiment 6

In the present embodiment, a clock generating circuit that generates a signal of any duty ratio with a simple configuration by adjusting bias of an input signal of an inverter is described.

Figure 33:
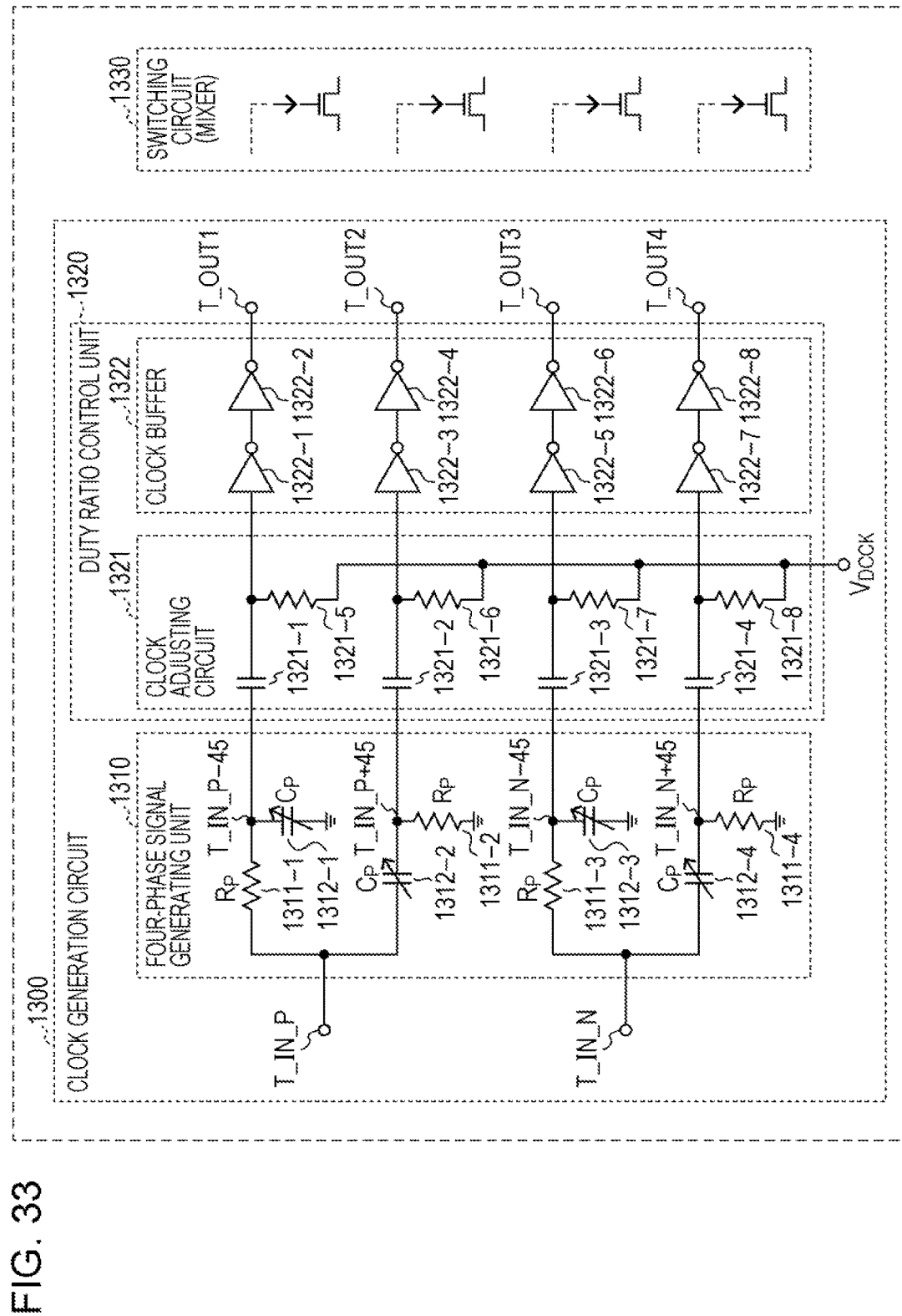
FIG. 33 is a diagram illustrating an example of a configuration of a clock generating circuit according to Embodiment 6.

FIG. 33 illustrates a configuration of a clock generating circuit 1300. The clock generating circuit 1300 includes a four-phase signal generating unit 1310 and a duty ratio control unit 1320. The duty ratio control unit 1320 includes a clock adjusting circuit 1321 and a clock buffer 1322.

In FIG. 33, the four-phase signal generating unit 1310 includes resistors $R_p$ 1311 (1311-1 to 1311-4) and capacitors $C_p$ 1312 (1312-1 to 1312-4).

FIGS. 34A to 34D are diagrams each illustrating an operation of the clock generating circuit 1300.

The four-phase signal generating unit 1310 receives differential signals IN_P and IN_N (see FIG. 34A) from terminals T_IN_P and T_IN_N, respectively. Then, the four-phase signal generating unit 1310 outputs signals IN_P−45, IN_P+45, IN_N−45, and IN_N+45 of four phases that are shifted by 90 degrees (see FIG. 34B) from terminals T_IN_P−45, T_IN_P+45, T_IN_N−45, and T_IN_N+45, respectively.

That is, the four-phase signal generating unit 1310 rotates the phase of an input differential signal (IN_P, IN_N) by +45 degrees or −45 degrees in accordance with a combination of the $R_p$ 1311 and the $C_p$ 1312 at a frequency of $\omega p=1/(R_p \times C_p)$ where $R_p$ is a resistance value of the $R_p$ 1311 and $C_p$ is a capacitance value of the $C_p$ 1312.

Specifically, the four-phase signal generating unit 1310 outputs a signal (IN_P−45) of an equal amplitude obtained by rotating the phase of the input differential signal (IN_P) by −45 degrees by using a circuit configuration of the $R_p$ 1311-1 and the $C_p$ 1312-1. The four-phase signal generating unit 1310 outputs a signal (IN_P+45) of an equal amplitude obtained by rotating the phase of the input differential signal (IN_P) by +45 degrees by using a circuit configuration of the $C_p$ 1312-2 and the $R_p$ 1311-2.

The four-phase signal generating unit 1310 outputs a signal (IN_N−45) of an equal amplitude obtained by rotating the phase of the input differential signal (IN_N) by −45 degrees by using a circuit configuration of the $R_p$ 1311-3 and the $C_p$ 1312-3. The four-phase signal generating unit 1310 outputs a signal (IN_N+45) of an equal amplitude obtained by rotating the phase of the input differential signal (IN_N) by +45 degrees by using a circuit configuration of the $C_p$ 1312-4 and the $R_p$ 1311-4 (Reference Document: Behzad Razavi, "RF Microelectronics," Prentice Hall, pp. 236-237, November 1997).

Note that the four-phase signal generating unit 1310 can generate a signal of an equal amplitude whose phase is rotated by 90 degrees at any frequency by configuring at least one of the $R_p$ 1311 and $C_p$ 1312 as variable resistors or variable capacitors.

Figure 35A:
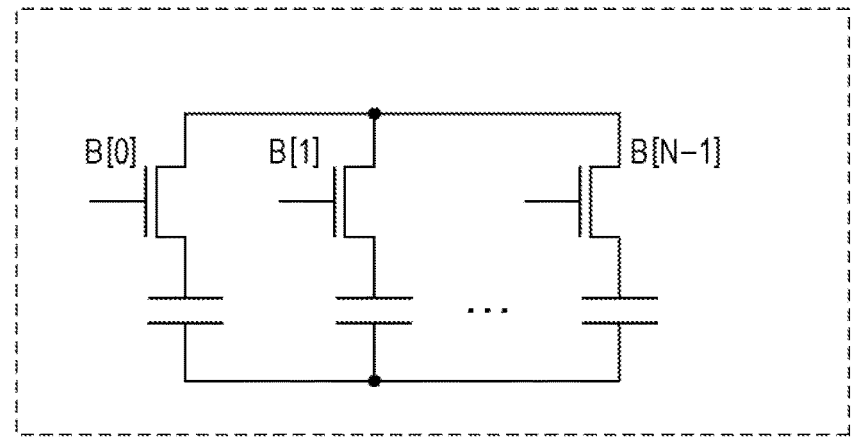
FIG. 35A is a diagram illustrating an example of a configuration of a variable capacitor.
Figure 35B:
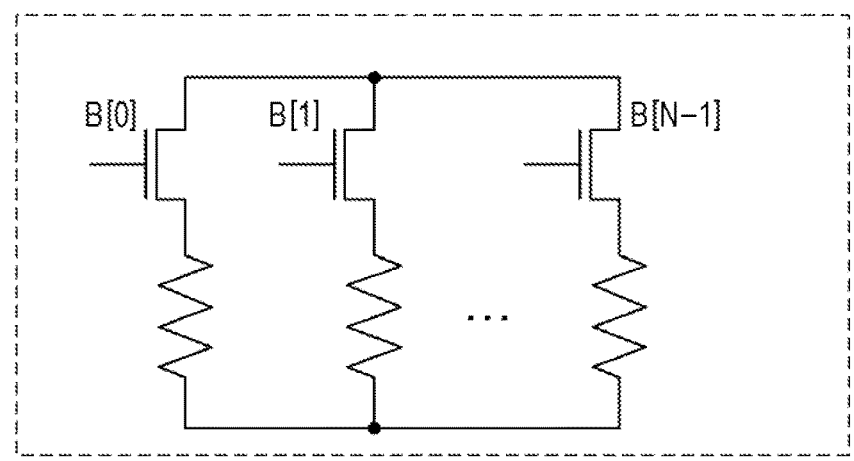
FIG. 35B is a diagram illustrating an example of a configuration of a variable resistor.

FIG. 35A illustrates an example of a configuration of variable capacitors, and FIG. 35B illustrates an example of a configuration of variable resistors. Switches that are controlled by N-bit control signals (B [0], B [1], . . . , B [N−1] in FIGS. 35A and 35B) are connected in series to a respective plurality of resistors and a respective plurality of capacitors. In FIG. 35A, the plurality of capacitors are connected in parallel, but may be connected in series. In FIG. 35B, the plurality of resistors are connected in parallel, but may be connected in series. Note that the plurality of resistors may have the same value or may have different values, and the plurality of capacitors may have the same value or may have different values.

The output signals (IN_P−45, IN_P+45, IN_N−45, and IN_N+45) of four phases that are output from the four-phase signal generating unit 1310 are supplied to the clock adjusting circuit 1321. The clock adjusting circuit 1321 includes capacitors 1321-1 to 1321-4 and resistors 1321-5 to 1321-8, and removes DC components of the input signals (IN_P−45, IN_P+45, IN_N−45, and IN_N+45) of four phases by using the capacitors 1321-1 to 1321-4 and applies a bias electric potential $V_{DCCK}$ to the signals of four phases by using the resistors 1321-5 to 1321-8. That is, the clock adjusting circuit 1321 outputs the signals of four phases whose bias electric potentials have been adjusted to $V_{DCCK}$.

The output signals that are output from the clock adjusting circuit 1321 are input to the clock buffer 1322. The clock buffer 1322 includes a plurality of inverter circuits 1322-1 to 1322-8.

Figure 34A:
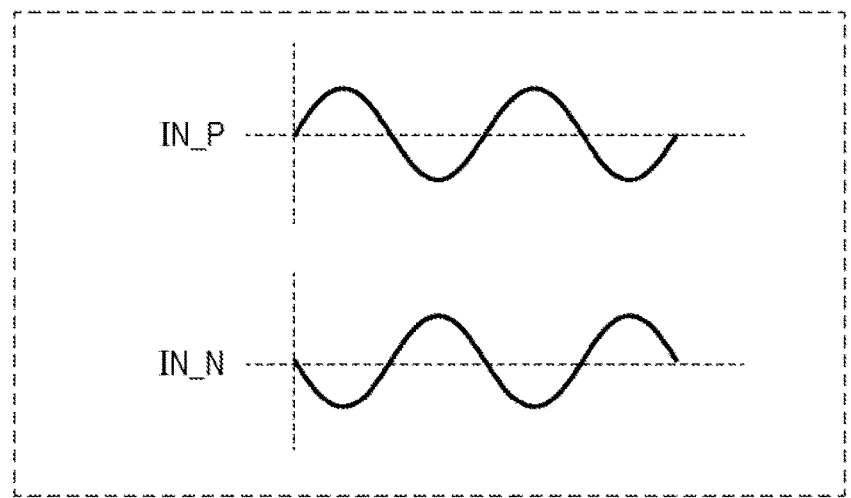
FIG. 34A is a diagram illustrating an operation of the clock generating circuit according to Embodiment 6.
Figure 34B:
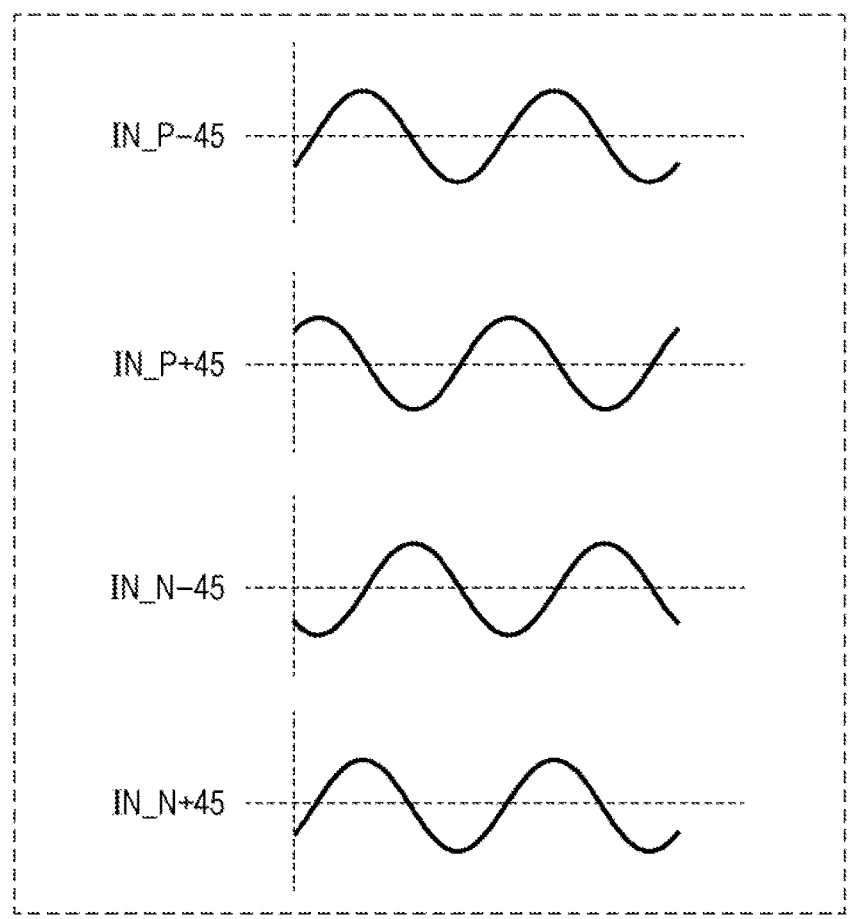
FIG. 34B is a diagram illustrating an operation of the clock generating circuit according to Embodiment 6.
Figure 34C:
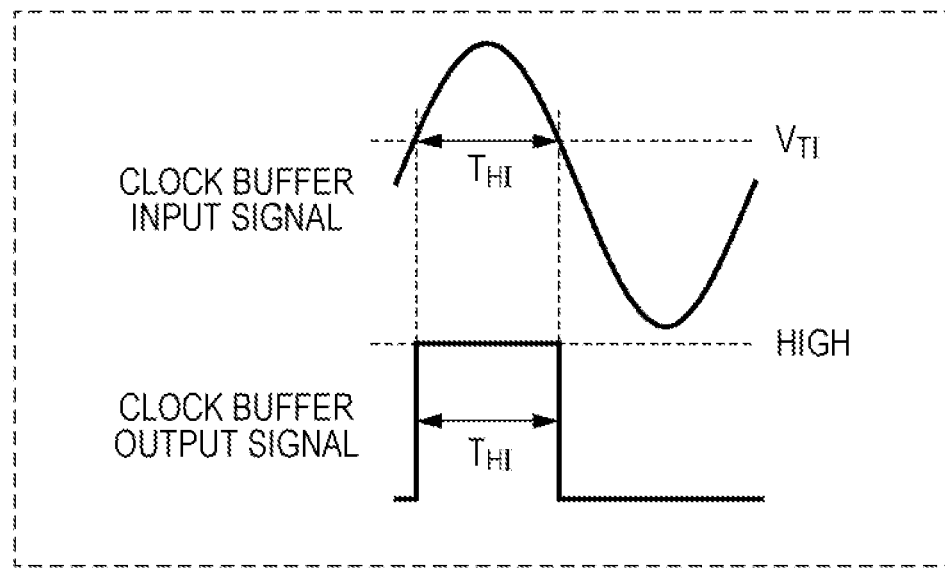
FIG. 34C is a diagram illustrating an operation of the clock generating circuit according to Embodiment 6.
Figure 34D:
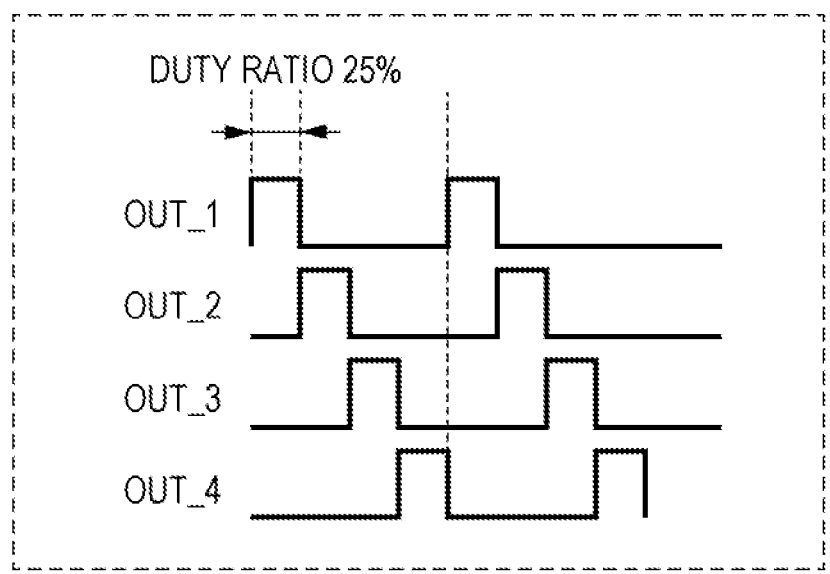
FIG. 34D is a diagram illustrating an operation of the clock generating circuit according to Embodiment 6.

As illustrated in FIG. 34C, in a case where the signals of four phases that are input to the clock buffer 1322 exceed a predetermined threshold voltage $V_{TP}$, the clock buffer 1322 outputs high signals. The signals of four phases that are input to the clock buffer 1322 are signals of four phases whose bias electric potential has been adjusted in the clock adjusting circuit 1321. That is, periods of the high signals that are output from the clock buffer 1322 can be controlled by the bias electric potential $V_{DCCK}$ supplied by the clock adjusting circuit 1321.

That is, the duty ratio control unit 1320 can control the duty ratios of the output signals output from the clock buffers 1322 by adjusting the electric potential $V_{DCCK}$.

Therefore, the clock generating circuit 1300 can output, for example, output signals (OUT1, OUT2, OUT3, and OUT4) of four phases having a duty ratio of 25% (see FIG. 34D) from terminals T_OUT1, T_OUT2, T_OUT3, and T_OUT4 by setting the electric potential $V_{DCCK}$ of the output signals (IN_P−45, IN_P+45, IN_N−45, and IN_N+ 45) of four phases that are output from the four-phase signal generating unit 1310.

The terminals T_OUT1, T_OUT2, T_OUT3, and T_OUT4 to which the output signals OUT1 to OUT4 of four phases are output from the clock generating circuit 1300, respectively are, for example, connected to a switching circuit (e.g., mixer) 1330. The output signals OUT1 to OUT4 of four phases control ON/OFF of the switching circuit 1330. Note that the configuration of the mixer 100 illustrated in FIG. 3 may be used as the switching circuit 1330.

Note that the clock generating circuit 1300 can output signals of four phases having any duty ratio by setting the electric potential $V_{DCCK}$.

Figure 35C:
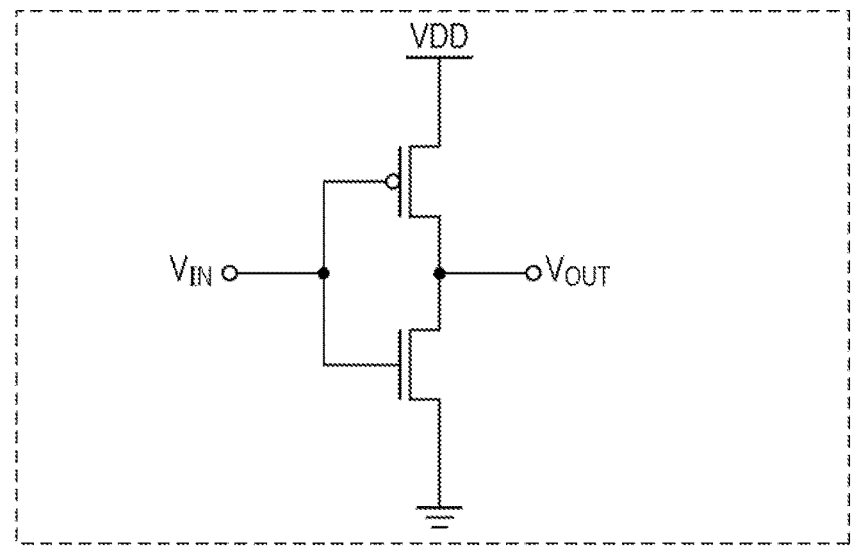
FIG. 35C is a diagram illustrating an example of a configuration of an inverter circuit.

The clock buffer 1322 is configured such that the inverter circuits 1322-1 to 8 are connected in two stages in FIG. 33, but the number of stages is not limited, and the inverter circuits may be branched. The configuration illustrated in FIG. 35C may be, for example, used as the configuration of the inverter circuits.

Note that the frequency of the signals input to the clock buffer 1322 (i.e., the output signals that are output from the clock adjusting circuit 1321) is one at which it is difficult to use the inverter circuits 1322-1 to 1322-8, it is possible to employ a configuration in which the clock adjusting circuit 1321 is directly connected to the output-side terminals T_OUT1 to T_OUT4 via switches (not illustrated) without being connected to the clock buffer 1322 so that the output signals that are output from the clock adjusting circuit 1321 are not input to the clock buffer 1322. This allows the clock buffer 1322 to generate signals of any duty ratio with a simple configuration at a frequency at which the inverter circuits 1322-1 to 1322-8 can be used.

Note that an output waveform of each inverter circuit used in the present embodiment may be rounded, and the degree of rounding of the waveform may be intentionally adjusted as illustrated in FIG. 7A by adding a variable capacitor to an output terminal of each inverter circuit as illustrated in FIGS. 11A to 11C.

In the conventional clock generating circuit illustrated in FIG. 1B, three or more transistors are connected in cascade by using an AND circuit. Meanwhile, in the clock generating circuit according to the present embodiment, at most two transistors are connected in cascade (e.g., cascade connection of PMOS or NMOS in FIG. 35C), and the clock generating circuit according to the present embodiment can operate at a low power-supply voltage and suitable for mounting in a fine CMOS process. According to the conventional clock generating circuit illustrated in FIG. 1B, fine adjustment of a duty ratio is difficult. Meanwhile, according to the clock generating circuit 1300 according to the present embodiment, fine adjustment of a duty ratio is possible by adjustment of the electric potential $V_{DCCK}$.

Various aspects of the embodiments according to the present disclosure include the following.

A switch control circuit according to the first disclosure includes: a clock generating circuit which, in operation, generates one or more periodic signals having a predetermined cycle; a clock adjusting circuit which, in operation, generates one or more control signals by adjusting a bias voltage of the one or more periodic signals and changing an ON period of the one or more periodic signals; and at least one switching circuit including one or more switches that are switched to ON if respective amplitudes of the generated one or more control signals is equal to or higher than a threshold value and that are switched to OFF if the respective amplitudes of the generated one or more control signals is less than the threshold value.

A switch control circuit according to the second disclosure is the switch control circuit according to the first disclosure in which the clock adjusting circuit includes a variable capacitor; and the clock adjusting circuit changes the ON period of at least one of the one or more periodic signals by changing the degree of rounding of a waveform of the one or more periodic signals in accordance with a capacitance value of the variable capacitor.

A switch control circuit according to the third disclosure is the switch control circuit according to the first disclosure in which the clock adjusting circuit comprises two buffers provided between an input terminal to which the one or more periodic signals are input and an output terminal to which the one or more control signals are output; and a variable capacitor having terminals, one of which is connected between the two buffers and the other of which is grounded;

and the clock adjusting circuit adjusts a phase of the one or more periodic signals by adjusting the variable capacitor.

A switch control circuit according to the fourth disclosure is the switch control circuit according to the first disclosure in which the clock generating circuit generates a plurality of periodic signals including the one or more periodic signals; the clock adjusting circuit comprises a plurality of systems, each of which receives corresponding one of the plurality of periodic signals and variable capacitors, each of which is connected to corresponding one of the plurality of systems, wherein bias voltages and phases of the respective plurality of periodic signals are adjusted by adjusting the bias voltages of the respective plurality of periodic signals and the variable capacitors.

A switch control circuit according to the fifth disclosure is the switch control circuit according to the first disclosure in which the switching circuit comprises four switches to which the control signals of four phases are respectively supplied; the clock generating circuit generates periodic signals having four phases; and the clock adjusting circuit generates the control signals having the four phases that allow the four switches to be ON during ¼ of the predetermined cycle so that respective ON periods of the four switches are different from each other by adjusting bias voltages and phases of the periodic signals.

A switch control circuit according to the sixth disclosure is the switch control circuit according to the first disclosure in which the switching circuit has a single input terminal and two output terminals; the switching circuit includes M number of first switches connected in parallel between one of the two output terminals and the input terminal and to which M number of first control signals are supplied, and M number of second switches connected in parallel between the other one of the two output terminals and the input terminal and to which M number of second control signals are supplied, M being an integer that is 2 or more; the clock generating circuit generates periodic signals having 2M phases; and the clock adjusting circuit generates the M number of first control signals and the M second control signals that allow the M number of first switches and the M number of second switches to be ON during ½M of the predetermined cycle so that ON periods of the M number of first switches and the M number of second switches are different from each other and so that an interval between an ON period of one of the M first switches and an ON period of one of the M number of second switches is half period of the predetermined cycle by adjusting bias voltages and phases of the periodic signals having 2M phases.

A switch control circuit according to the seventh disclosure is the switch control circuit according to the first disclosure in which the switching circuit is a discrete-time analog circuit that performs discrete-time analog signal processing on a first signal having a positive phase that is input to a first input terminal and a second signal having a negative phase that is input to a second input terminal and outputs a first output signal and a second output signal to a first output terminal and a second output terminal, respectively, wherein the switching circuit comprises: a voltage-to-current converting circuit which, in operation, (i) obtains a first input electric charge by performing voltage-to-current conversion on the first signal that is input to a first terminal connected to the first input terminal and outputs the first input electric charge to a second terminal connected to the first output terminal and (ii) obtains a second input electric charge by performing voltage-to-current conversion on the second signal that is input to a third terminal connected to the second input terminal and outputs the second input electric charge to a fourth terminal connected to the second output terminal; at least one electric charge inversion circuit that has a fifth terminal connected to the first output terminal and a sixth terminal connected to the second output terminal and which, in operation, performs electric charge sharing of the first input electric charge and the second input electric charge, wherein the electric charge inversion circuit includes 2M number of electric charge inversion capacitors that are provided in parallel and that retain the shared first input electric charge or second input electric charge, M being an integer that is 1 or more; and at every predetermined interval, one of the 2M number of electric charge inversion capacitors sequentially inverts polarity of the retained first input electric charge or the retained second input electric charge and connects to the fifth terminal and the sixth terminal, and other electric charge inversion capacitors release connection with the fifth terminal and the sixth terminal.

A switch control circuit according to the eighth disclosure is the switch control circuit according to the seventh disclosure in which the 2M number of electric charge inversion capacitors include a first electric charge inversion capacitor having a seventh terminal and an eighth terminal that is grounded and a second electric charge inversion capacitor having a ninth terminal and a tenth terminal that is grounded; the electric charge inversion circuit is arranged such that (i) at a first timing, the first electric charge inversion capacitor connects the seventh terminal to the fifth terminal and performs electric charge sharing, and the second electric charge inversion capacitor releases connection between the fifth terminal and the sixth terminal and retains an electric charge, (ii) at a second timing, the second electric charge inversion capacitor connects the ninth terminal to the fifth terminal and performs electric charge sharing, and the first electric charge inversion capacitor releases connection between the fifth terminal and the sixth terminal and retains an electric charge, (iii) at a (2M+1) timing, the first electric charge inversion capacitor connects the seventh terminal to the sixth terminal and performs electric charge sharing, and the second electric charge inversion capacitor releases connection between the fifth terminal and the sixth terminal and retains an electric charge, and (iv) at a (2M+2) timing, the second electric charge inversion capacitor connects the ninth terminal to the sixth terminal and performs electric charge sharing, and the first electric charge inversion capacitor releases connection between the fifth terminal and the sixth terminal and retains an electric charge.

A switch control circuit according to the ninth disclosure is the switch control circuit according to the seventh disclosure in which the switching circuit includes a plurality of electric charge inversion circuits; and the fifth terminal of each of the plurality of electric charge inversion circuits is connected to the first output terminal, and the sixth terminal of each of the plurality of electric charge inversion circuits is connected to the second output terminal.

A switch control circuit according to the tenth disclosure is the switch control circuit according to the seventh disclosure in which the at least one switching circuit comprises at least two switching circuits that are connected in series so as to constitute a multi-stage switching circuit.

A switch control circuit according to the eleventh disclosure is the switch control circuit according to the sixth disclosure in which the switching circuit comprises: history capacitors, each history capacitor being connected to corresponding one of two output terminals; and a switched capacitor filter.

A switch control circuit according to the twelfth disclosure is the switch control circuit according to the first disclosure further including: a characteristic monitoring circuit which, in operation, monitors characteristics of output of the switching circuit; and a characteristic control circuit which, in operation, controls the clock generating circuit and the clock adjusting circuit, and wherein the characteristic control circuit controls the clock adjusting circuit to adjust the bias voltage and a phase of the one or more periodic signals so that the characteristics of output of the switching circuit become desired characteristics.

A switch control circuit according to the thirteenth disclosure is the switch control circuit according to the first disclosure further including at least one inverter circuit located between output of the clock adjusting circuit and input of the one or more switches of the switching circuit.

Various embodiments have been described with reference to the drawings, but needless to say, the present disclosure is not limited to these examples. It is apparent that a person skilled in the art can arrive at various changes and modifications within the scope described in the claims, and it is understood that such changes and modifications are encompassed within the technical scope of the present disclosure. The constituent elements in the embodiments may be combined in any way within the scope of the disclosure.

In the above embodiments, an example in which the present disclosure is realized by way of hardware has been described. However, the present disclosure may be realized by software in cooperation with hardware.

Each of the functional blocks described in the above embodiments is typically realized by an LSI that is an integrated circuit. These functional blocks may be realized as individual chips or some or all of the constituent elements may be realized as a single chip. The term "LSI" is used, but the term "IC", "system LSI", "super LSI", or "ultra LSI" may be used depending on the degree of integration.

Furthermore, means to achieve integration is not limited to an LSI and may be a special circuit or a general-purpose processor. An FPGA (Field Programmable Gate Array) that can be programmed after production of an LSI or a reconfigurable processor in which connection or setting of circuit cells inside an LSI can be reconfigured can be also used.

If a technique of integration circuit that replaces an LSI appears in the future as a result of advancement of the semiconductor technique or appearance of another technique deriving from the semiconductor technique, integration of the functional blocks can be achieved by using such a technique. One possibility is application of a biotechnology or the like.

The switch control circuit according to the present disclosure is useful for a high-frequency signal and baseband signal processing circuit in a wireless communication device and a radar device and is useful for filtering processing and frequency conversion processing.

What is claimed is:

1. A switch control circuit, comprising:
   a clock generating circuit which, in operation, generates one or more periodic signals having a predetermined cycle;
   a clock adjusting circuit which, in operation, generates one or more control signals by adjusting a value of a bias voltage that is to be applied to the one or more periodic signals, wherein a length of an ON period of the one or more control signals changes according to the value of the bias voltage; and
   at least one switching circuit, including an input terminal, an output terminal, and one or more switches connected to the input terminal and the output terminal, each of the one or more switches is switched to ON when an amplitude of a corresponding one of the generated one or more control signals is equal to or higher than a threshold value, and is switched to OFF when the amplitude of the corresponding one of the generated one or more control signals is less than the threshold value,
   wherein each of the one or more switches is a transistor including a source, a drain and a gate, with the source connected to the input terminal via a first capacitor and the drain connected to the output terminal via a second capacitor, the gate being connected to a first resistor of the clock adjusting circuit, and at least one of the source and the drain being connected to another resistor,
   wherein the clock adjusting circuit includes a variable capacitor, and
   wherein the clock adjusting circuit changes the ON period of at least one of the one or more periodic signals by changing the degree of rounding of a waveform of the one or more periodic signals in accordance with a capacitance value of the variable capacitor.

2. The switch control circuit according to claim 1,
   wherein the clock adjusting circuit includes
      two buffers provided between an input terminal to which the one or more periodic signals are input and an output terminal to which the one or more control signals are output; and
      a variable capacitor having terminals, one terminal of which is connected between the two buffers and an other terminal of which is grounded; and
   wherein the clock adjusting circuit adjusts a phase of the one or more periodic signals by adjusting the variable capacitor.

3. The switch control circuit according to claim 1,
   wherein the clock generating circuit generates a plurality of periodic signals;
   wherein the clock adjusting circuit includes
      a plurality of systems, each of which receives a corresponding one of the plurality of periodic signals; and
      variable capacitors, each of which is connected to a corresponding one of the plurality of systems, and
   wherein bias voltages and phases of the respective plurality of periodic signals are adjusted by adjusting the bias voltages of the respective plurality of periodic signals and the variable capacitors.

4. The switch control circuit according to claim 1,
   wherein the switching circuit includes four switches to which the control signals of four phases are respectively supplied;
   wherein the clock generating circuit generates periodic signals having four phases; and
   wherein the clock adjusting circuit generates the control signals having the four phases that allow the four switches to be ON during ¼ of the predetermined cycle so that respective ON periods of the four switches are different from each other by adjusting bias voltages and phases of the periodic signals.

5. The switch control circuit according to claim 1,
   wherein the switching circuit has a single input terminal and two output terminals;
   wherein the switching circuit includes M number of first switches connected in parallel between one of the two output terminals and the input terminal and to which M number of first control signals are respectively supplied, and M number of second switches connected in parallel between an other one of the two output terminals and the input terminal and to which M number of second control signals are supplied, M being an integer that is 2 or more;

wherein the clock generating circuit generates periodic signals having 2M phases; and wherein the clock adjusting circuit generates the M number of first control signals and the M number of second control signals that allow the M number of first switches and the M number of second switches to be ON during ½M of the predetermined cycle so that ON periods of the M number of first switches and the M number of second switches are different from each other and so that an interval between an ON period of one of the M number of first switches and an ON period of one of the M number of second switches is half period of the predetermined cycle by adjusting bias voltages and phases of the periodic signals having 2M phases.

6. The switch control circuit according to claim 1, wherein when the source is connected to a first resistor and the drain is connected to a second resistor, a first resistance value of the first resistor is different from a second resistance value of the second resistor.

7. A switch control circuit, comprising:

a clock generating circuit which, in operation, generates one or more periodic signals having a predetermined cycle;

a clock adjusting circuit which, in operation, generates one or more control signals by adjusting a value of a bias voltage that is to be applied to the one or more periodic signals, wherein a length of an ON period of the one or more control signals changes according to the value of the bias voltage; and at least one switching circuit, including one or more switches that are switched to ON when respective amplitudes of the generated one or more control signals is equal to or higher than a threshold value, and that are switched to OFF when the respective amplitudes of the generated one or more control signals is less than the threshold value, wherein the switching circuit is a discrete-time analog circuit that performs discrete-time analog signal processing on a first signal having a positive phase that is input to a first input terminal and a second signal having a negative phase that is input to a second input terminal and outputs a first output signal and a second output signal to a first output terminal and a second output terminal, respectively, wherein the switching circuit includes a voltage-to-current converting circuit which, in operation, (i) obtains a first input electric charge by performing voltage-to-current conversion on the first signal that is input to a first terminal connected to the first input terminal and outputs the first input electric charge to a second terminal connected to the first output terminal, and (ii) obtains a second input electric charge by performing voltage-to-current conversion on the second signal that is input to a third terminal connected to the second input terminal and outputs the second input electric charge to a fourth terminal connected to the second output terminal; and at least one electric charge inversion circuit that has a fifth terminal connected to the first output terminal and a sixth terminal connected to the second output terminal and which, in operation, performs electric charge sharing of the first input electric charge and the second input electric charge, wherein the electric charge inversion circuit includes 2M number of electric charge inversion capacitors that are provided in parallel and that retain the shared first input electric charge or second input electric charge, M being an integer that is 1 or more; and wherein at every predetermined interval, one of the 2M number of electric charge inversion capacitors sequentially inverts polarity of the retained first input electric charge or the retained second input electric charge and connects to the fifth terminal and the sixth terminal, and other electric charge inversion capacitors release connection with the fifth terminal and the sixth terminal.

* * * * *